US011412635B1

(12) United States Patent
Zuckerman et al.

(10) Patent No.: US 11,412,635 B1
(45) **Date of Patent: *Aug. 9, 2022**

(54) RAIL AND SHELF ASSEMBLIES AND RACK FORMED THEREWITH, AND METHODS OF INSTALLING RAIL AND SHELF ASSEMBLIES ON A RACK

(71) Applicant: SERVERLIFT CORPORATION, Phoenix, AZ (US)

(72) Inventors: Raymond S. Zuckerman, Scottsdale, AZ (US); Joshua Scholfield, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/213,110

(22) Filed: Mar. 25, 2021

Related U.S. Application Data

(63) Continuation of application No. 16/420,093, filed on May 22, 2019, now Pat. No. 10,980,146.

(51) Int. Cl.
*H05K 7/18* (2006.01)
*A47B 57/36* (2006.01)

(52) U.S. Cl.
CPC ............. *H05K 7/183* (2013.01); *A47B 57/36* (2013.01)

(58) Field of Classification Search
CPC ......... A47B 57/06; A47B 57/36; A47B 57/20; A47B 57/40; A47B 47/021; H05K 7/183
See application file for complete search history.

(56) References Cited

U.S. PATENT DOCUMENTS

| | | | | |
|---|---|---|---|---|
| 9,854,908 | B1 | 1/2018 | Tang | |
| 10,051,759 | B1 * | 8/2018 | Chen | A47B 57/485 |
| 10,617,029 | B2 * | 4/2020 | Chen | H05K 7/1489 |
| 10,980,146 | B1 * | 4/2021 | Zuckerman | H05K 7/1489 |
| 2005/0156493 | A1 * | 7/2005 | Yang | H05K 7/1489 312/334.5 |
| 2011/0192946 | A1 | 8/2011 | Yu et al. | |
| 2011/0233355 | A1 | 9/2011 | Peng et al. | |
| 2015/0069196 | A1 | 3/2015 | Chen et al. | |
| 2015/0201754 | A1 * | 7/2015 | Chen | A47B 96/07 248/219.3 |
| 2017/0013959 | A1 | 1/2017 | Chen et al. | |
| 2017/0079427 | A1 | 3/2017 | Chen et al. | |
| 2017/0303426 | A1 * | 10/2017 | Chen | H05K 7/1489 |
| 2018/0098626 | A1 * | 4/2018 | Chen | A47B 88/407 |
| 2018/0125234 | A1 * | 5/2018 | Chen | A47B 88/43 |
| 2018/0220797 | A1 | 8/2018 | Chen et al. | |
| 2019/0274427 | A1 | 9/2019 | Chen et al. | |
| 2020/0107636 | A1 * | 4/2020 | Chen | H05K 7/1489 |
| 2021/0329807 | A1 * | 10/2021 | Tang | H05K 7/183 |

* cited by examiner

*Primary Examiner* — Daniel J Rohrhoff
(74) *Attorney, Agent, or Firm* — Michael W. Goltry; Robert A. Parsons; Parsons & Goltry, PLLC

(57) ABSTRACT

Rail assemblies on either side of a shelf each include a rail reciprocated to a slide adjustable from a rail-locking position to a post-locking position. The slide is configured to restrain the rail from reciprocating longitudinally relative to the slide, when the slide occupies a rail-locking position and the rail occupies a stowage position relative to the slide. The slide is configured to enable the rail to reciprocate longitudinally relative to the slide and to releasably secure a rack post, when the slide occupies the post-locking position.

12 Claims, 58 Drawing Sheets

550
551
551B
555
230
246
232
242
C
280
551A
296
293
B
211
120
200
210
212
294
123
110

RAIL AND SHELF ASSEMBLIES AND RACK FORMED THEREWITH, AND METHODS OF INSTALLING RAIL AND SHELF ASSEMBLIES ON A RACK

FIELD OF THE INVENTION

The present invention relates generally to equipment racks, and to rails and shelves configured to be removably installed on equipment racks, as for supports for supporting loads.

BACKGROUND OF THE INVENTION

Equipment racks are frameworks on which equipment modules are mounted. The modules, computer servers, telecommunication devices, audio equipment, scientific equipment, power supplies, switches, and others, and the racks are designed and sized to enable the modules to be sited and fastened directly to the racks with screws or other standard fasteners. Equipment designed to be placed in a rack is typically described as rack-mount, rack-mount instrument, a rack-mount chassis, sub-rack, rack mountable, or simply shelf.

Around the early 1920's, a 19-inch rack format was developed to reduce the space required for repeater and termination equipment. Since then, the 19-inch rack format has remained constant, and is now a standard rack format used throughout the telecommunication, computing, audio, video, entertainment and other industries. Standard racks, i.e. racks configured with the 19-inch rack format, hold most equipment in data centers, modern data centers, Internet service provider (ISP) facilities, and server rooms, and enable dense hardware configurations without occupying excessive floorspace. Standard racks are also often used to house professional audio and video equipment, and industrial power, control, and automation hardware. In addition to the 19-inch rack, the less common 23-inch racks are also used for housing telephone, computer, audio, and other equipment. The size denotes the width of mounting plates of the installed equipment.

Readily-available racks include rigid, parallel posts fashioned with mounting holes for accepting fasteners and with alternating spacings to enable equipment attachment. Originally, the mounting holes were tapped with a screw thread, the racks being commonly referred to as tapped-hole racks. Tapped-hole racks were eventually followed by clearance-hole racks, racks formed with unthreaded holes arranged vertically in hole pairs and which are sufficiently large to freely accept a bolt fastened in place with a cage nut or other standard nut. When the nut or bolt strips or breaks, it can be easily removed and replaced. Many clearance-hole racks are now formed with square holes. These square-hole racks enable boltless mounting, whereby the rack-mount equipment need only clip into the square holes without the need for standard, threaded fasteners. Installation and removal of hardware in a square-hole rack is easy and boltless, in which the weight of the equipment and small retention clips alone hold the equipment in place.

Racks can have two posts or four posts. However, racks with four posts, i.e. four-post racks including mirror pairs of front and rear mounting posts, are more common and routinely used. There is no standard for the depth of rack-mount equipment, and for the distance the front and rear pairs of posts of readily-available four-post racks. As a result, some rack-mount equipment commonly incorporate adjustable brackets, which, although useful, inherently add to the cost of the rack-mount equipment. Other rack-mount equipment are mounted using rails that are bolted to the front and rear posts, allowing the equipment to be supported by four posts, while also enabling it to be easily installed and removed. Four-post racks enable the mounting rails to support the equipment at the both front and rear. Most data centers use four-post racks, which can be open in construction without sides or doors, or enclosed by front and/or rear doors, side panels, and tops.

Mounting heavy equipment directly to a rack normally requires expensive and specialized lifting and maneuvering equipment. Heavy equipment or equipment which is commonly accessed for servicing, for which attaching or detaching at all four corners simultaneously would pose a problem, are often not mounted directly to the rack but instead to rails or slides mounted directly to the rack. A pair of rails is mounted directly onto the rack, and the equipment slides into the rack along the rails, which support it. When in place, the equipment can be secured to the rack with fasteners and the rails removed. The rails can also be left in place to fully support the equipment.

Whether rails are attached to a rack and used to assist in mounting equipment directly to the rack and then removed or secured and left in place to fully support equipment, installing rails to racks is difficult and time-consuming. Installed rails also take up valuable space. Accordingly, rails are often not used in dense hardware configurations. In dense hardware configurations removing and replacing equipment with the use of rails is extraordinary difficult and time-consuming because of inherent space constraints that limit the ability of skilled workman to reach the rear mounting posts for attaching and detaching the rails.

SUMMARY OF THE INVENTION

According to the principle of the invention, a rail assembly comprises a rail mounted to a slide including a first detent structure. The rail is configured to reciprocate longitudinally relative to the slide, and the slide is adjustable from a rail-locking position to a post-locking position. When the rail occupies a stowage position relative to the slide, the slide is configured to restrain the rail from reciprocating longitudinally relative to the slide when the slide occupies the rail-locking position, and to enable the rail to reciprocate longitudinally relative to the slide when the slide occupies the post-locking position. When the rail occupies the stowage position and the slide occupies the rail-locking position, the first detent structure is configured to engage a first complemental detent structure of a first rack post and the slide is configured engage the first rack post and move from the rack-locking position to the post-locking position for entrapping the first rack post and disabling the first detent structure from disengaging from the first complemental detent structure for thereby automatically immobilizing the slide to the first rack post, all automatically in response to advancement of the slide to against the first rack post and subsequent advancement of the rail longitudinally relative to the slide from the stowage position to an advanced position. A fixture is mounted to the rail. The fixture includes a second detent structure and is adjustable from an open position to a closed position. When the first detent structure is engaged to the first complemental detent structure of the first rack post and the slide occupies the post-locking position, the second detent structure is configured to engage a second complemental detent structure of a second rack post in response to advancement of the rail relative to the slide to at least the advanced position, and the fixture is configured to move from the open position to the closed position when the rail is in at least the advanced position relative to the slide and the second detent structure is engaged to the second complemental detent structure for entrapping the second rack post and disabling the second detent structure from disengaging from the second complemental detent structure for thereby automatically immobilizing the fixture to the second rack post. The rail is mounted to the fixture for movement between a lowered position corresponding to at least a horizontal position of the rail between the fixture and the slide and a raised position corresponding to an inclined position of the rail between the fixture and the slide. A drive member is operatively coupled between the rail and the fixture, whereby rotation of the drive member imparts corresponding movement of the rail between the lowered position and the raised position. The rail is configured to reciprocate longitudinally relative to the slide and the fixture in response to movement of the rail between the lowered position and the raised position.

According to the principle of the invention, a shelf assembly includes rail assemblies on either side of a shelf for supporting objects. The rail assemblies are axially spaced from one another and each include a rail mounted to a slide including a first detent structure. The rail is configured to reciprocate longitudinally relative to the slide, and the slide is adjustable from a rail-locking position to a post-locking position. When the rail occupies a stowage position relative to the slide, the slide is configured to restrain the rail from reciprocating longitudinally relative to the slide when the slide occupies the rail-locking position, and to enable the rail to reciprocate longitudinally relative to the slide when the slide occupies the post-locking position. When the rail occupies the stowage position relative to the slide and the slide occupies the rail-locking position, the first detent structure is configured to engage a first complemental detent structure of a first rack post and the slide is configured engage the first rack post and move from the rack-locking position to the post-locking position for entrapping the first rack post and disabling the first detent structure from disengaging from the first complemental detent structure for thereby automatically immobilizing the slide to the first rack post, all automatically in response to advancement of the slide to against the first rack post and subsequent advancement of the rail longitudinally relative to the slide from the stowage position to an advanced position. A fixture is mounted to the rail. The fixture includes a second detent structure and is adjustable from an open position to a closed position. When the first detent structure is engaged to the first complemental detent structure of the first rack post and the slide occupies the post-locking position, the second detent structure is configured to engage a second complemental detent structure of a second rack post in response to advancement of the rail relative to the slide to at least the advanced position, and the fixture is configured to move from the open position to the closed position when the rail is in at least the advanced position relative to the slide and the second detent structure is engaged to the second complemental detent structure for entrapping the second rack post and disabling the second detent structure from disengaging from the second complemental detent structure for thereby automatically immobilizing the fixture to the second rack post. The rail is mounted to the fixture for movement between a lowered position corresponding to at least a horizontal position of the rail between the fixture and the slide and a raised position corresponding to an inclined position of the rail between the fixture and the slide. A drive member is operatively coupled between the rail and the fixture, whereby rotation of the drive member imparts corresponding movement of the rail between the lowered position and the raised position. The rail is configured to reciprocate longitudinally relative to the slide and the fixture in response to movement of the rail between the lowered position and the raised position. The shelf includes a conveyor supported by the rail assemblies.

According to the principle of the invention, a rail assembly includes a rail mounted to a slide including a first detent structure, a lock configured to move from a rail-locking position to a post-locking position, and a switch configured to move from a closed position for securing the lock in the rail-locking position to an open position for releasing the lock from the rail-locking position, and the rail is configured to reciprocate longitudinally relative to the slide. When the rail occupies a stowage position relative to the slide, the lock is configured to restrain the rail from reciprocating longitudinally relative to the slide when the lock occupies the rail-locking position and the switch occupies the closed position for securing the lock in the rail-locking position for thereby disabling the lock from moving from the rail-locking position to the post-locking position, and to enable the rail to reciprocate longitudinally relative to the slide when the lock occupies the rail-locking position and the switch occupies the open position for releasing the lock from the rail-locking position for enabling the lock to move from the rail-locking position to the post-locking position. When the rail occupies the stowage position relative to the slide, the lock occupies the rail-locking position, and the switch occupies the closed position securing the lock in the rail-locking position, the first detent structure is configured to engage a first complemental detent structure of a first rack post and the switch is configured to engage the first rack post and move from the closed position to the open position, all automatically in response to advancement of the slide to an installed position to against the first rack post, and the lock is configured to interact with the rail to move from the rail-locking position to the post-locking position for cooperating with the slide for entrapping the first rack post for disabling the first detent structure from disengaging from the first complemental detent structure for automatically immobilizing the slide to the first rack post, all automatically in response to advancement of the rail longitudinally from the stowage position to an advanced position relative to the slide. The lock is tensioned to the rail-locking position by at least one spring, and the switch is tensioned to the closed position by at least one spring. An engagement element of the lock is configured to interfere with a complemental engagement element of the switch for securing the lock in the rail-locking position, when the lock occupies the rail-locking position and the switch occupies the closed position. The engagement element of the lock is configured to withdraw from the complemental engagement element of the switch for releasing the lock from the rail-locking position, when the lock occupies the rail-locking position and the switch occupies the open position. A fixture is mounted to the rail and includes a second detent structure. A latch is mounted to the fixture. When the first detent is engaged to the first complemental detent of the first rack post, the second detent structure is configured to engage a second complemental detent structure of a second rack post in response to advancement of the rail relative to the slide to at least the advanced position. The latch is configured to move from an open position to a closed position when the rail is in at least the advanced position relative to the slide and the second detent structure is engaged to the second complemental detent structure for cooperating with the fixture for entrapping the second rack post and disabling the second detent structure from disengaging from the second complemental detent structure for thereby automatically immobilizing the fixture to the second rack post. The latch is tensioned to the closed position of the latch by at least one spring. The rail is mounted to the fixture for movement between a lowered position corresponding to at least a horizontal position of the rail between the fixture and the slide and a raised position corresponding to an inclined position of the rail between the fixture and the slide. A drive member is operatively coupled between the rail and the fixture, whereby rotation of the drive member imparts corresponding movement of the rail between the lowered position and the raised position. The rail is configured to reciprocate longitudinally relative to the slide and the fixture in response to movement of the rail between the lowered position and the raised position.

According to the principle of the invention, a shelf assembly includes rail assemblies on either side of a shelf for supporting objects. The rail assemblies are axially spaced from one another and each includes a rail mounted to a slide including a first detent structure, a lock configured to move from a rail-locking position to a post-locking position, and a switch configured to move from a closed position for securing the lock in the rail-locking position to an open position for releasing the lock from the rail-locking position, and the rail is configured to reciprocate longitudinally relative to the slide. When the rail occupies a stowage position relative to the slide, the lock is configured to restrain the rail from reciprocating longitudinally relative to the slide when the lock occupies the rail-locking position and the switch occupies the closed position for securing the lock in the rail-locking position for thereby disabling the lock from moving from the rail-locking position to the post-locking position, and to enable the rail to reciprocate longitudinally relative to the slide when the lock occupies the rail-locking position and the switch occupies the open position for releasing the lock from the rail-locking position for thereby enabling the lock to move from the rail-locking position to the post-locking position. When the rail occupies the stowage position relative to the slide, the lock occupies the rail-locking position, and the switch occupies the closed position securing the lock in the rail-locking position, the first detent structure is configured to engage a first complemental detent structure of a first rack post and the switch is configured to engage the first rack post and move from the closed position to the open position, all automatically in response to advancement of the slide to an installed position to against the first rack post, and the lock is configured to interact when the rail to move from the rail-locking position to the post-locking position for cooperating with the slide for entrapping the first rack post and disabling the first detent structure from disengaging from the first complemental detent structure for thereby automatically immobilizing the slide to the first rack post, all automatically in response to advancement of the rail longitudinally relative to the slide from the stowage position to an advanced position. The lock is tensioned to the rail-locking position by at least one spring, and the switch is tensioned to the closed position by at least one spring. An engagement element of the lock is configured to interfere with a complemental engagement element of the switch for securing the lock in the rail-locking position, when the lock occupies the rail-locking position and the switch occupies the closed position. The engagement element of the lock is configured to withdraw from the complemental engagement element of the switch for releasing the lock from the rail-locking position, when the lock occupies the rail-locking position and the switch occupies the open position. A fixture is mounted to the rail and includes a second detent structure. A latch is mounted to the fixture. When the first detent engaged to the first complemental detent of the first rack post, the second detent structure is configured to engage a second complemental detent structure of a second rack post in response to advancement of the rail relative to the slide to at least the advanced position. The latch is configured to move from an open position to a closed position when the rail is in at least the advanced position relative to the slide and the second detent structure is engaged to the second complemental detent structure for cooperating with the fixture for entrapping the second rack post and disabling the second detent structure from disengaging from the second complemental detent structure for thereby automatically immobilizing the fixture to the second rack post. The latch is tensioned to the closed position of the latch by at least one spring. The rail is mounted to the fixture for movement between a lowered position corresponding to at least a horizontal position of the rail between the fixture and the slide and a raised position corresponding to an inclined position of the rail between the fixture and the slide. A drive member is operatively coupled between the shelf and the fixture, whereby rotation of the drive member imparts corresponding movement of the rail between the lowered position and the raised position. The rail is configured to reciprocate longitudinally relative to the slide and the fixture, respectively, in response to movement of the rail between the lowered position and the raised position. The shelf includes a conveyor supported by the rail assemblies.

According to the principle of the invention, a rail assembly includes a rail mounted to a slide including a first detent structure, a lock, including a follower and an abutment, configured to move from a rail-locking position to a post-locking position, and a switch configured to move from a closed position for securing the lock in the rail-locking position to an open position for releasing the lock from the rail-locking position, and the rail includes a cam surface and is configured to reciprocate longitudinally relative to the slide. When the rail occupies a stowage position relative to the slide, the lock is configured to restrain the rail from reciprocating longitudinally relative to the slide by an interference between the follower and the cam surface when the lock occupies the rail-locking position and the switch occupies the closed position for securing the lock in the rail-locking position for thereby disabling the lock from moving from the rail-locking position to the post-locking position, and to enable the rail to reciprocate longitudinally relative to the slide without interference from between the follower and the cam surface when the lock occupies the rail-locking position and the switch occupies the open position for releasing the lock from the rail-locking position for thereby enabling the lock to move from the rail-locking position to the post-locking position. When the rail occupies the stowage position relative to the slide, the lock occupies the rail-locking position, and the switch occupies the closed position securing the lock in the rail-locking position, the first detent structure is configured to engage a first complemental detent structure of a first rack post and the switch is configured to engage the first rack post and move from the closed position to the open position, all automatically in response to advancement of the slide to an installed position to against the first rack post, and the follower is configured to follow the cam surface to move the lock from the rail-locking position to the post-locking position for positioning the abutment for cooperating with the slide for entrapping the first rack post and disabling the first detent structure from disengaging from the first complemental detent structure for thereby automatically immobilizing the slide to the first rack post, all automatically in response to advancement of the rail longitudinally relative to the slide from the stowage position to an advanced position. The lock is tensioned to the rail-locking position by at least one spring, and the switch is tensioned to the closed position by at least one spring. An engagement element of the lock is configured to interfere with a complemental engagement element of the switch for securing the lock in the rail-locking position, when the lock occupies the rail-locking position and the switch occupies the closed position. The engagement element of the lock is configured to withdraw from the complemental engagement element of the switch for releasing the lock from the rail-locking position, when the lock occupies the rail-locking position and the switch occupies the open position. A fixture is mounted to the rail and includes a second detent structure. A latch is mounted to the fixture. When the first detent engaged to the first complemental detent of the first rack post, the second detent structure is configured to engage a second complemental detent structure of a second rack post in response to advancement of the rail relative to the slide to at least the advanced position. The latch is configured to move from an open position to a closed position when the rail is in at least the advanced position relative to the slide and the second detent structure is engaged to the second complemental detent structure for cooperating the fixture for entrapping the second rack post and disabling the second detent structure from disengaging from the second complemental detent structure for thereby automatically immobilizing the fixture to the second rack post. The latch is tensioned to the closed position of the latch by at least one spring. The rail is mounted to the fixture for movement between a lowered position corresponding to at least a horizontal position of the rail between the fixture and the slide and a raised position corresponding to an inclined position of the rail between the fixture and the slide. A drive member is operatively coupled between the rail and the fixture, whereby rotation of the drive member imparts corresponding movement of the rail between the lowered position and the raised position. The rail is configured to reciprocate longitudinally relative to the slide and the fixture in response to movement of the rail between the lowered position and the raised position.

According to the principle of the invention, a shelf assembly includes rail assemblies on either side of a shelf for supporting objects. The rail assemblies are axially spaced from one another and each includes a rail mounted to a slide including a first detent structure, a lock, including a follower and an abutment, configured to move from a rail-locking position to a post-locking position, and a switch configured to move from a closed position for securing the lock in the rail-locking position to an open position for releasing the lock from the rail-locking position, and the rail is configured to reciprocate longitudinally relative to the slide. When the rail occupies a stowage position relative to the slide, the lock is configured to restrain the rail from reciprocating longitudinally relative to the slide by an interference between the follower and the cam surface when the lock occupies the rail-locking position and the switch occupies the closed position for securing the lock in the rail-locking position for thereby disabling the lock from moving from the rail-locking position to the post-locking position, and to enable the rail to reciprocate longitudinally relative to the slide without interference from between the follower and the cam surface when the lock occupies the rail-locking position and the switch occupies the open position for releasing the lock from the rail-locking position for thereby enabling the lock to move from the rail-locking position to the post-locking position. When the rail occupies the stowage position relative to slide, the lock occupies the rail-locking position, and the switch occupies the closed position securing the lock in the rail-locking position, the first detent structure is configured to engage a first complemental detent structure of a first rack post and the switch is configured to engage the first rack post and move from the closed position to the open position, all automatically in response to advancement of the slide to an installed position to against the first rack post, and the follower is configured to follow the cam surface to move the lock from the rail-locking position to the post-locking position for positioning the abutment for cooperating with the slide for entrapping the first rack post and disabling the first detent structure from disengaging from the first complemental detent structure for thereby automatically immobilizing the slide to the first rack post, all automatically in response to advancement of the rail longitudinally relative to the slide from the stowage position to an advanced position. The lock is tensioned to the rail-locking position by at least one spring, and the switch is tensioned to the closed position by at least one spring. An engagement element of the lock is configured to interfere with a complemental engagement element of the switch for securing the lock in the rail-locking position, when the lock occupies the rail-locking position and the switch occupies the closed position. The engagement element of the lock is configured to withdraw from the complemental engagement element of the switch for releasing the lock from the rail-locking position, when the lock occupies the rail-locking position and the switch occupies the open position. A fixture is mounted to the rail and includes a second detent structure. A latch is mounted to the fixture. When the first detent engaged to the first complemental detent of the first rack post, the second detent structure is configured to engage a second complemental detent structure of a second rack post in response to advancement of the rail relative to the slide to at least the advanced position. The latch is configured to move from an open position to a closed position when the rail is in at least the advanced position relative to the slide and the second detent structure is engaged to the second complemental detent structure for cooperating with the fixture for entrapping the second rack post and disabling the second detent structure from disengaging from the second complemental detent structure for thereby automatically immobilizing the fixture to the second rack post. The latch is tensioned to the closed position of the latch by at least one spring. The rail is mounted to the fixture for movement between a lowered position corresponding to at least a horizontal position of the rail between the fixture and the slide and a raised position corresponding to an inclined position of the rail between the fixture and the slide. A drive member is operatively coupled between the rail and the fixture, whereby rotation of the drive member imparts corresponding movement of the rail between the lowered position and the raised position. The rail is configured to reciprocate longitudinally relative to the slide and the fixture in response to movement of the rail between the lowered position and the raised position. The shelf includes a conveyor supported by the rail assemblies.

BRIEF DESCRIPTION OF THE DRAWINGS

Referring to the drawings.

DETAILED DESCRIPTION

Disclosed herein are improved rail and shelf assemblies, which are each configured to be installed horizontally at a chosen elevation to a standard equipment rack as for a support, and each being inexpensive, easy to install onto the rack without the use of separate tools and without having to modify it or the equipment rack and without the need for separate bolts or other mechanical fasteners, thereby being “boltless” or otherwise “fastener-less” according to this disclosure.

Figure 1:
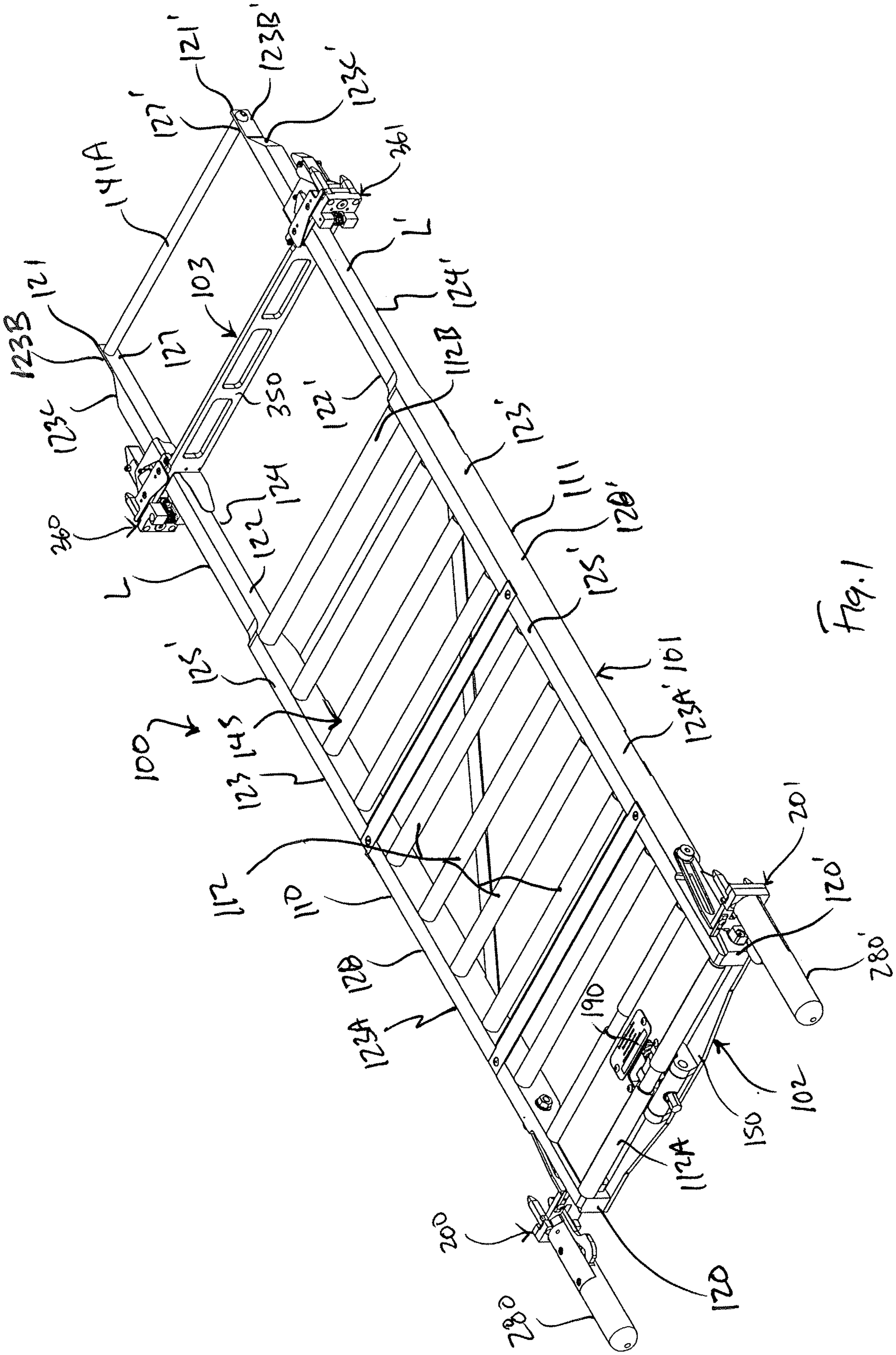
FIG. 1 is a perspective view of a shelf assembly constructed and arranged in accordance with the principle of the invention, the shelf assembly including front and rear support assemblies mounted at either end of a shelf, the front support assembly includes a drive member operatively coupled between the front support assembly and the shelf and being adjustable between lowering and raising positions for adjusting the shelf between a lowered position relative to the front support assembly corresponding to at least a horizontal position of the shelf between the front and rear support assemblies and a raised position relative to the front support assembly corresponding to an inclined position of the shelf between the front and rear support assemblies, and the rear support assembly includes slides mounted reciprocally to the shelf and each being configured to adjust between a rail-locking position and a post-locking position, the drive member being in the lowering position setting the shelf in the lowered position, and the slides each being in the post-locking position.
Figure 2:
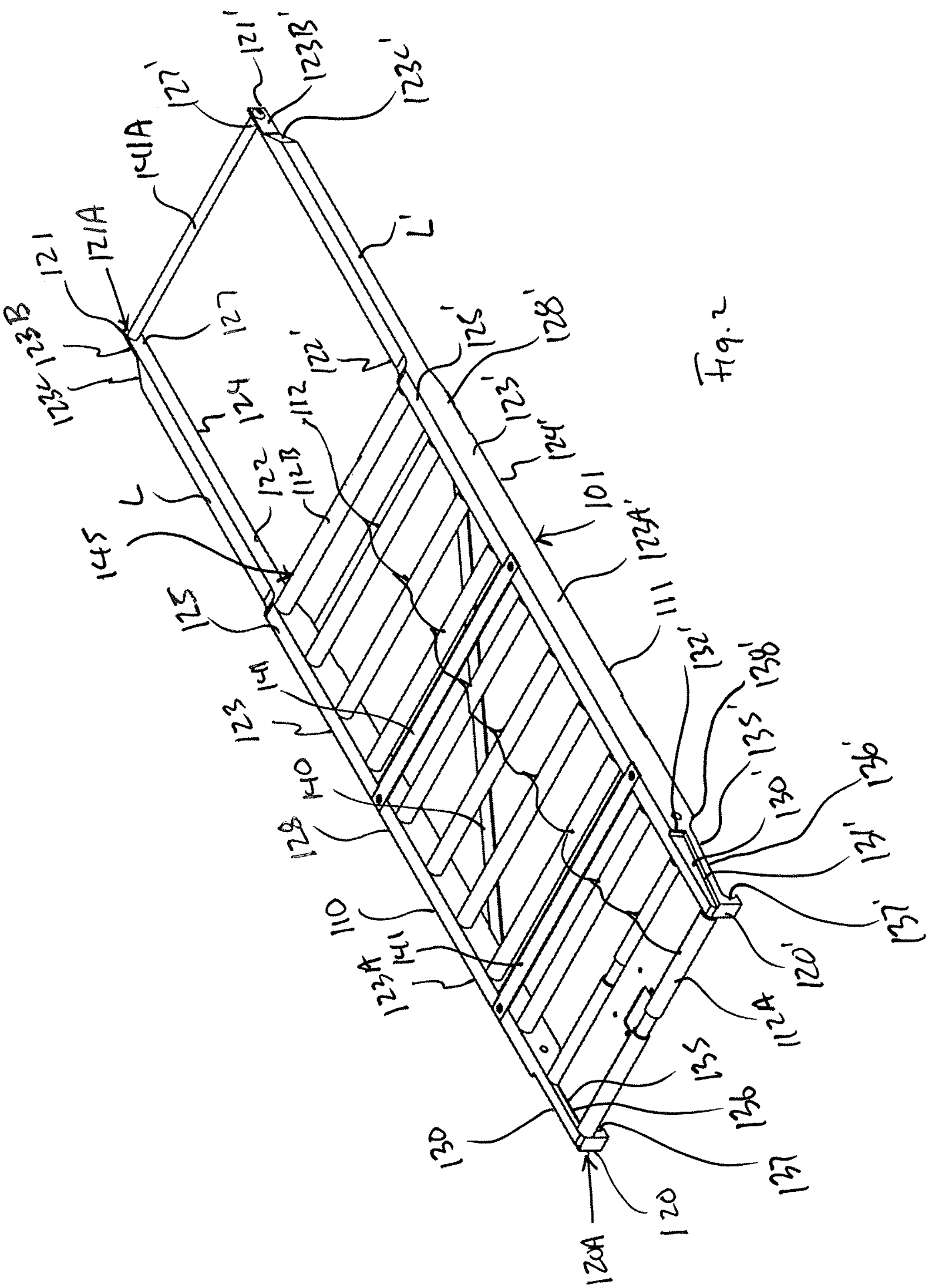
FIGS. 2 and 3 are perspective views of the shelf assembly of FIG. 1.

Referring to FIG. 1, disclosed herein is a shelf assembly 100 configured to be installed horizontally to a standard equipment rack as for a support, and which is inexpensive, easy to install onto the rack without the use of separate tools and without having to modify it or the rack and without the need for separate bolts or other mechanical fasteners, thereby being "boltless" or otherwise "fastener-less" according to this disclosure. Shelf assembly 100 includes three main parts, namely, shelf 101, front support assembly 102, and a self-adjusting rear support assembly 103. Front support assembly 102 and rear support assembly 103 are mounted at either end of shelf 101. Shelf 101 is for supporting objects and includes opposed, axially spaced-apart, parallel rails 110 and 111 on either side of shelf 101 to which front and rear support assemblies 102 and 103 are attached. Front support assembly 102 and rear support assembly 103 are mounted to rails 110 and 111 at either end of the respective rails 110 and 111 and, thus, at either end shelf 101. The rails 110 and 111 of shelf 101 are configured to reciprocate longitudinally relative to rear support assembly 103 for enabling shelf 101 as a whole to concurrently reciprocate longitudinally relative to the rear support assembly 103.

Rear support assembly 103 is self-adjustable from a rails-locking position to posts-locking position. With rails 110 and 111 each being in a stowage position relative to rear support assembly 103, rear support assembly 103 is configured to concurrently restrain rails 110 and 111 from reciprocating longitudinally relative to rear support assembly 103 in response to rear support assembly 103 being in the rails-locking position, and to concurrently enable rails 110 and 111 to reciprocate longitudinally relative to rear support assembly 103 in response to rear support assembly 103 being in the posts-locking position. With rails 110 and 111 being in the stowage positions relative to rear support assembly 103 and rear support assembly 103 being in the rails-locking position, rear detent elements, in the form of pins, of the rear support assembly 103 are configured to concurrently engage complemental rear detent elements, in the form of openings, of respective rear rack posts and rear support assembly 103 is configured to concurrently engage the rear rack posts and move from the racks-locking position to the posts-locking position to concurrently entrap the rear rack posts and disable the rear detent elements of rear support assembly 103 from disengaging from the complemental rear detent elements of the respective rear rack posts to thereby automatically immobilize rear support assembly 103 to the rear rack posts, all automatically in response to advancement of shelf assembly 100 in one swoop or sweeping motion rearwardly advancing rear support assembly 103 toward and directly against the first rack posts followed immediately by advancement of rails 110 and 111 longitudinally relative to rear support assembly 103 from the stowage position of rails 110 and 111 to supporting or advanced positions of rails 110 and 111 which corresponds to a supporting or advanced position of shelf 101.

Front support assembly 102 includes front detent elements and is adjustable from an open position to a closed position. With the rear detent elements of rear support assembly 103 engaged to the respective complemental rear detent elements of the rear rack posts, the front detent elements, in the form of pins, are configured to concurrently engage complemental front detent elements, in the form of openings, of the respective front rack posts in response to concurrent advancement of rails 110 and 111 to at least their advanced positions corresponding to the advanced position of shelf 101 relative to rear support assembly 103, and front support assembly 102 is configured to move from the open position to the closed position when rails 110 and 111 are in at least the advanced position of shelf 101 relative to rear support assembly 103 and the front detent elements of front support assembly 102 are concurrently engaged to the respective complemental front detent elements of front rack posts to concurrently entrap the front rack posts and disable the front detent elements from disengaging from the complemental front detent elements to thereby automatically immobilize front support assembly 102 to the front rack posts. Shelf 101 is mounted to front support assembly 102 for movement between a lowered position corresponding to at least a horizontal position of shelf 101 between front and rear support assemblies 102 and 103 and a raised position corresponding to an inclined position of shelf 101 between front and rear support assemblies 102 and 103. A drive member is operatively coupled between shelf 101 and front support assembly 102, whereby rotation of the drive member imparts corresponding movement of shelf 101 between the lowered position and the raised position. Rails 110 and 111 are configured to concurrently reciprocate longitudinally relative to front and rear support assemblies 102 and 103 in response to movement of shelf 101 between the lowered position corresponding to at least a horizontal position of shelf 101 between front and rear support assemblies 102 and 103 and the raised position corresponding to an inclined position of shelf 101 between front and rear support assemblies 102 and 103.

Shelf 101 is discussed below in § I, front support assembly 102 is discussed below in § II, rear support assembly 103 is discussed below in § III, and the assembly of a rack and shelf assembly 100 and methods of installing shelf assembly 100 to an equipment rack are discussed in detail in § IV.

§ I. THE SHELF

Referring to FIGS. 1-4, shelf 101 is an assembly of opposed, parallel rails 110 and 111, and conveyor 145 defined by rollers 112. Rails 110 and 111 and rollers 112 are is fashioned of steel, aluminum or other metal or metal composite having inherently rugged, impact resistant, strong, and rigid material characteristics, and are structural elements capable of withstanding loads primarily by resisting bending. Rails 110 and 111 are elongate and straight and are the mirror image of one another and are identical in every respect. Accordingly, the following description of rail 110 applies in every respect to rail 111. Rails 110 and 111 are given the same reference characters. The reference numerals of rail 111 include prime ("'") symbols for ease of reference.

Referring in relevant part to FIGS. 1-5, rail 110 is elongate and straight from a proximal extremity 120 to a distal extremity 121, and includes opposed inner and outer surfaces 122 and 123 that extend from proximal extremity 120 to distal extremity 121, and opposed lower and upper surfaces 124 and 125 that extend from proximal extremity 120 to distal extremity 121. Inner surface 122 is straight from proximal extremity 120 to distal extremity 121. Outer surface 123 includes three discrete surfaces, namely, outermost surface 123A, innermost surface 123B, and cam surface 123C therebetween. Outermost surface 123A extends from proximal extremity 120 to cam surface 123C near or otherwise proximate to distal extremity 121. Cam surface 123C inclines inwardly toward distal extremity 121 from outermost surface 123A to innermost surface 123B, which extends from cam surface 123C to distal extremity 121. Thickness T of rail 110 between inner surface 122 and outermost surface 123A is the same from proximal extremity 120 to cam surface 123C, and gradually tapers along cam surface 123C between cam surface 123C and inner surface 122 from outermost surface 123A to innermost surface 123B to thickness T1 of rail 110 that extends from cam surface 123C to distal extremity 121. Rail 110 is generally square in cross section from proximal extremity 120 to cam surface 123C. Thickness T1 of rail 1110 from cam surface 123C to distal extremity 121 is the same. Thickness T of rail 110 between inner surface 122 and outermost surface 123A from proximal extremity 120 to cam surface 123C is greater than thickness T1 of rail 110 between inner surface 122 and innermost surface 123B from cam surface 123C to distal extremity 121. The part of rail 110 defined by thickness T1 to the rear of cam surface 123C is a "stowage section" of rail 110 denoted at 127 that extends rearwardly from cam surface 123C to distal extremity 121, and is thinned in comparison to the comparatively thicker "support section" of rail 110 denoted at 128 that is forward of cam surface 123C and that extends forwardly from cam surface 123C to proximal extremity 120. Stowage section 127 extends rearwardly from cam surface 123C to proximal extremity 121 and is exemplary of a thin plate compared to the comparatively thicker support section 128 of rail 110 having a generally square cross section that extends from proximal extremity 120 to cam surface 123C. Stowage and support sections 127 and 128 of rail 110 are on either side of cam surface 123C, stowage section 127 to the rear of cam surface 123C and support section 128 to the front of cam surface 123C.

Figure 3:
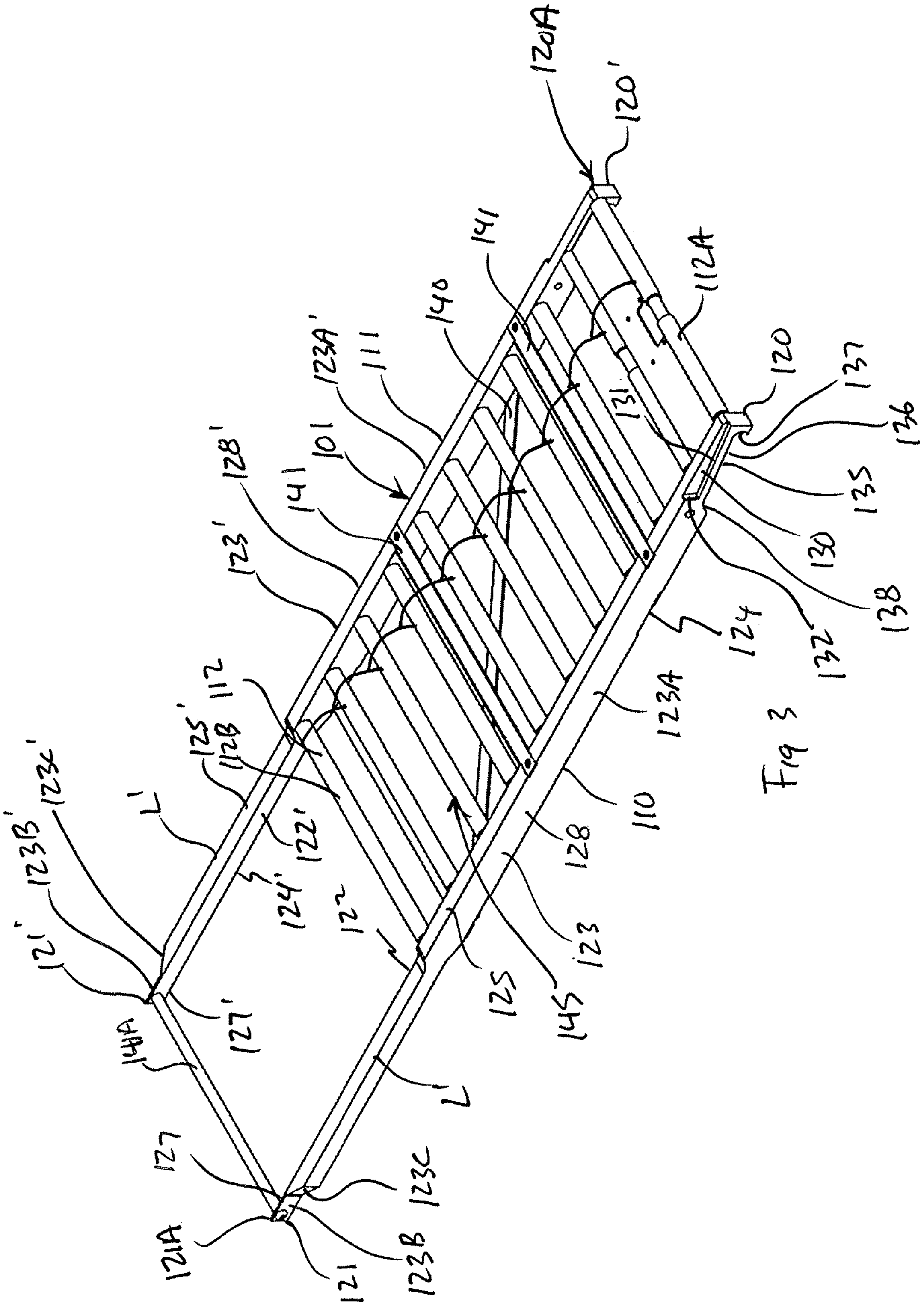
Figure 4:
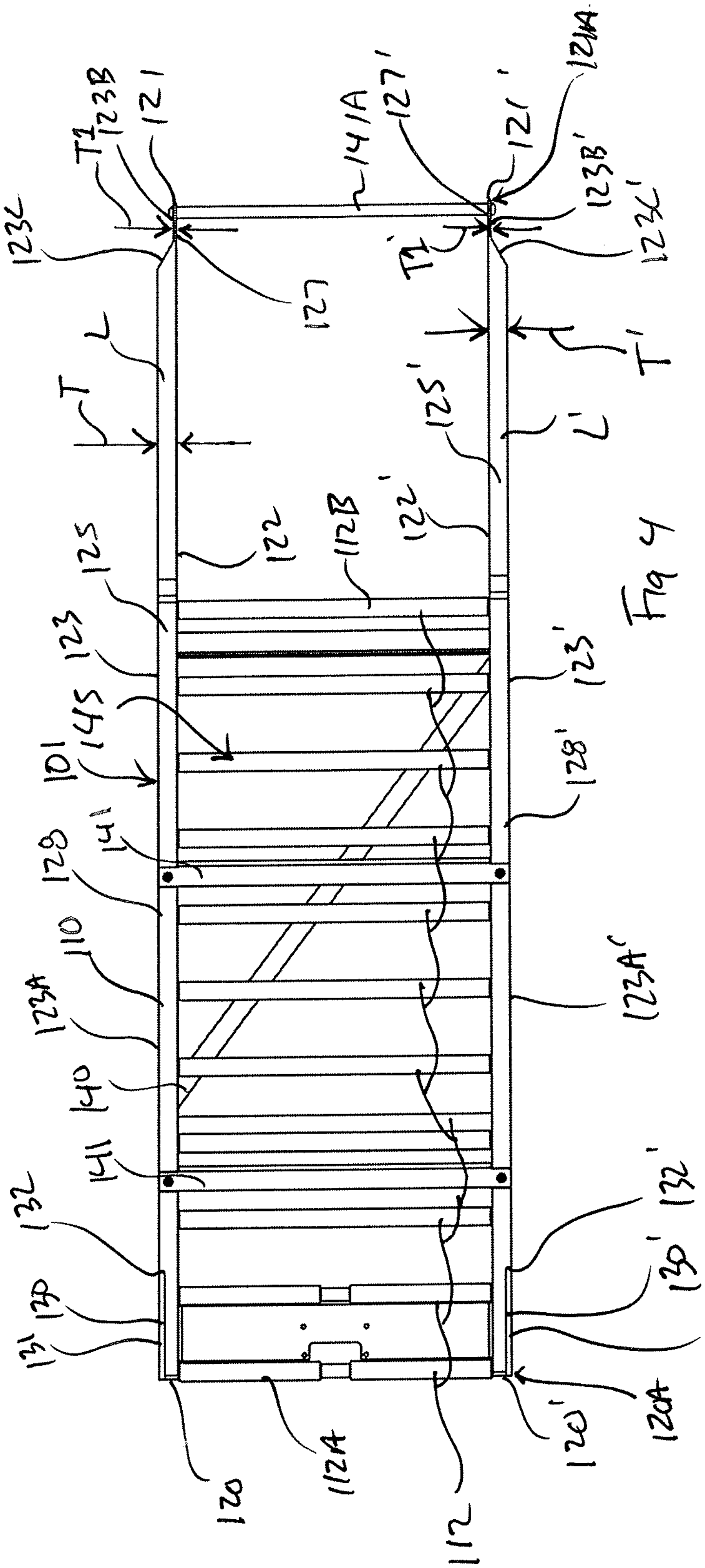
FIG. 4 is a top plan view of the embodiment of FIGS. 2 and 3.
Figure 5:
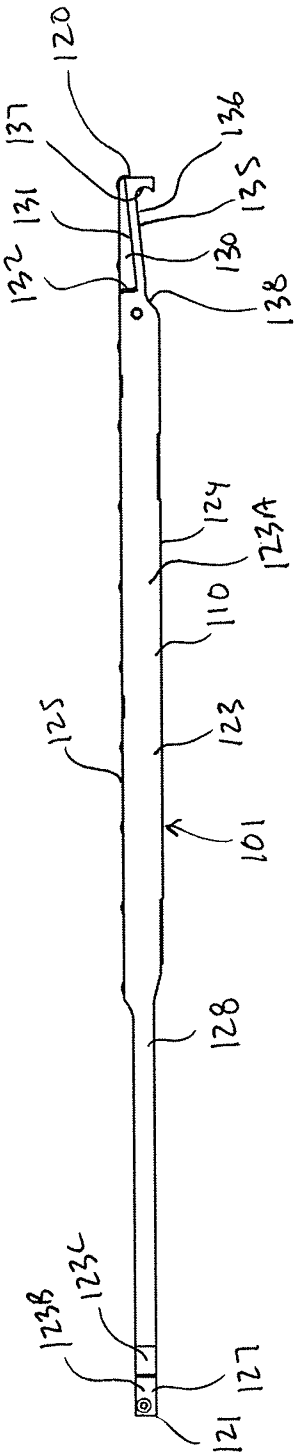
FIG. 5 is a left side elevation view of the embodiment of FIGS. 2 and 3, the opposite right side elevation view being the same thereof.

In FIGS. 3 and 5, opposed recesses 130 and 135 are formed in outermost surface 123A and lower surface 124, respectively, of rail 110 proximate to proximal extremity 120, which define opposed, parallel, upper and lower inclined running surfaces 131 and 136 of support section 128 of rail 110 that concurrently incline downwardly relative to upper surface 124 from proximal extremity 120. Upper inclined running surface 131 extends from proximal extremity 120 to distal end wall 132 of recess 130. Lower inclined running surface 136 extends from proximal end wall 137 of recess 135 near proximal extremity 120 to distal end wall 138 under distal end wall 132 of recess 130.

Rails 110 and 111 of shelf 101 are axially spaced-apart and parallel relative to one another, concurrently extend longitudinally in the same direction rearwardly from forward proximal extremities 120 and 120' to rearward distal extremities 121 and 121', and concurrently extend upright from lower surfaces 124 and 124' to upper surfaces 125 and 125'. Stowage sections 127 and 127' of the respective rails 110 and 111 are axially spaced-apart, and support sections 128 and 128' of rails 110 and 111 are axially-spaced apart. Rollers 112 are identical and are supported by and between support sections 128 and 128' of rails 110 and 111. For orientation and reference, it is to be understood that proximal extremities 120 and 120' of rails 210 and 211 define the proximal end or extremity 120A of shelf 101, and that distal extremities 121 and 121' of rails 210 and 211 define the distal end or extremity 121A of shelf 101.

Rollers 112 are spaced-apart and parallel relative to each other between proximal extremities 120 and 120' of rails 110 and 111, i.e. the proximal extremity 120A of shelf 101, and an intermediate position of support sections 128 and 128' between cam surfaces 123C and 123C' and proximal extremities 120 and 120' of rails 110 and 111, are perpendicular relative to rails 110 and 111, extend axially between inner surfaces 122 and 122' of support sections 128 and 128', and are journaled for rotation to support sections 128 and 128' of rails 110 and 111 111 with radial or other standard rotary bearings. Rollers 112 rotate along parallel axes of rotation that are perpendicular relative to rails 110 and 111.

Rollers 112 cooperate to define a roller conveyor, denoted generally at 145, for conveying loads placed thereon in linear directions including a rearward linear direction extending from proximal extremities 120 and 120' of rails 110 and 111, i.e. the proximal extremity 120A of shelf 101, to distal extremities 121 and 121' of rails 110 and 111, i.e. the distal extremity 121A of shelf 101, and a forward linear direction in the opposite direction extending from distal extremities 121 and 121' of rails 110 and 111, i.e. the distal extremity 121A of shelf 101, to proximal extremities 120 and 120' of rails 110 and 111, i.e. the proximal extremity 120A of shelf 101. Conveyor 145 defined by rollers 112 extends from forward-most or innermost roller 112A proximate to proximal extremities 120 and 120' of rails 110 and 111 to a rearward-most or outermost roller 112B at an intermediate position of support sections 128 and 128' between cam surfaces 123C and 123C' and proximal extremities 120 and 120' of rails 110 and 111. This importantly leaves lengths L and L' of support sections 128 between the outermost roller 112B and distal extremities 121 and 121' of the respective rails 110 and 111 free of rollers to which rear support assembly 103 is mounted reciprocally for enabling rear support assembly 103 to reciprocate back-and-forth along lengths L and L' between outermost roller 112B and distal extremities 121 and 121' without interference. Accordingly, the described lengths L and L' being free of rollers define the mounting sections of the respective rails 110 and 111 onto which rear support assembly 103 is mounted reciprocally. Conveyor 145 is useful for conveying loads in the described linear directions between innermost roller 112A and outermost roller 112B. A diagonal brace 140 and spaced-apart parallel braces 141 extend between and are connected to rails 110 and 111 with screws or other suitable fasteners for holding rails 110 and 111 together, and for imparting rigidity and steadiness to shelf 101. Shelf 101 incorporates eleven rollers 112, and less or more can be used as desired to meet specific needs.

§ II. THE FRONT SUPPORT ASSEMBLY AND THE SHELF FORMED THEREWITH

Figure 6:
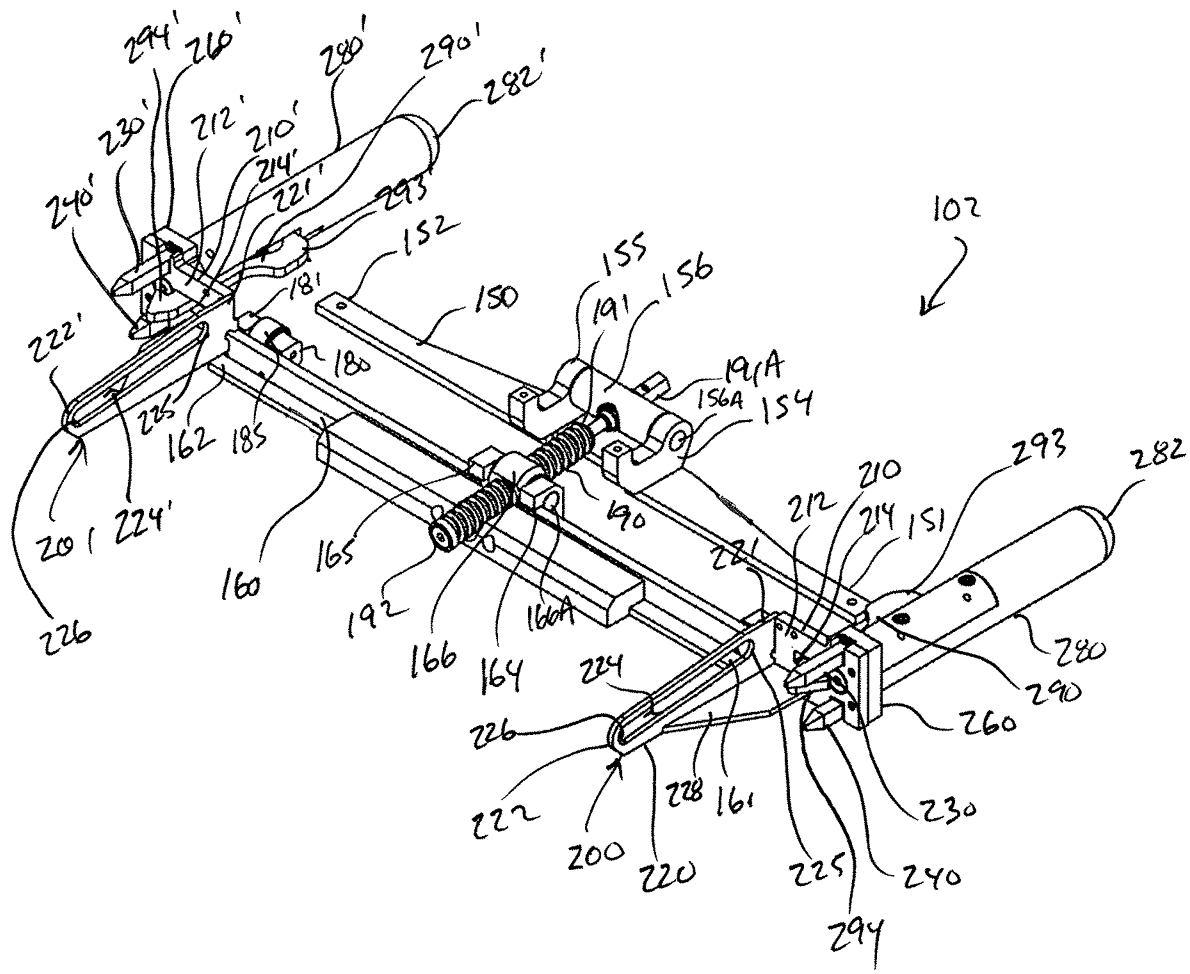
FIG. 6 is a perspective view of the front support assembly of FIG. 1.
Figure 7:
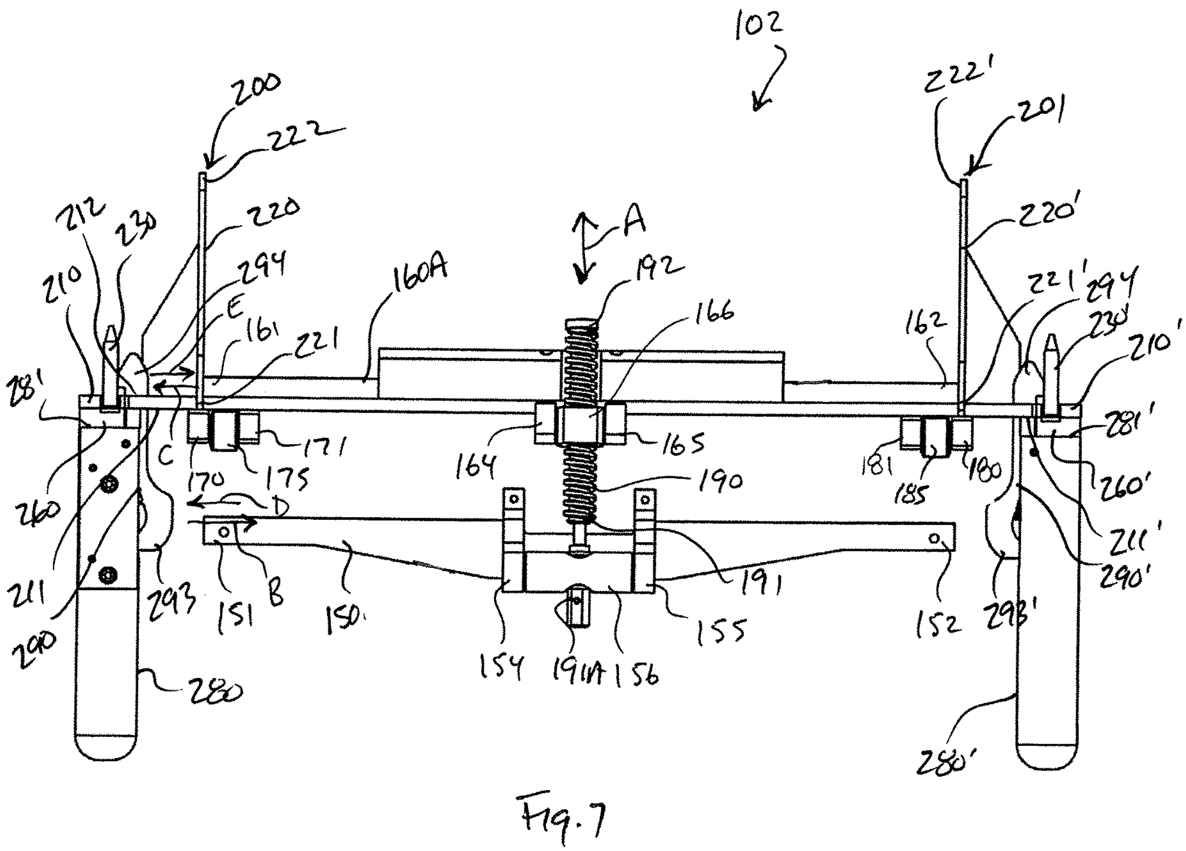
FIG. 7 is a top plan view of the embodiment of FIG. 6.
Figure 8:
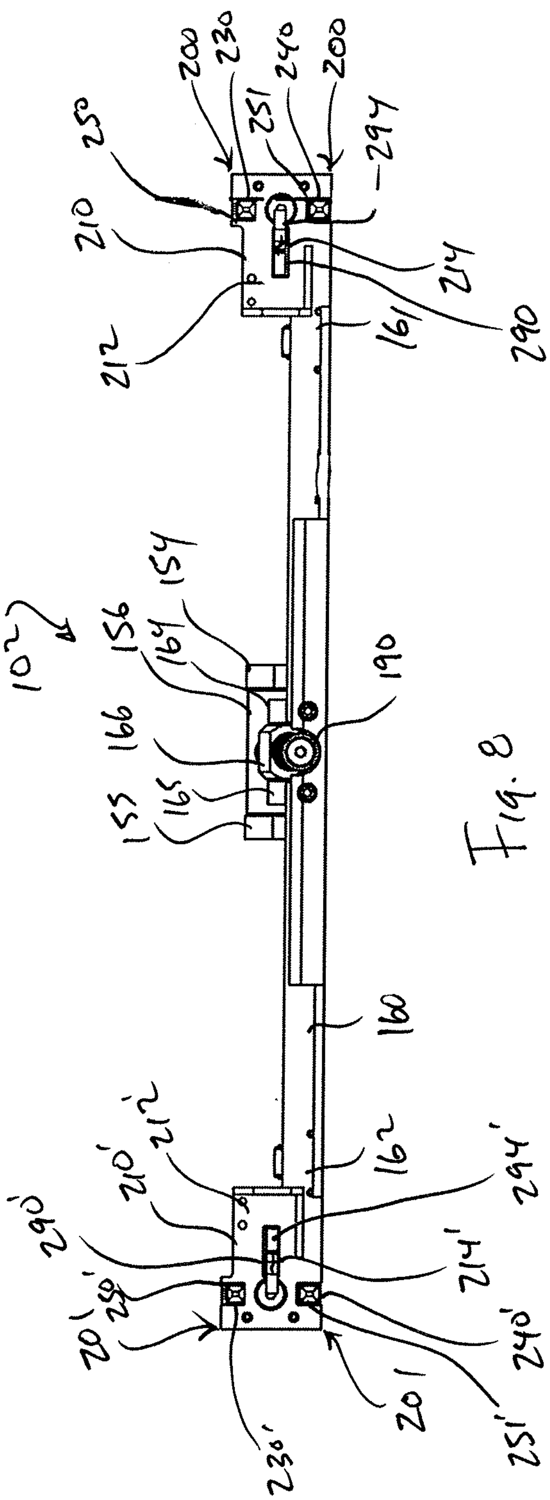
FIG. 8 is a front elevation view of the embodiment of FIG. 6.
Figure 9:
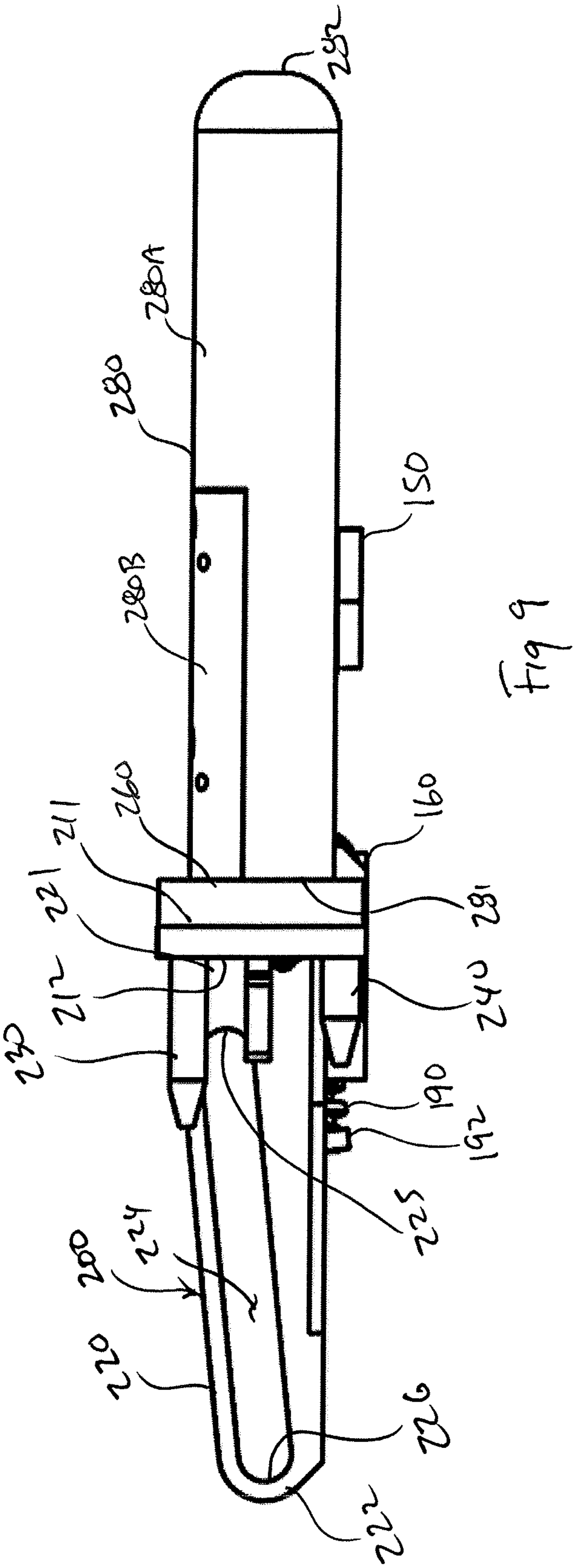
FIG. 9 is a left side elevation view of the embodiment of FIG. 6, the opposite right side elevation view being the same thereof.
Figure 10:
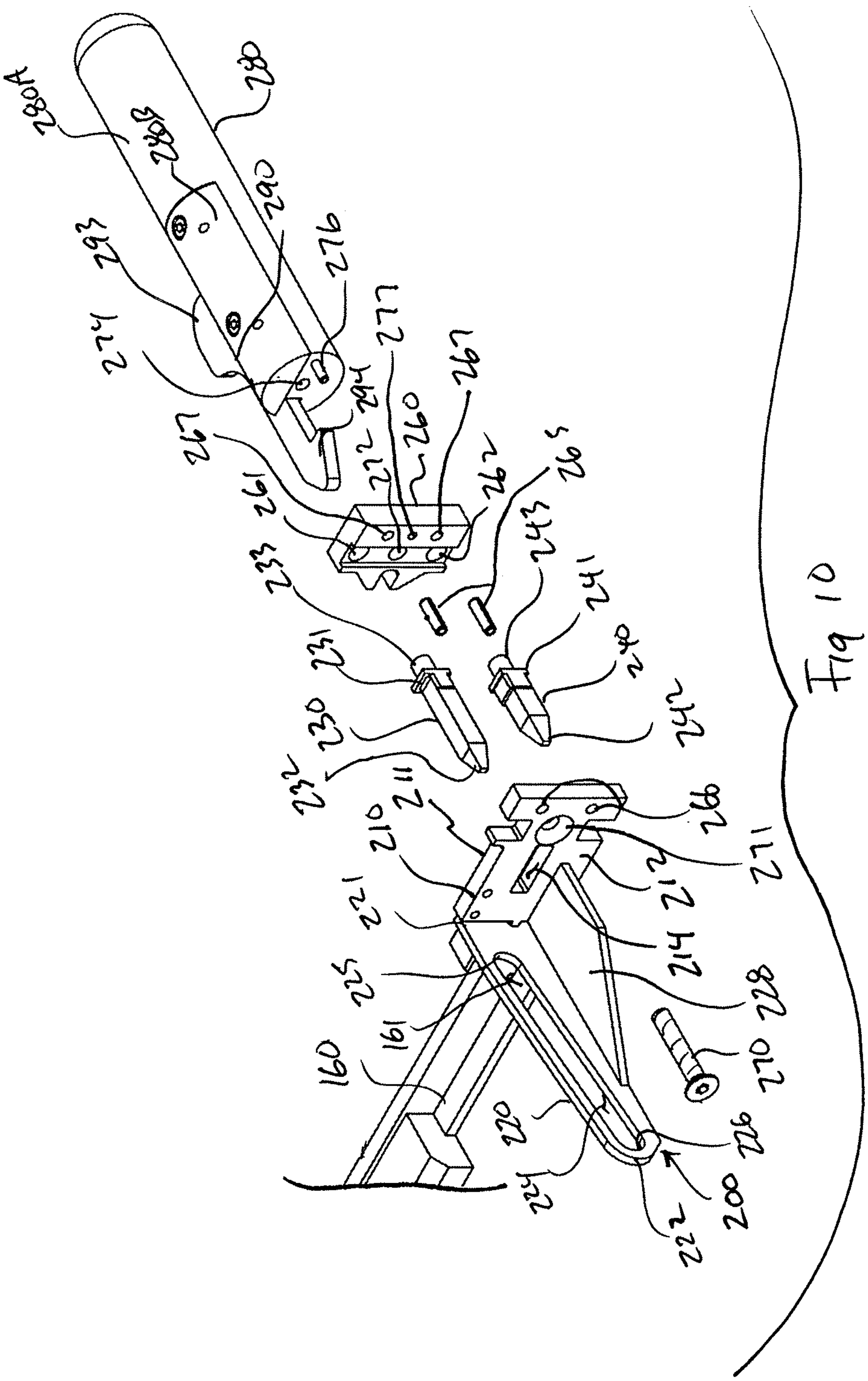
FIG. 10 is a fragmentary, partially exploded perspective view of the embodiment of FIG. 6.

Referring to FIGS. 6 and 7, front support assembly 102 is fashioned of steel, aluminum or other metal or metal composite having inherently rugged, impact resistant, strong, and rigid material characteristics, and is a structural element capable of withstanding loads primarily by resisting bending. Front support assembly 102 includes forward or front brace 150, rear brace 160, and a drive member operatively coupled between front brace 150 and rear brace 160. Front and rear braces 150 and 160 are assemblies, are elongate, and are parallel relative to each other.

Front brace 150 is elongate and includes opposed ends 151 and 152. Front brace 150 carries opposed lugs 154 and 155 affixed centrally to front brace 150 between ends 151 and 152. Lugs 154 and 155 support pivotally attached bearing 156 therebetween. The opposite ends of bearing 156 each includes pin 156A. Bearing 156 is secured pivotally to the respective lugs 154 and 155 by pins 156A.

Rear brace 160 spaced rearwardly from front brace 150. Rear brace 160 is elongate and includes opposed ends 161 and 162, and fixtures 200 and 201. Fixture 200 and rail 110 are configured to be coupled together for relative reciprocal movement to form a rail assembly, and fixture 201 is configured to be identically coupled together for relative reciprocal movement to form an identical rail assembly. These rail assemblies are on either side of shelf 101, are identical, and support conveyor 145.

End 161 supports fixture 200, and end 162 supports fixture 201. Fixtures 200 and 201 are part of rear brace 160, which carries opposed lugs 164 and 165 affixed centrally to rear brace 160 between ends 161 and 162. Lugs 164 and 165 support pivotally attached internally threaded barrel nut 166 therebetween. The opposite ends of barrel nut 166 each includes pin 166A. Barrel nut 166 is secured pivotally to the respective lugs 164 and 165 by pins 166A. In FIG. 7, rear brace 160 additionally includes opposed lugs 170 and 171 affixed to rear brace 160 proximate to end 161, opposed lugs 180 and 181 affixed to rear brace 160 proximate to end 162, and identical bearings 175 and 185, each preferably of the roller type supported by an axle. Bearing 175 is between and supported by lugs 170 and 171, and bearing 185 is between and supported by lugs 180 and 181.

An externally threaded shank 190 includes opposed inner and outer ends 191 and 192. Threaded shank 190 is threaded to and through barrel nut 166, and extension 191A of inner end 191 extends through and is captured by and rotated to bearing 156. Extension 191A extends forwardly through bearing 156 to inner end 191 and rearwardly from inner end 191 through barrel nut 166 to outer end 192. Rotation of threaded shank 190 in clockwise and counterclockwise directions imparts reciprocal movement of threaded shank 190 through barrel nut 166 in the directions and double arrow A along its longitudinal axis extending from inner end 191 to outer end 192 for imparting corresponding reciprocal movement of front brace 150 rearwardly toward rear brace 160 and forwardly away from rear brace 160 in the directions indicated by double arrowed line A.

Extension 191A of threaded shank 190 extends forwardly beyond bearing 156 and is configured to be engaged by a wrench or other tool for rotating threaded shank 190 in opposite directions with a mechanical advantage. Threaded shank 190 is a drive member operatively coupled between front and rear braces 150 and 160 via bearing 156 pivotally secured to front brace 150 and barrel nut 166 pivotally secured to rear brace 160, whereby rotation of the drive member, threaded shank 190, imparts corresponding relative movement of front brace 150 in reciprocal directions of arrow A relative to rear brace 160, i.e., toward and away from rear brace 160.

Ends 161 and 162 of rear brace 160 support fixtures 200 and 201. Fixtures 200 and 201 carried by rear brace 160 are axially spaced apart and are the mirror image of one another and are identical in every respect. Accordingly, the following description of fixture 200 applies in every respect to fixture 201. Fixtures 200 and 201 are given the same reference characters. The reference numerals of fixture 201 include prime ("'") symbols for ease of reference.

Referring in relevant part to FIGS. 6-10, fixture 200 is an assembly, and includes block 210, onto which various components of fixture 200 are mounted, and straight, slotted arm 220. Block 210 follows rear brace 160 outwardly, is an extension of end 161, is integral with end 161, and extends outwardly from end 161 and slotted arm 220. Block 210 includes front surface 211, a forwardly-facing surface facing forwardly toward end 151 of front brace 150, and rear surface 212, a rearwardly-facing surface facing rearwardly in the opposite direction. Opening 214, for the reception of a latch end of a lever discussed in detail below, extends through block 210 from front surface 211 to rear surface 212.

Slotted arm 220 includes inner end 221, outer end 222, and straight, elongate slot 224 therethrough that extends from inner end wall 225 proximate to inner end 221 to outer end wall 226 proximate to outer end 222. Inner end 221 is affixed to block 210 proximate to end 161 of rear brace 160, and extends rearwardly from rear surface 212 to outer end 222. Slotted arm 220 is perpendicular relative to rear brace 160. Brace 228 affixed between slotted arm 220 and rear surface 212 of block 210 imparts rigidity to block 210 and slotted arm 220. Slotted arm 220, including slot 224, incline downwardly from inner end 221 best seen in FIG. 9.

Fixture 200 additionally includes upper and lower pins 230 and 240 on either side of opening 214. Upper and lower pins 230 and 240 are carried by block 210, together form a detent structure of fixture 200, are outboard of and oppose slotted arm 220, are outboard of opening 214, and are parallel relative to each other and to slotted arm 220. Upper pin 230 is elongate and straight and includes a butt end 231, extends rearwardly from butt end 231 to pointed outer end 232, and includes extension 233 extending forwardly from butt end 231. In this example, upper pin 230 is square in cross section from pointed outer end 232 to and including butt end 231 for enabling upper pin 230 to be received by a standard square hole of a standard post of a standard equipment rack, and extension 233 is circular in cross section. Lower pin 240 is elongate and straight and includes a butt end 241, extends rearwardly from butt end 241 to pointed outer end 242, and includes extension 243 extending forwardly from butt end 241. Like upper pin 230, lower pin 240 is square in cross section from pointed outer end 242 to and including butt end 241 for enabling lower pin 240 to be received by a standard square hole of a standard post of a standard equipment rack, and extension 243 is circular in cross section. Upper and lower pins 230 and 240 identical in every respect, with the exception the length of upper pin 230 from butt end 231 to pointed outer end 232 is longer than the length of lower pin 240 from butt end 241 to pointed outer end 242.

Block 210 is formed with opposed, vertically-aligned upper and lower notches 250 and 251 formed to the outer side of opening 214. Opening 214 is between end 161 and notches 250 and 251, upper notch 250 is above opening 214, and lower notch 251 is below opening 214. Upper notch 250 accepts butt end 231 of upper pin 230, and lower notch 251 accepts butt end 241 of lower pin 240. The square cross section shape of butt ends 231 and 241 and a corresponding shape of upper and lower notches 250 and 251 disable upper and lower pins 230 and 240 from rotating about their longitudinal axes relative to block 210 and which are parallel relative to each other and to slotted arm 220. Upper pin 230 extends rearward horizontally from rear surface 212 of block 210 from butt end 231 in upper notch 250 to pointed outer end 232, and extension 233 extends forwardly in the opposite direction from front surface 211. Lower pin 240 extends rearward horizontally from rear surface 212 of block 210 from butt end 241 in lower notch 251 to pointed outer end 242, and extension 243 extends forwardly in the opposite direction from front surface 211. Additionally to being parallel relative to one another, upper and lower pins 230 and 240 are axially-aligned vertically.

Extensions 233 and 243 key into corresponding upper and lower holes 261 and 262 of lug 260 secured to front surface 211 of block 210 by attachment pins 265 secured in corresponding holes 266 and 267 of block 210 and lug 260, respectively, to thereby secure upper and lower pins 230 and 240 in place. Lug 260 is secured between block 210 and outer end 281 of handle 280 by screw 270 that extends into countersunk hole 271 of block 210, through an appropriate hole 272 in lug 260, and that threadably secures an appropriate threaded hole 274 in outer end 281 of handle 280, and with attachment pin 276 that extends rearwardly from outer end 281 of handle 280 into an appropriate hole 277 in lug 260 that cooperates with the attachment of screw 270 to disable handle 280 from rotating about its longitudinal axis. Screw 270 is tightened to secure and clamp lug 260 between front surface 211 of block 210 and outer end 281 of handle 280. Handle 280 extends forwardly from attached outer end 281 to inner end 282.

Figure 11:
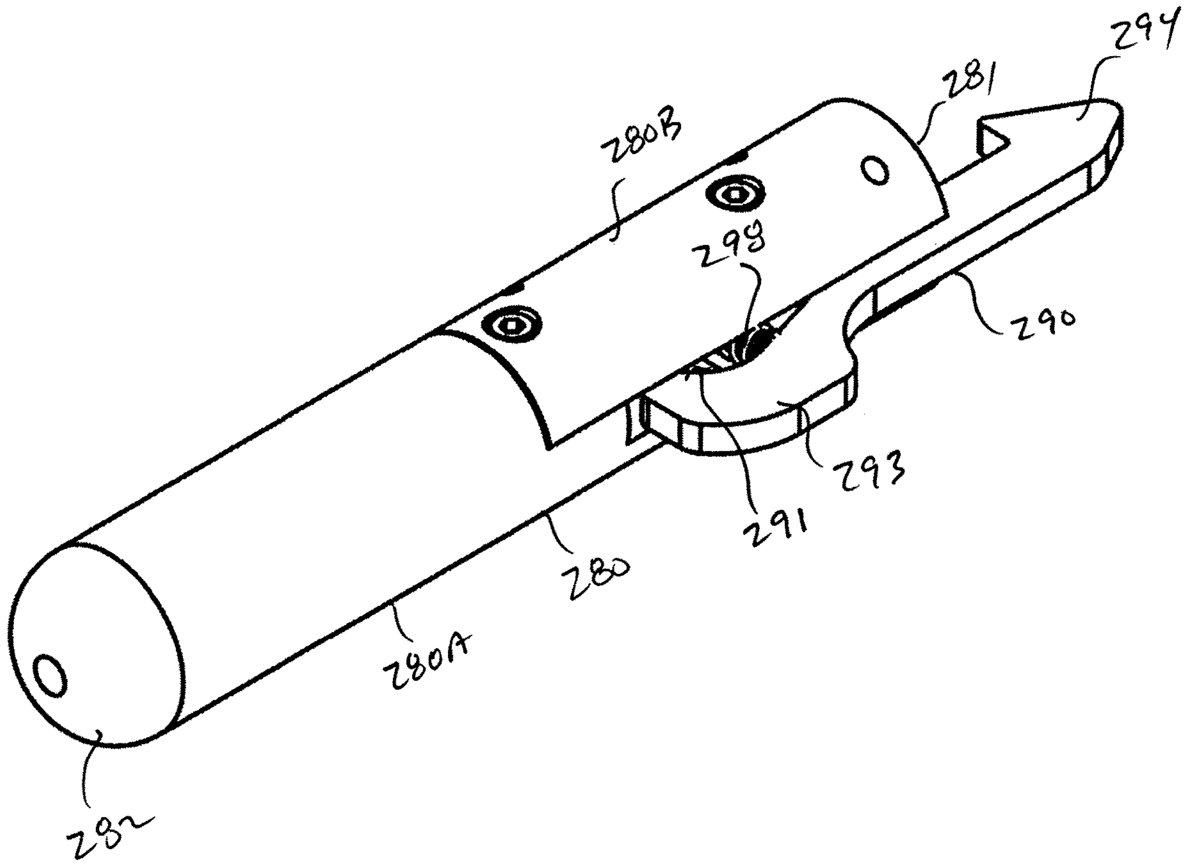
FIG. 11 is a perspective view of a handle assembly of the embodiment of FIG. 6.

Handle 280 is part of fixture 200 and is useful for being taken up by hand for wielding assembly 100. Handle 280 is elongate, is parallel relative to upper and lower fingers 230 and 240 and slotted arm 220, and is perpendicular relative to front brace 150 and rear brace 160. Handle 280 and extends forwardly from its outer end 281, behind extensions 233 and 243 of upper and lower pins 230 and 240, secured to the outer side of lug 260 to its inner end 282. Referring to FIG. 11, handle 280 includes lever arm 290 fitted in slot 291 formed in handle 280. Slot 291 extends forwardly from outer end 281 to an intermediate position between outer end 281 and inner end 282. Handle 280 includes main part 280A and removable part 280B that when joined together cooperate to form handle 280.

Figure 12:
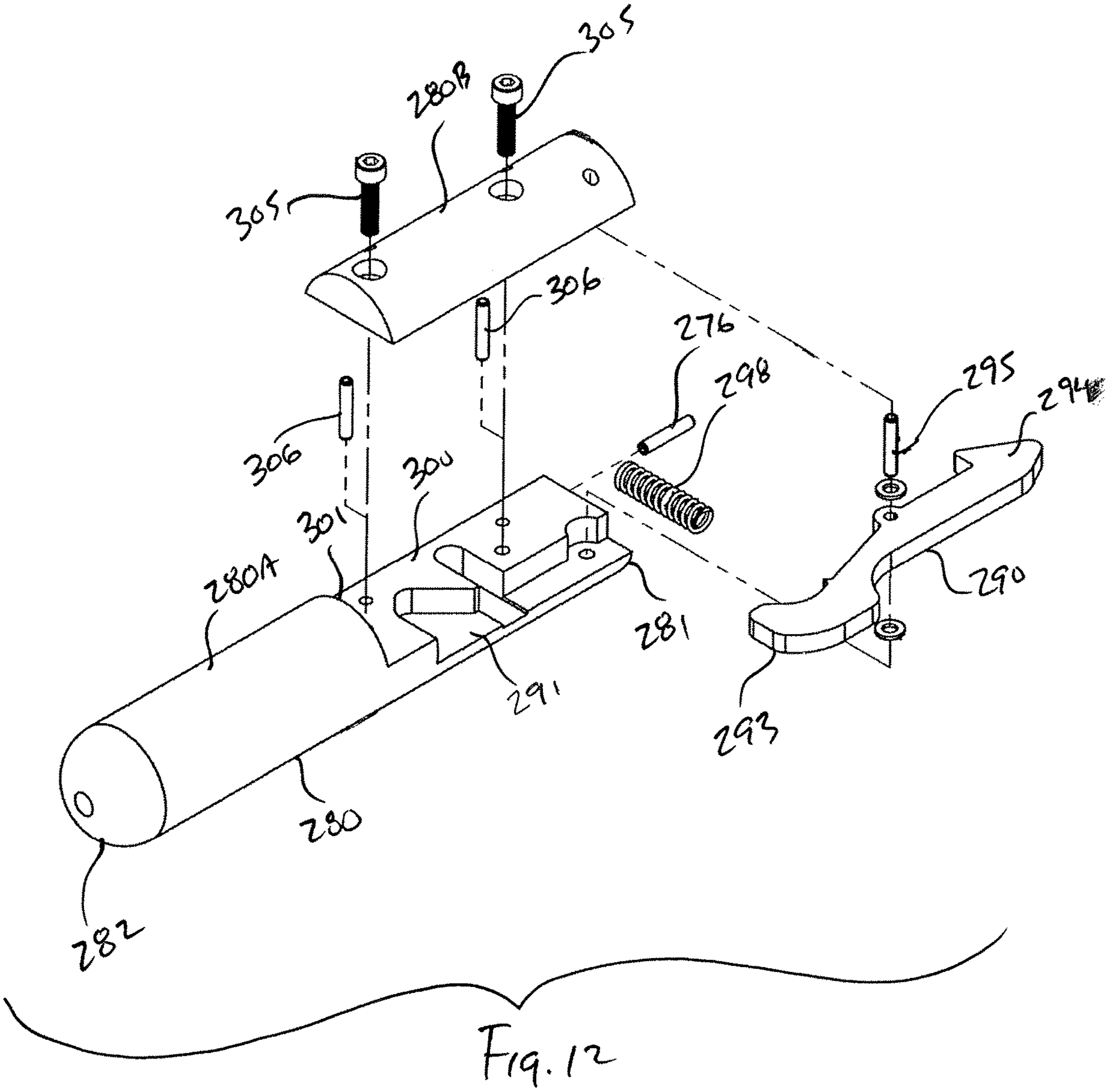
FIG. 12 is an exploded perspective view of the embodiment of FIG. 11.
Figure 13:
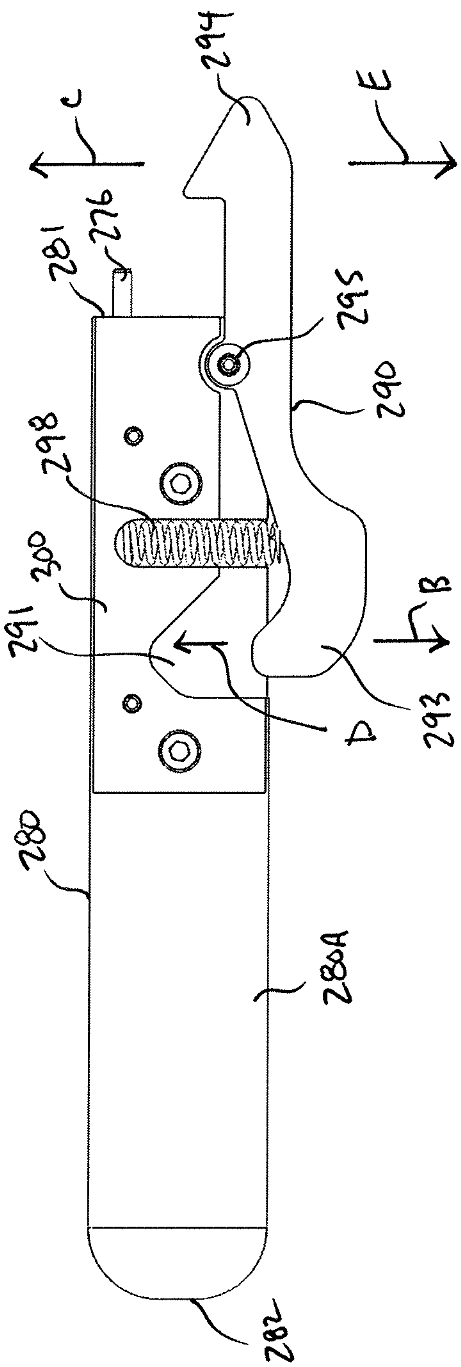
FIG. 13 is a top plan view of the embodiment of FIG. 11 with portions thereof removed to better illustrate the elements thereof.

Referring in relevant part to FIGS. 12 and 13, main part 280A includes notch 300 formed with slot 291 that extends laterally into main part 280A between outer end 281 and intermediate end wall 301 of main part 280A between outer end 281 and inner end 282. Notch 300 is sized to accept removable part 280B to form handle 280 and close slot 290 vertically while leaving it open laterally to outer end 281, and which is secured in place by bolts 305 and pins 306 secured in appropriate holes in removable part 280B and notch 300 of main part 280B.

Figure 15:
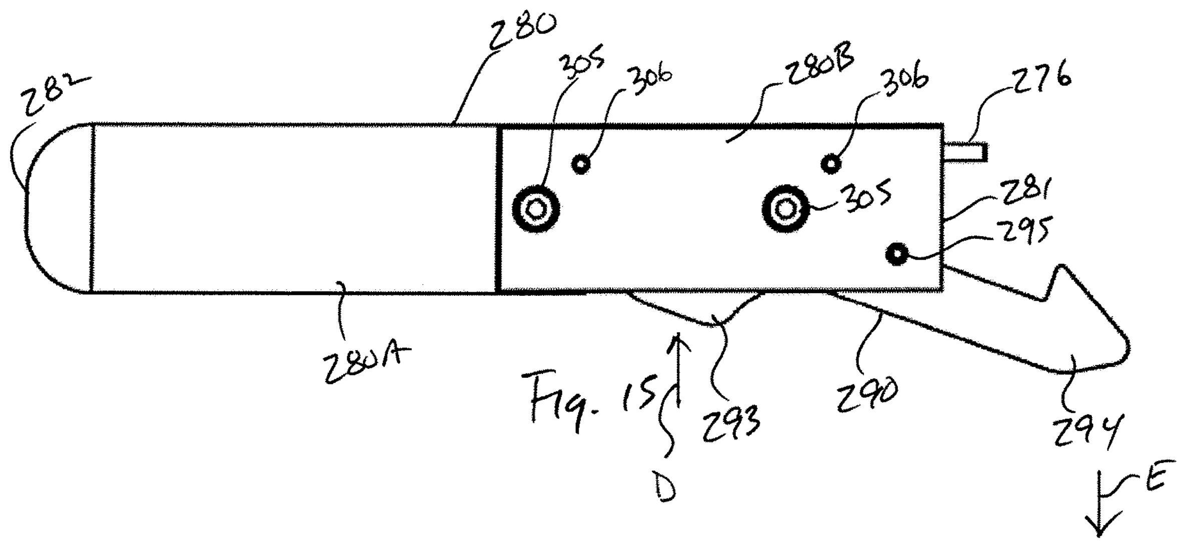
FIG. 15 is view similar to that of FIG. 14 illustrating the latch in an open position.
Figure 14:
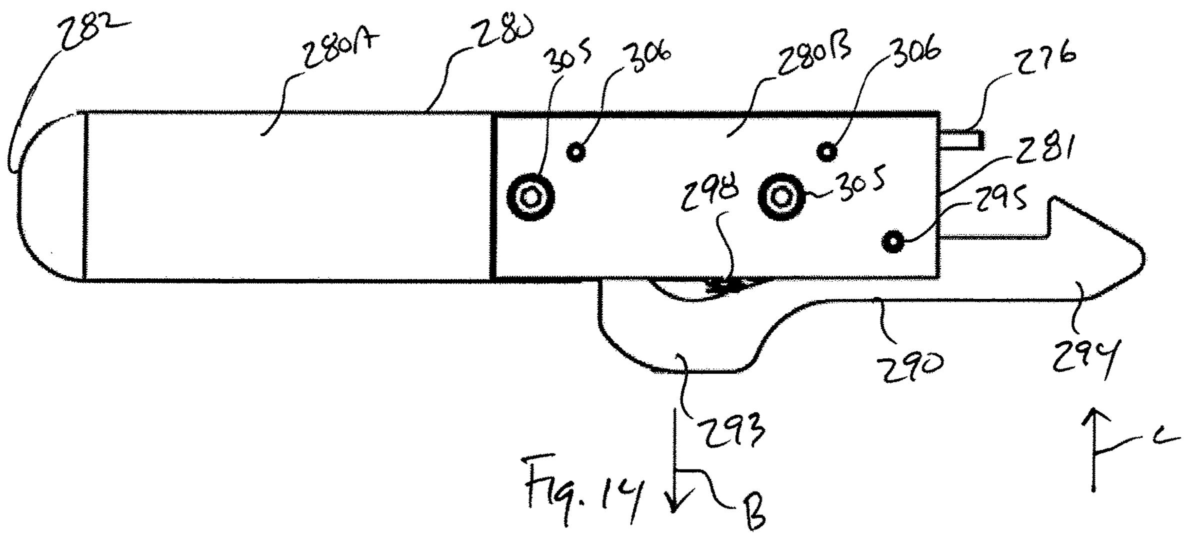
FIG. 14 is a top plan view of the embodiment of FIG. 1 showing a latch in a closed position.

Lever arm 290 includes handle 293 and opposed latch 294, which is outwardly hooked. Lever arm 290 is received in slot 291, and is pivotally secured at a fixed point between its handle and latch ends 293 and 294 to removable part 280B and notch 300 of main part 280A by pin 295 proximate to outer end 281. Lever arm 290 is received in slot 291 from handle 293 to an intermediate position of lever arm 290 at pin 295 between handle 293 and latch 294, and extends rearwardly from pin 295 and from outer end 281 of handle 280 to latch 294. Lever arm 290 pivots about pin 295 between a closed position in FIGS. 13 and 14, and an open position in FIG. 15. In the closed position of lever arm 290 in FIGS. 13 and 15, handle end 293 is pivoted inwardly in the direction of arrow B away from slot 291 and latch 294 is pivoted outwardly in the direction of arrow C in the opposite direction into a closed or latching position. In the open position of lever arm 290 in FIG. 15, handle 293 is pivoted outwardly into slot 291 in the direction of arrow D and latch 294 is pivoted inwardly in the opposite direction of arrow E into an open or unlatching position. In FIGS. 12 and 13, lever arm 290 is returned to its closed position by compression spring 298 captured between slot 291 and lever arm 290 between pin 295 and handle 293 urging/biasing lever arm 290 to assume its closed position in FIGS. 13 and 14 after release from its open position in FIG. 15. At least one spring 298 constantly tensions lever arm 290, i.e. exerts a constant bias against lever arm 290, constantly urging/biasing it to its closed position of latch 294. In other words, lever arm 290 is constantly tensioned to the closed position of latch 294 by spring 298. Since lever arm 290 is constantly tensioned to the closed position of latch 294 by spring 298, latch 294 is constantly tensioned to its closed position by latch 294.

Returning to FIGS. 6 and 7, handle 280 extends forwardly from outer end 281 attached to lug 260 secured between block 210 and outer end 281, to inner end 282, and lever arm 290 is between handle 280 and each of slotted arm 220, end 151 of front brace 150, and end 161 of rear brace 160. Lever arm 290 extends rearwardly from handle 293 to outer end outer end 281 of handle 280 and rearwardly beyond outer end 281 through opening 214 of block 210 from front surface 211 to rear surface 212 to latch 294 between upper and lower pins 230 and 240. Again, lever arm 290 is mounted pivotally to handle 280 between its closed position in FIGS. 13 and 14, and its open position in FIG. 15. Opening 214 is sufficiently sized to enable lever arm 290 that extends through opening 214 between outer end 281 of handle and latch 294 reciprocate from side-to-side without restriction in response to adjustment of lever arm 290 between its closed and open positions. In the closed position of lever arm 290, handle 293 is pivoted inwardly in the direction of arrow B away from slot 291 toward end 151 of front brace 150 and latch 294 is pivoted outwardly in the opposite direction of arrow C into its closed or latching position away from slotted arm 220 toward and between upper and lower pins 230 and 240. In the open position of lever arm 290, handle end 923 is pivoted outwardly in the direction of arrow D into slot 291 away from end 151 of front brace 150 and latch 294 is pivoted inwardly in the opposite direction of arrow E away from upper and lower pins 230 and 240 toward slotted arm 220 into its open or unlatching position. Lever arm 290 is returned to its closed position by the previously-described compression spring 298 captured between slot 291 and lever arm 290 between pin 295 and handle 293 urging/biasing lever arm 290 to assume its closed position in FIGS. 13 and 14 after release, such as by hand, from its open position in FIG. 15.

Figure 16:
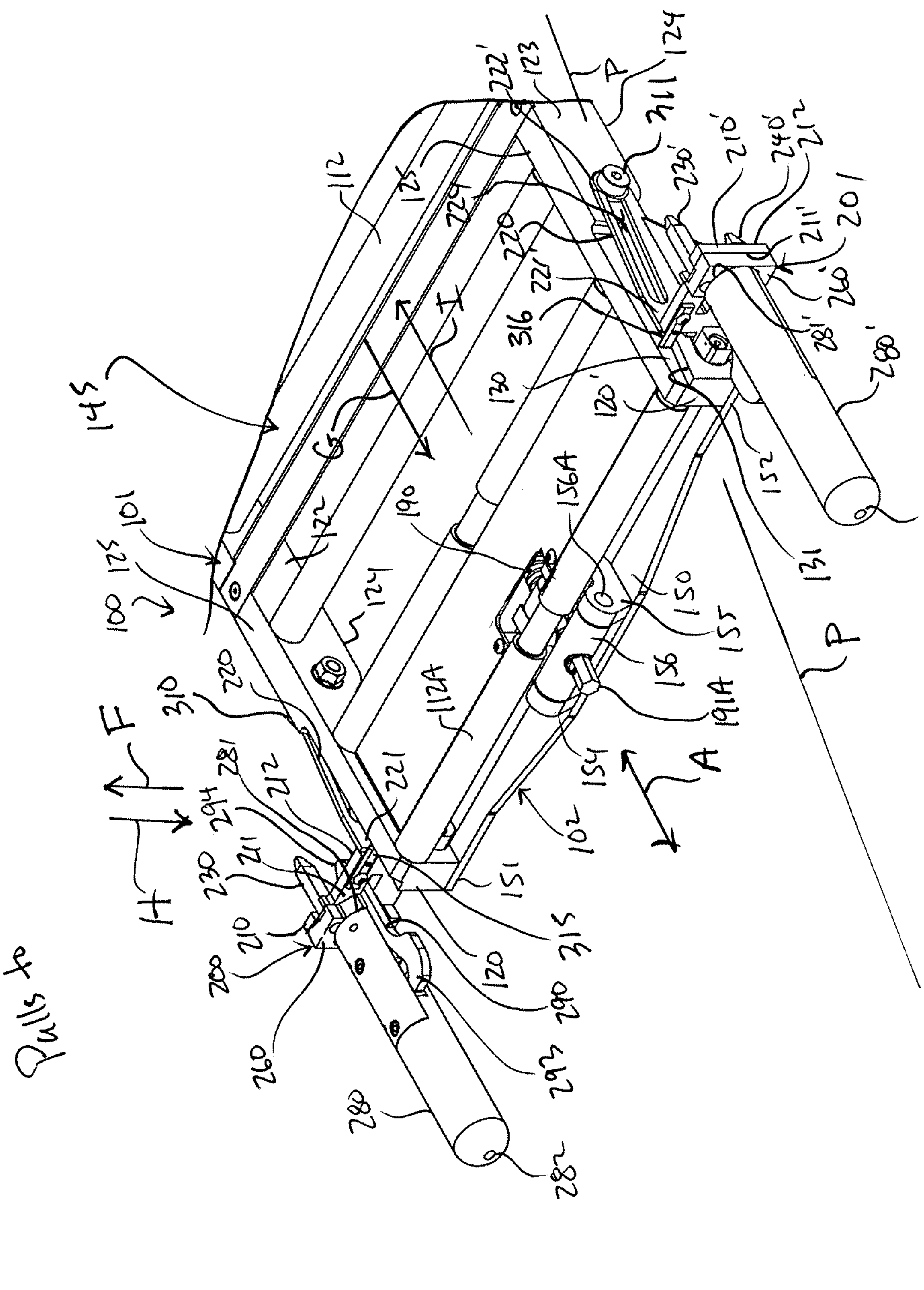
FIGS. 16 and 17 are enlarged, fragmentary, top perspective views of the embodiment of FIG. 1 illustrating the front support assembly mounted to the shelf.
Figure 17:
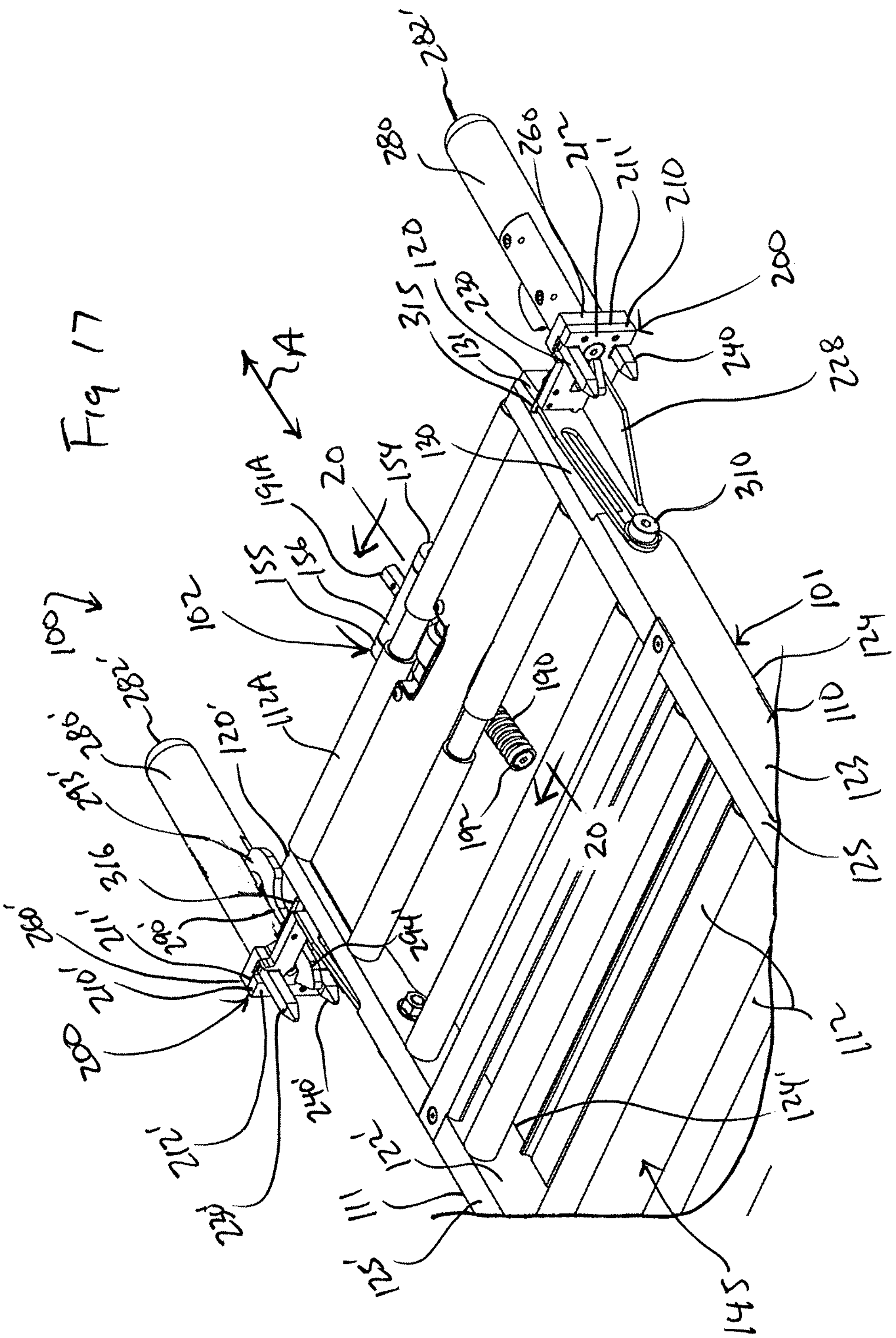
Figure 18:
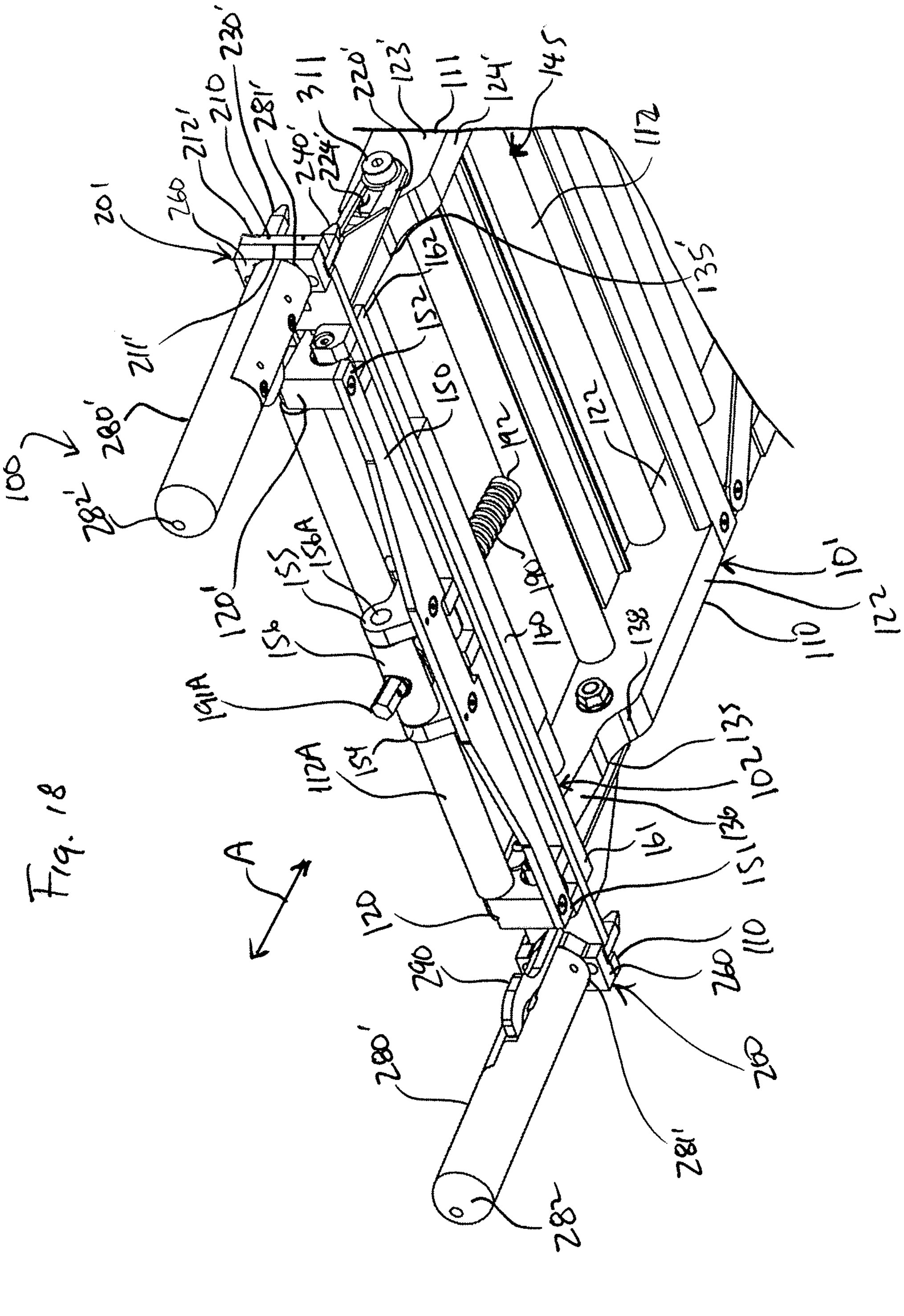
FIGS. 18 and 19 are enlarged, fragmentary, bottom perspective views corresponding to FIGS. 16 and 17, respectively.
Figure 19:
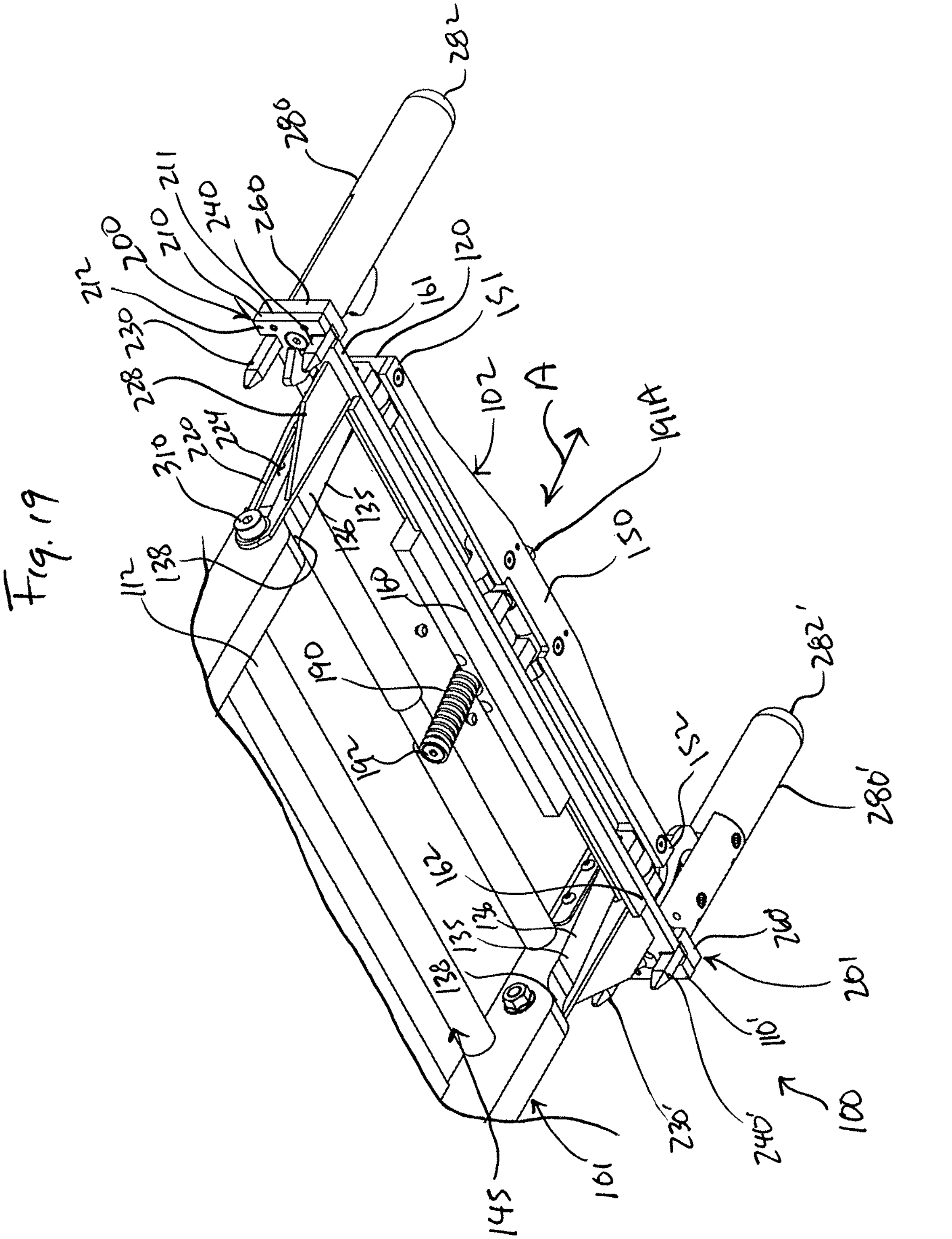
Figure 22:
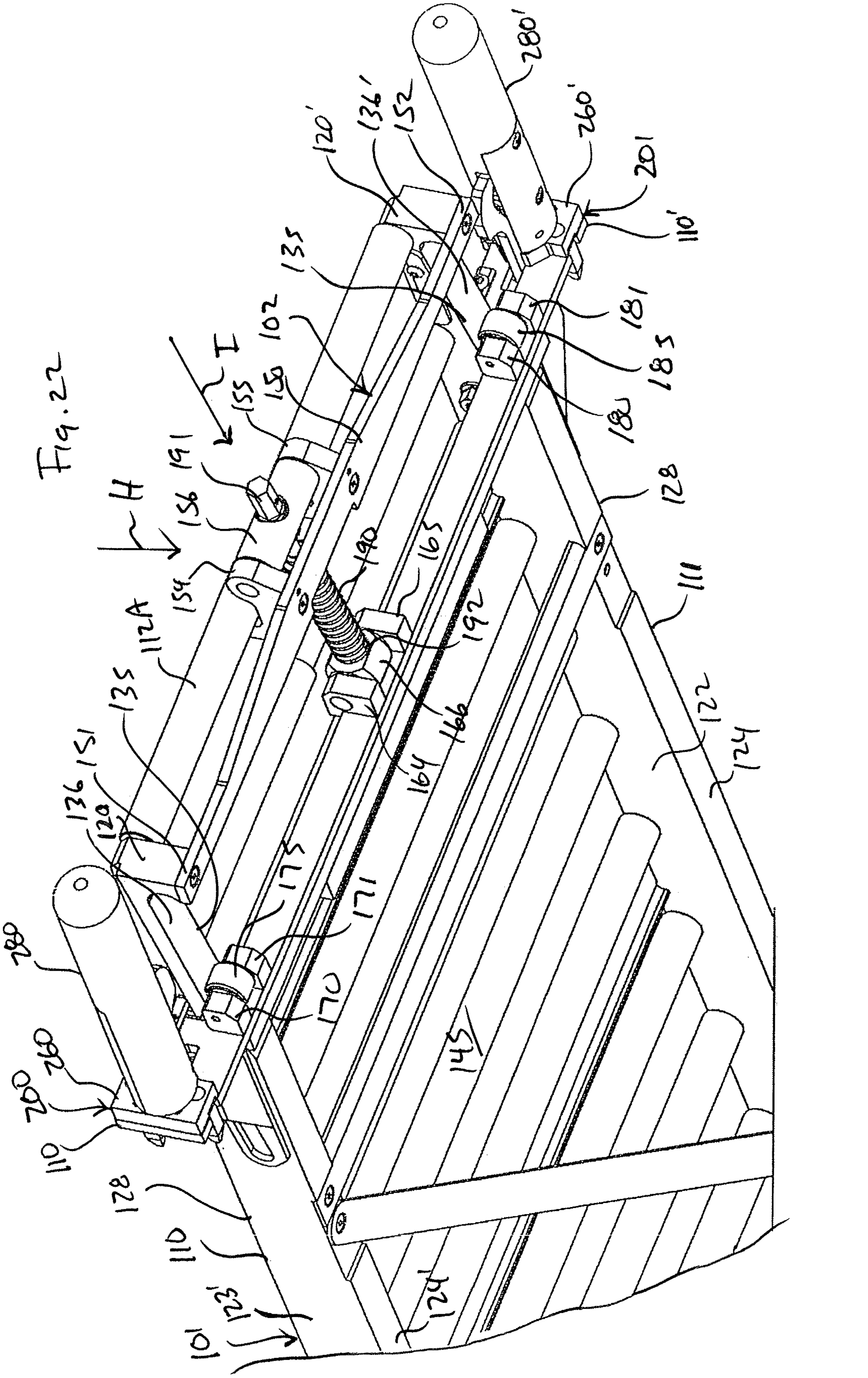
FIGS. 22 and 23 are enlarged, fragmentary, bottom perspective views corresponding to FIGS. 18 and 20 illustrating the drive member of FIG. 20 adjusted to the raising position corresponding to the raised position of the shelf relative to the front support assembly.

FIGS. 16 and 17 are enlarged, fragmentary, top perspective views of the embodiment of FIG. 1 illustrating front support assembly 102 mounted to the proximal extremity of shelf 101, and FIGS. 18 and 19 are enlarged, fragmentary, bottom perspective views corresponding to FIGS. 16 and 17, respectively. Referring to FIGS. 16-18 in relevant part, in the assembly of shelf 101 and front support assembly 102, front brace 150 is secured immovably directly to shelf 101, rear brace 160 is mounted reciprocally to shelf 101, and threaded shank 190 operably connects front brace 150 to rear brace 160, wherein rotation of threaded shank 190 in opposite directions imparts corresponding movement of front brace in reciprocal directions indicated by arrow A relative to rear brace 160. Front brace 150 to the front of rear brace 160 extends under forward-most roller 112A of conveyor 145 and across shelf 101 from end 151 of front brace 150 secured by a screw or welding to lower surface 125 of rail 110 at proximal extremity 120 to end 152 of front brace 150 secured to lower surface 125' of rail 111 at proximal extremity 120' by a screw or welding. In FIG. 22, running surfaces 136 and 136' and recesses 135 and 135' concurrently extend rearwardly from the attachment points of ends 151 and 152 of front brace 150 to proximal extremities 120 and 120' of the respective rails 110 and 111. In the assembly of front support assembly 102 to the proximal extremity 120A of shelf 101 defined generally by proximal extremities 120 and 120' of rails 110 and 111, front brace 150 is immovably affixed to shelf 101, shelf 101 is reciprocated to rear brace 160, and front brace 150 is operatively coupled to rear brace 160 by threaded shank 190, whereby rotation of threaded shank 190 in opposite directions imparts corresponding movement of front brace 150 and shelf 101 attached thereto in reciprocal directions relative to rear brace 160 and its attached fixtures 200 and 201.

Rear brace 160 is spaced rearwardly from front brace 150. Rear brace 160 is under conveyor 145 and extends under and across shelf 101 from fixture 200 outboard of proximal extremity 120 of rail 210 to fixture 201 outboard of proximal extremity 120' of rail 111. Thusly, rear brace 160 extends outwardly beyond rail 110 to fixture 200 outboard of proximal extremity 120, and extends outwardly beyond rail 111 in the opposite direction to fixture 201 outboard of proximal extremity 120. Fixtures 200 and 201 are axially spaced-apart outboard of either side of the respective proximal extremities 120 and 120' of rails 110 and 111. Slotted arms 120 and 120', upper pins 230 and 230', lower pins 240 and 240', and handles 280 and 280' are parallel relative to each other and to rails 110 and 111. Handles 280 and 280' extend forwardly from their outer ends 281 and 281' secured to respective lugs 260 and 260' to their respective inner ends 282 and 282' forwardly beyond proximal extremities 120 and 210' of the respective rails 110 and 111, and thus forwardly beyond proximal extremity 120 of shelf 101. Lever arm 290 extends forwardly from its latch 294 ahead of block 210 proximate to upper and lower pins 230 and 240 to its handle 293 to the rear of block 210 between inner and outer ends 282 and 281 of handle 280. Lever arm 290' identically extends forwardly from its latch 294' ahead of block 210' proximate to upper and lower pins 230' and 240' to its handle 293' to the rear of block 210' between inner and outer ends 282' and 281' of handle 280'. Upper pins 230 and 230' and lower pins 240 and 240' and slotted arms 120 and 120' extend rearwardly in the opposite direction from rear surfaces 212 and 212' of the respective blocks 210 and 210'. Threaded shank 190 between rails 110 and 111 extends under conveyor 145 rearwardly from front brace 150 to rear brace 160 from bearing 156 pivotally secured to front brace 150 and barrel nut 166 pivotally secured to rear brace 160, whereby rotation of the drive member, threaded shank 190, in opposite directions imparts corresponding relative movement of front brace 150 and shelf 101 secured thereto in reciprocal directions indicated by double arrow A in FIG. 16 relative to rear brace 160 and its attached fixtures 200 and 201 between rearward and forward positions.

In FIGS. 17 and 19, follower 310, a shoulder bolt as shown, a guide pin, a guide post, or the like, bolted to rail 110 extends outwardly from outermost surface 123A of support section 128 of rail 110 into slot 224 of slotted arm 220 of fixture 200. A follower 311 identical to follower 310 is bolted to rail 111 in FIGS. 16 and 18 and extends outwardly from outermost surface 123A' of support section 128' of rail 111 into slot 224' of slotted arm 220' of fixture 201. Follower 310 is free to travel in slot 224 between inner and outer end walls 225 and 226, and follower 311 is identically free to travel in slot 224' between inner and outer end walls 225' and 226'. Inner end walls 225 and 225' and outer end walls 226 and 226' of the respective slots 224 limit the reciprocal travel of followers 310 and 311, the respective rails 110 and 111 to which followers 310 and 311 are attached, and thus front brace 150 and its attached shelf 101. At the same time as shown in FIG. 22, bearing 175 is under and is in direct rolling contact against running surface 136 of recess 135 between proximal and distal end walls 137 and 138 and supports overlying rail 110, bearing 185 is concurrently under and is in direct rolling contact against running surface 136' of recess 135' between proximal and distal end walls 137' and 138' and supports overlying rail 111, finger 315 of fixture 200 in FIG. 17 extends inwardly from block 210 into slot 130 over running surface 131, and an identical finger 316 of fixture 201 extends inwardly from block 210' into slot 130 over running surface 131. Finger 315 is secured to front surface 211 of block 210 by screws, bolts, or welding, and finger 316 is secured to front surface 211' of block 210' by screws, bolts, or welding.

Figure 23:
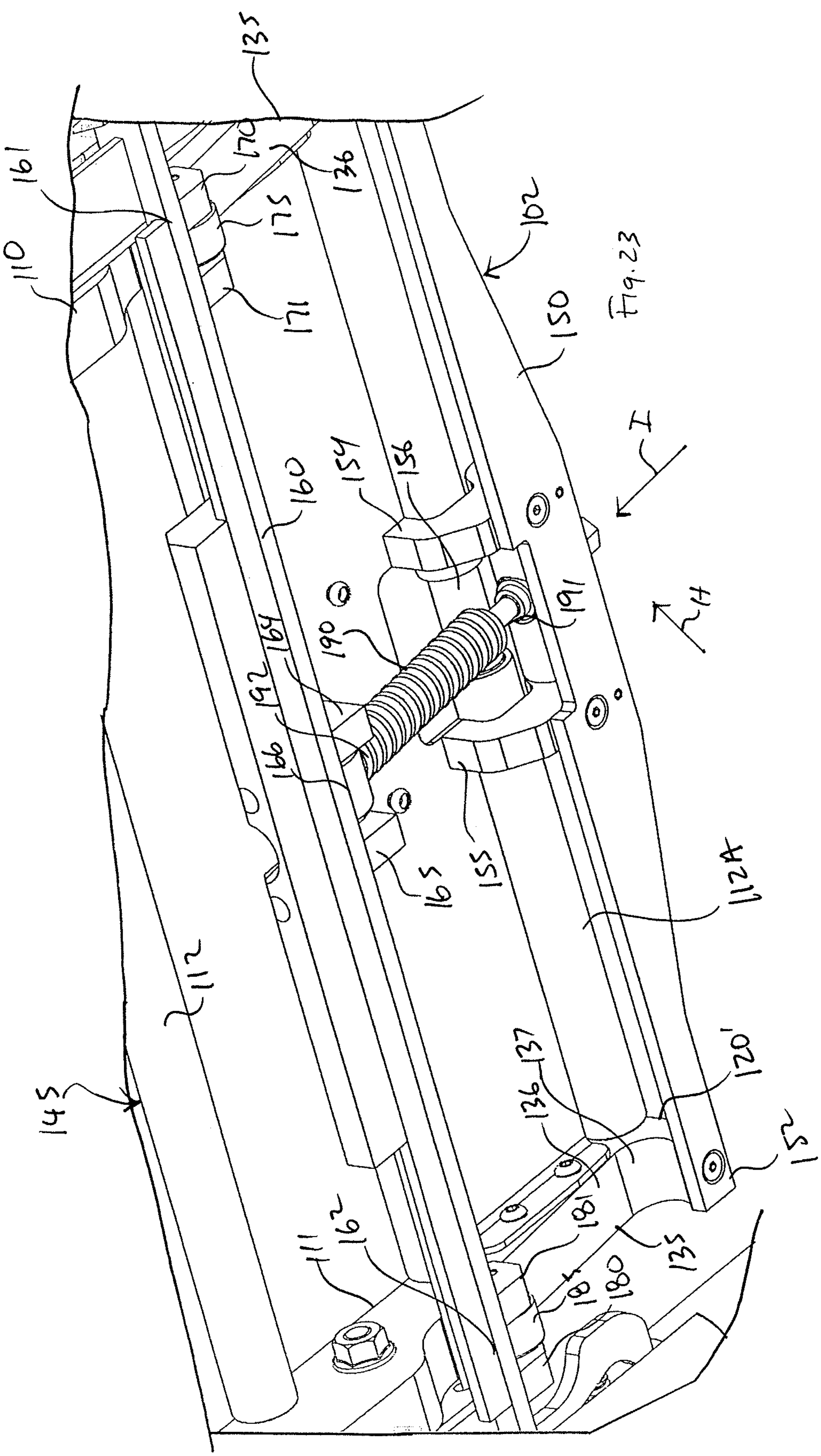

Followers 310 and 311 applied to slots 224 and 224', bearing 175 and finger 315 on either side of support section 128 of rail 110, bearing 175 under and contacting running surface 136 of recess 135 supporting rail 110 thereatop and opposed finger 315 over running surface 131 of recess 130, and bearing 185 under and contacting running surface 136' of recess 135' supporting rail 110 thereatop and opposed finger 315 over running surface 131' of recess 130', cooperate to mount and constrain shelf 101 to front rear brace 160 reciprocally enabling shelf 101 to reciprocate relative to front rear brace 160 and its attached fixtures 200 and 201 in the directions of arrow A in FIG. 16 between a rearward position of rails 110 and 111 and thus shelf 101 in FIGS. 16-18 and a forward position of rails 110 and 111 and thus shelf 101 in FIGS. 22 and 23. Since rails 110 and 111 are parts of shelf 101, reciprocal movement of rails 110 and 111 corresponds to the reciprocal movement of shelf 101. Inner end walls 225 and 225' and outer end walls 226 and 226' of the respective slots 224 limit the reciprocal travel of followers 310 and 311, and lower inclined running surfaces 136 and 136' limit the reciprocal travel of bearings 175 and 185 thereagainst the respective proximal end walls 137 and 137' and the respective distal end walls 138 and 138, to thereby limit the reciprocal travel of rails 110 and 111, and thus shelf 101, relative to rear brace 160 and its attached fixtures 200 and 201. Longitudinal reciprocal movement of shelf 101 in opposite directions imparts rotation to bearings 175 and 185 with little rolling resistance against the overlying running surfaces 136 and 136'. Pivotally-attached bearing 156 and barrel nut 166 are free to pivotally displace as needed in response to rotation of threaded shank 190 and the corresponding reciprocal movement of front brace 150 and its attached shelf 201.

Slots 224 and 224' of slotted arms 120 and 120', running surfaces 131 and 136 of rail 110, and running surfaces 131' and 136' of rail 110 concurrently incline downwardly relative to the respective proximal extremities 120 and 120' along the same incline plane P denoted in FIG. 16. Followers 310 and 311 follow respective slots 224 and 224' inclined along incline P, bearings 175 and 185 follow respective running surfaces 136 and 136' inclined along incline plane P, and fingers 315 and 316 follow respective running surfaces 131 and 131' inclined along plane P, which guide proximal extremities 110 and 111' of rails 110 and 111 to follow plane P and concurrently move upwardly relative to rear brace 160 in the direction of arrow F in FIG. 16 from lowered positions to raised positions in response to concurrent movement of rails 110 and 111 relative to rear brace 160 in the forward direction of arrow G in FIG. 16 from their rearward positions to their forward positions, and to concurrently move relative to rear brace 160 from their raised positions back to their lowered positions in the direction of arrow H in FIG. 16 in response to concurrent movement of rails 110 and 111 relative to rear brace 160 from their rearward positions to their forward positions in the rearward direction of arrow I in FIG. 16. In the assembly of shelf 101 and front support assembly 102, the proximal extremity 120A of shelf 101 defined by proximal extremities 120 and 120' of the respective rails 110 and 111 thusly follows plane P and moves relative to rear brace 160 upwardly in the direction of arrow F in FIG. 16 from a lowered position, corresponding to the lowered positions of rails 110 and 111, to a raised position, corresponding to the raised positions of rails 110 and 111, in response to movement of shelf 101 relative to rear brace 160 in the forward direction of arrow G in FIG. 16 from the rearward position of shelf 101, corresponding to the rearward positions of rails 110 and 111, to the forward position of shelf 101, corresponding to the forward positions of rails 110 and 111, and moves relative to rear brace 160 downwardly from its raised position, corresponding to the raised positions of rails 110 and 111, back to its lowered position, corresponding to the lowered positions of rails 110 and 111, in the direction of arrow H in FIG. 16 in response to movement of shelf 101 relative to rear brace 160 from its rearward position, corresponding to the rearward positions of rails 110 and 111, to its forward position, corresponding to the forward positions of rails 110 and 111, in the rearward direction of arrow I in FIG. 16.

Figure 20:
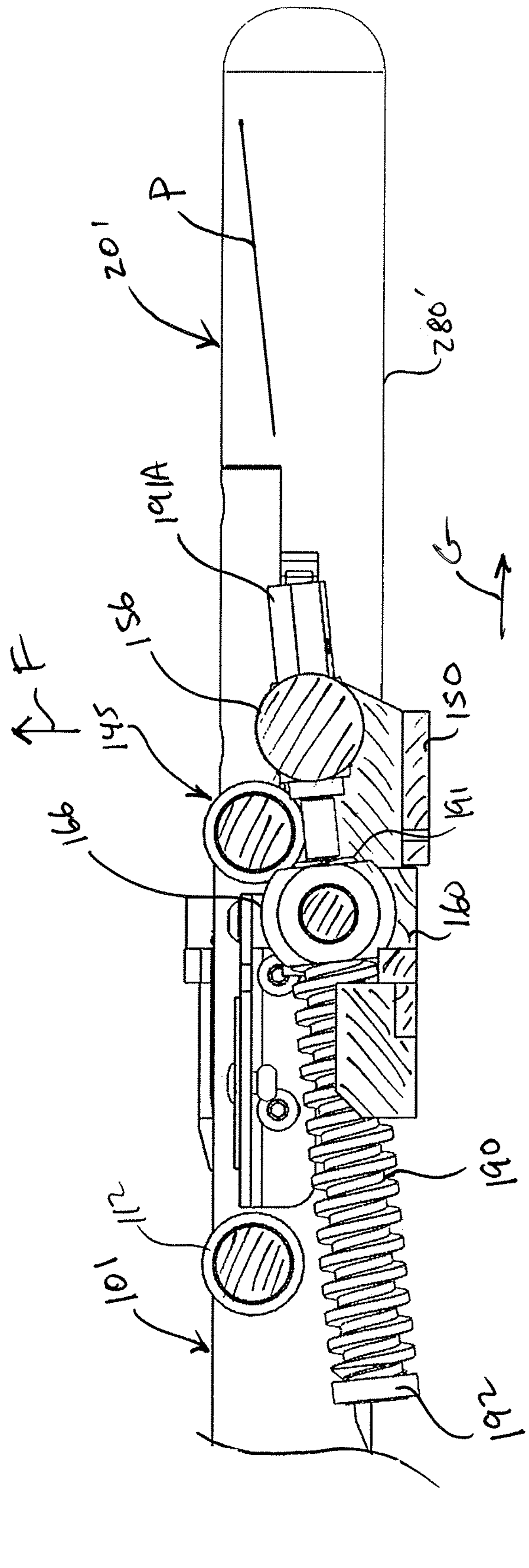
FIG. 20 is a section view taken alone line 20-20 of FIG. 17 illustrating the drive member first referenced in FIG. 1 adjusted to the lowering position corresponding to the lowered position of the shelf relative to the front support assembly.
Figure 21:
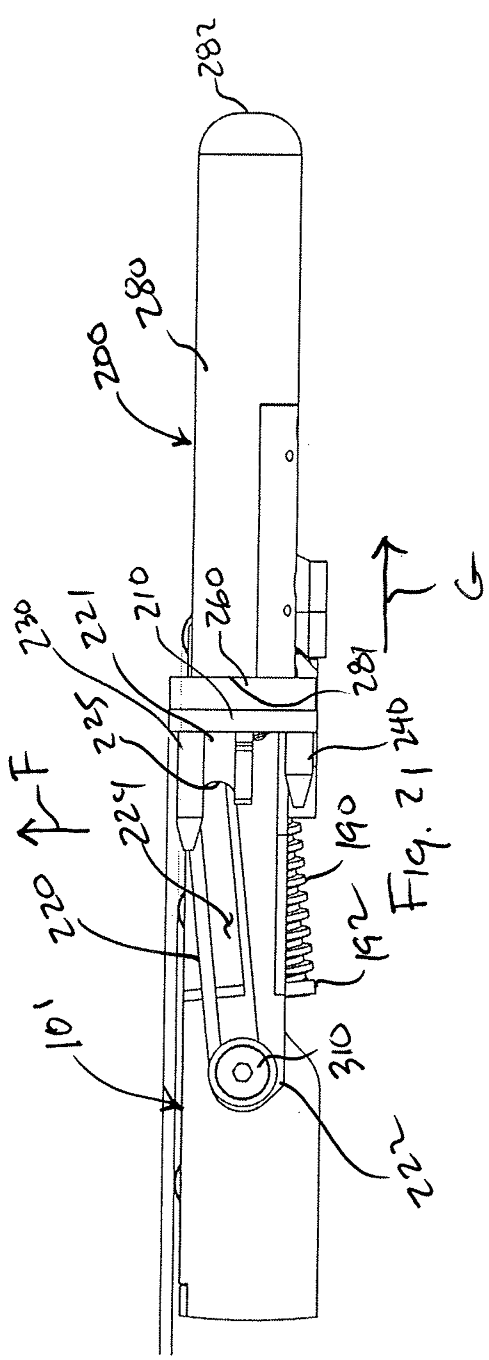
FIG. 21 is a fragmentary side elevation view corresponding to FIG. 17 illustrating the drive member of FIG. 20 adjusted to the lowering position corresponding to the lowered position of the shelf relative to the front support assembly.
Figure 24:
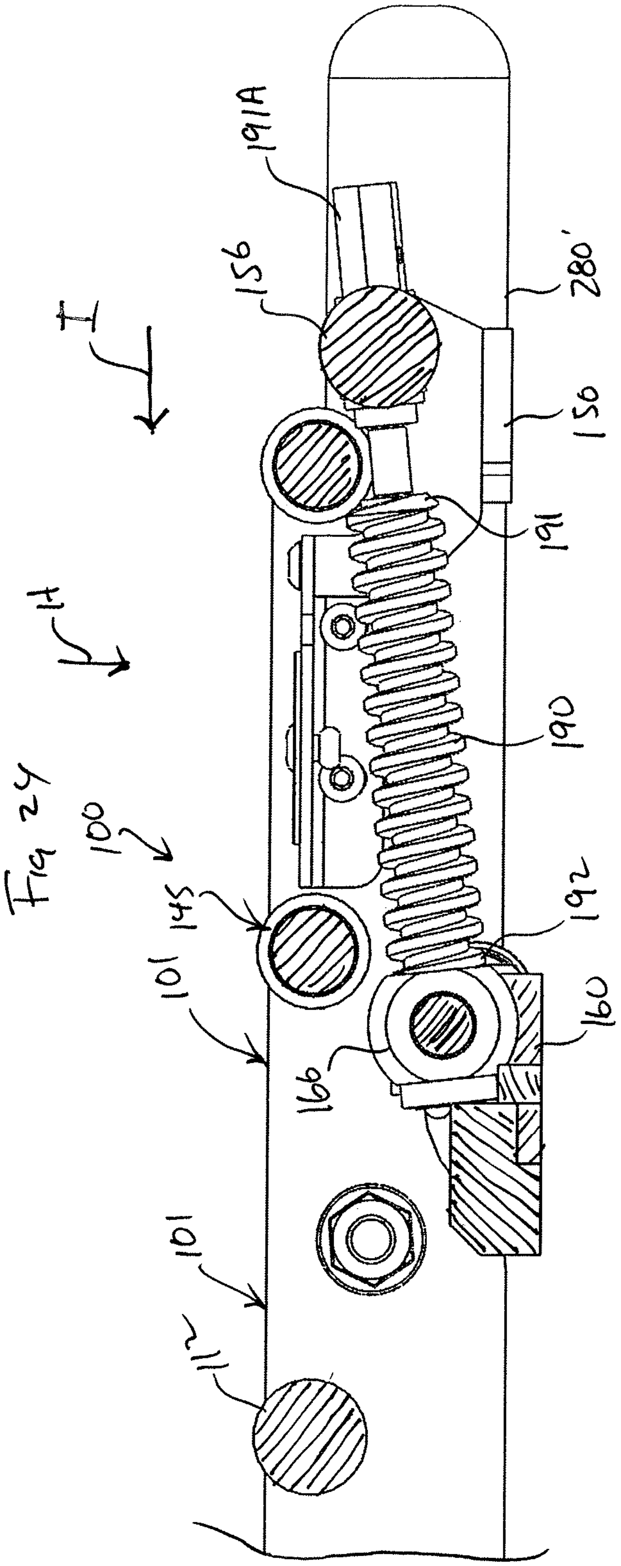
FIG. 24 is a view similar to that of FIG. 20 illustrating the drive member adjusted to the raising position corresponding to the raised position of the shelf relative to the front support assembly.
Figure 25:
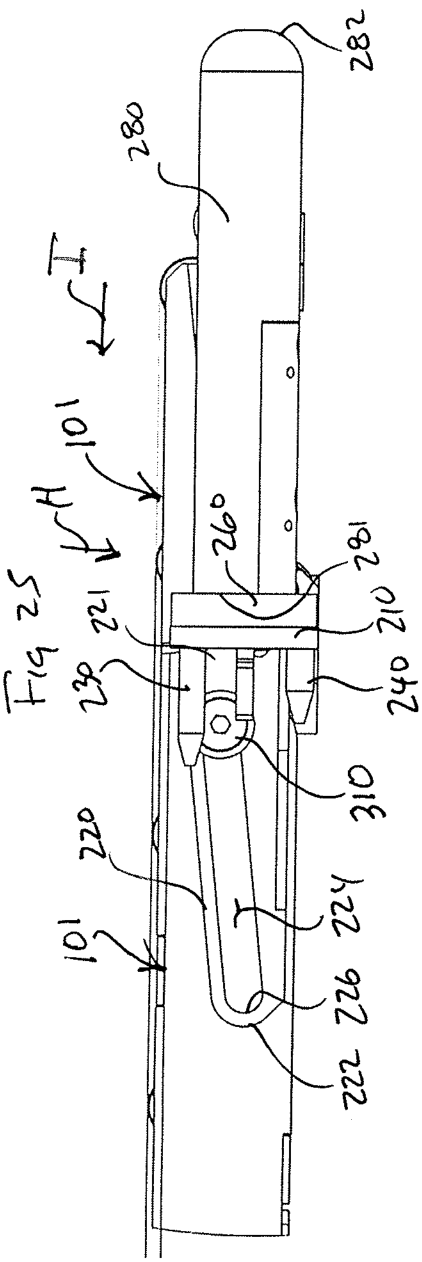
FIG. 25 is a view similar to that of FIG. 21 illustrating the drive member of FIG. 20 adjusted to the raising position in FIG. 24 corresponding to the raised position of the shelf relative to the front support assembly.

Again, and in reference to FIGS. 20 and 24, threaded shank 190 is the drive member operatively coupled between front brace 150 attached to shelf 101 and rear brace 160 to which shelf 101 is reciprocated to via bearing 156 pivotally secured to front brace 150 and barrel nut 166 pivotally secured to rear brace 160, whereby rotation of the drive member, threaded shank 190, in opposite directions imparts corresponding relative movement of front brace 150 and shelf 101 secured thereto in reciprocal directions indicated by double arrow A in FIG. 16 relative to rear brace 160 between the rearward position of shelf 101 and the lowered position of proximal extremity 120A of shelf 101, and the forward position of shelf 101 and the raised position of proximal extremity 120A shelf 101, shown in FIGS. 20 and 21 in relation to fixture 201 of rear brace 160. Threaded shank 190 extends rearwardly from its inner end rotated to bearing 156 and threadably through barrel nut 166 to its outer end 192. In the assembly of shelf 101 and front support assembly 102 the proximal extremity of shelf 101, threaded shank 190 follows plane P.

Since front brace 150 is affixed to shelf 101, it can be considered part of shelf 101 relative to the remaining structure of front support assembly 102 consisting of rear brace 160 and its attached fixtures 200 and 201 operatively connected to shelf 101 via front brace 150 and threaded shank 190. Again, threaded shank 190 is a drive member operatively coupled between front and rear braces 150 and 160 via bearing 156 pivotally secured to front brace 150 and barrel nut 166 pivotally secured to rear brace 160, whereby rotation of the drive member, threaded shank 190, imparts corresponding relative movement of front brace 150 in reciprocal directions of arrow A relative to rear brace 160, i.e., toward and away from rear brace 160. The drive member, the described threaded shank 190, being operatively coupled between front and rear braces 150 and 160, is thereby operatively coupled between rail 110 and fixture 200, whereby rotation of the drive member imparts corresponding movement of rail 110 between the lowered position and the raised position relative to fixture 200.

FIGS. 20 and 21 show proximal extremity 120A of shelf 101 in its lowered position and shelf 101 in its corresponding rearward position relative to rear brace 160, in which barrel nut 166 in FIG. 20 is located near bearing 156 proximate to inner end 191 of threaded shank 190, and front brace 150 affixed to the proximal extremity of shelf 101 is brought together in contact against rear brace 160 to the rear of front brace 150. Contact of front brace 150 against rear brace 160 to the rear of front brace 150 and contact of followers 310 and 311 against outer end walls 226 and 226' of slots 224 and 224' of the respective slotted arms 120 and 120' disable rails 110 and 111, and thus shelf 101, from moving rearwardly beyond the lowered position, rearward positions. From this position, rotation of threaded shank 190 in a one direction threadably pushes threaded shank 190 through barrel nut 166 forwardly in the direction corresponding to arrow G thereby driving front brace 150 and its attached shelf 101 forwardly in the direction of arrow G and at the same time proximal extremity 120A of shelf 101 and thus proximal extremities 120 and 120' of rails 110 and 111 upwardly along incline P in the direction of arrow F from the rearward, lowered positions in FIG. 20 to the forward, raised positions in FIG. 24.

FIGS. 22-24 show proximal extremity 120A of shelf 101 in its raised, forward position relative to rear brace 160, in which barrel nut 166 is located at outer end 192, threaded shank 190 extends between barrel nut 166 proximate to outer end 192 to its inner end 191 rotated to bearing 156 spaced to the front along with front brace 150 and shelf affixed thereto. Contact of followers 310 and 311 against inner end walls 225 and 225' of slots 224 and 224' of the respective slotted arms 120 and 120' disable rails 110 and 111, and thus shelf 101, from moving forwardly beyond the raised, forward positions. From this position, rotation of threaded shank 190 in an opposite direction threadably pulls threaded shank 190 through barrel nut 166 rearwardly in the direction corresponding to arrow I thereby driving front brace 150 and shelf 101 attached thereto rearwardly in the direction of arrow I and at the same time proximal extremity 120A of shelf 101 and thus proximal extremities 120 and 120' of rails 110 and 111 downwardly along incline P in the direction of arrow H from the raised, forward positions back the lowered, rearward positions.

§ III. THE REAR SUPPORT ASSEMBLY AND THE SHELF FORMED THEREWITH

Figure 26:
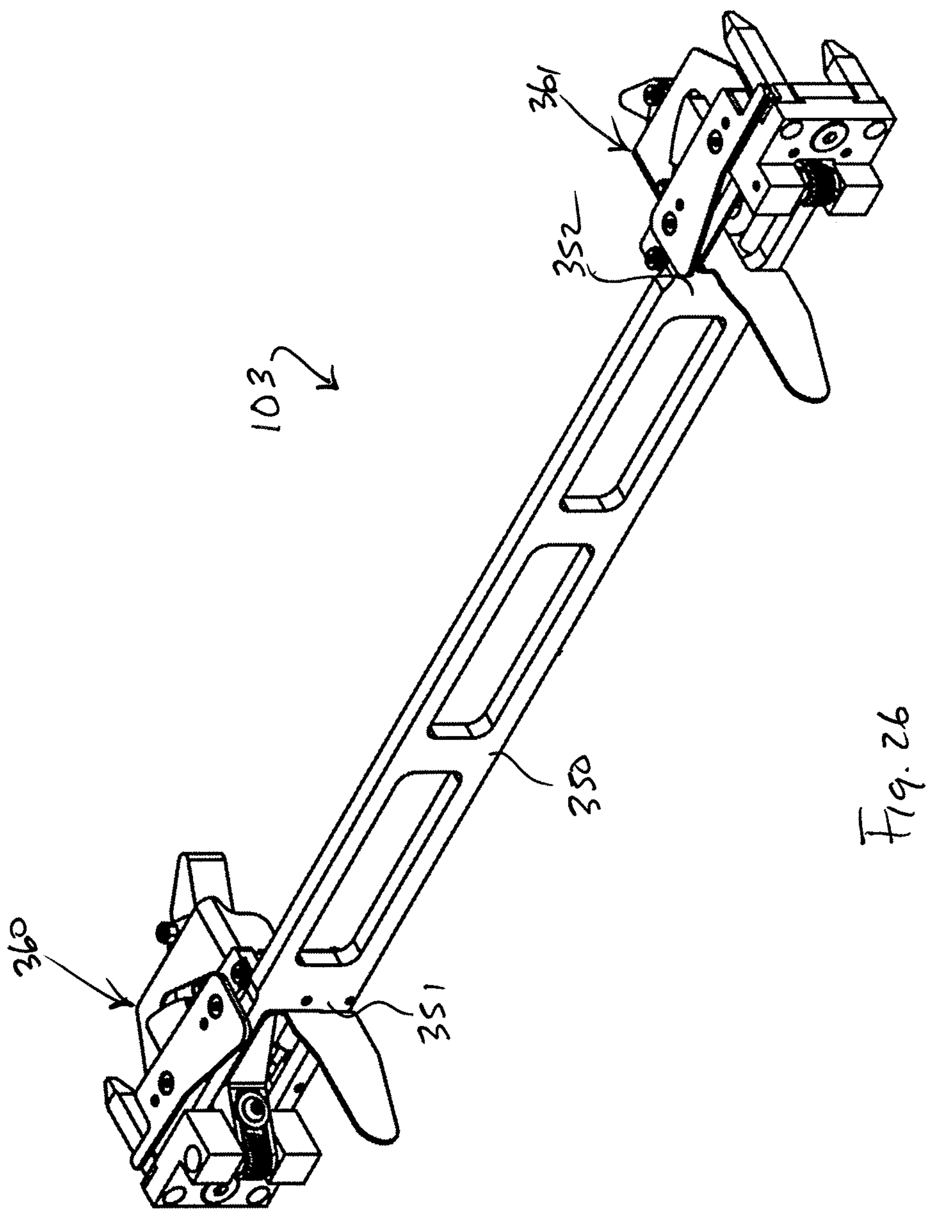
FIG. 26 is a perspective view of the rear support assembly of FIG. 1.
Figure 27:
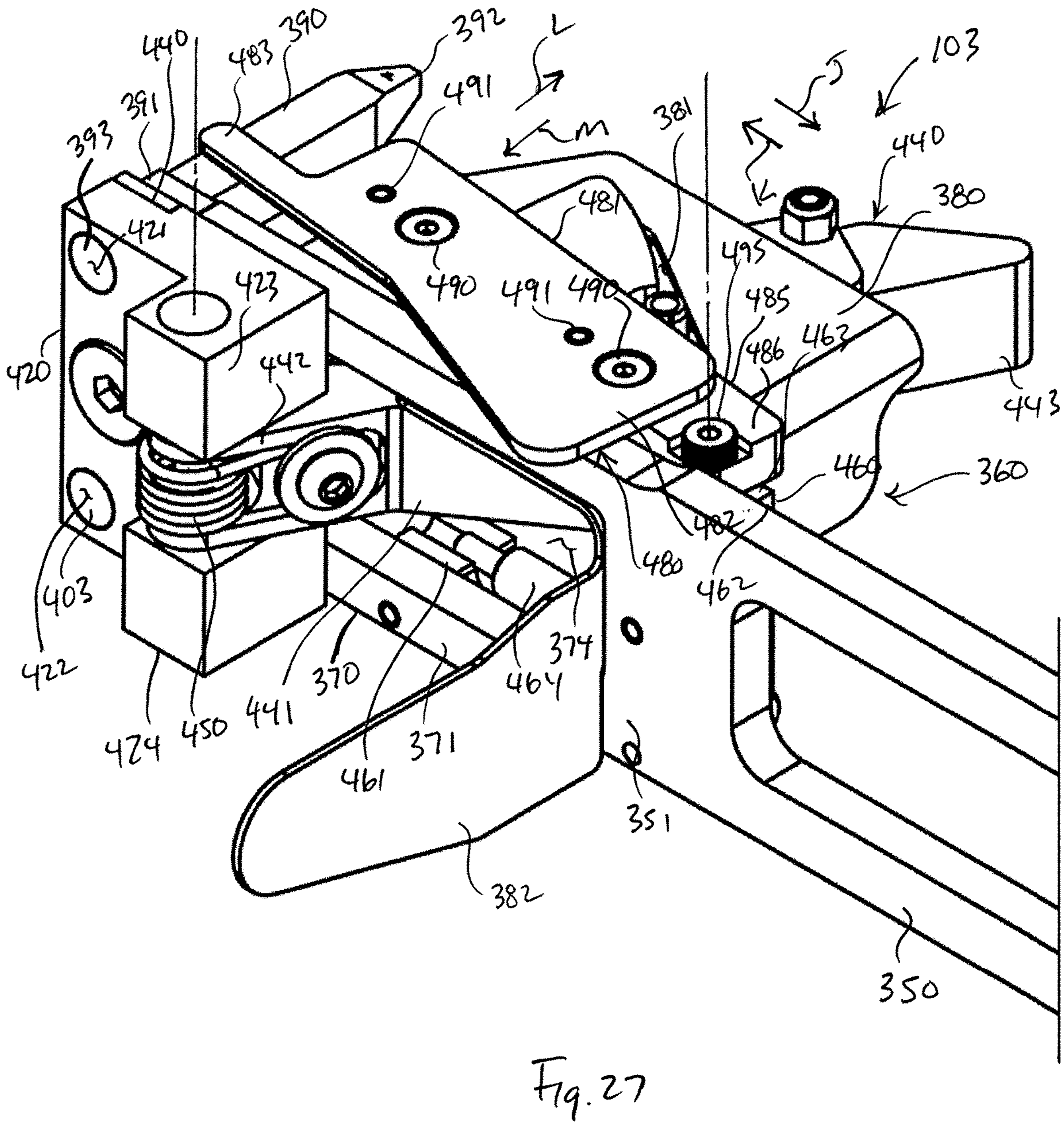
FIG. 27 is an enlarged, fragmentary perspective view corresponding to FIG. 26 illustrating a slide of the rear support assembly.

Referring to FIG. 26, rear support assembly 103 is fashioned of steel, aluminum or other metal or metal composite having inherently rugged, impact resistant, strong, and rigid material characteristics, and is a structural element capable of withstanding loads primarily by resisting bending. Rear support assembly 103 is self-adjustable and self-installable handsfree, i.e., without the use of hands or separate tools, and includes brace 350, and slides 360 and 361. Slide 360 is configured to be mounted on rail 110 to form a rail assembly, and slide 360 is configured to be mounted on rail 111 to form an identical rail assembly. The assembly of rail 110, fixture 200, and slide 360 also forms an exemplary rail assembly, and the assembly of rail 111, fixture 201, and slide 361 forms an identical and exemplary embodiment of a rail assembly. These rail assemblies are on either side of shelf 101, are identical, and support conveyor 145.

Brace 350 is elongate and includes opposed ends 351 and 352. Ends 351 and 352 support slides 360 and 361. Slides 360 and 361 carried by brace 350 are axially spaced apart and are the mirror image of one another and are identical in every respect. Accordingly, the following description of slide 360 applies in every respect to slide 361. Slides 360 and 361 are given the same reference characters. The reference numerals of slide 361 include prime ("'") symbols for ease of reference.

Referring in relevant part to FIGS. 27-30, slide includes block 370, onto which various components of slide 360 are mounted. Block 370 follows brace 350, is an extension of end 351, is integral with end 351, and extends outwardly from end 351 and arm 380. Block 370 includes front surface 371, a forwardly-facing surface facing forwardly, rear surface 372, a rearwardly-facing surface facing rearwardly in the opposite direction, opening 374, and shield 380. Opening 374 extends through block 370 from front surface 371 to rear surface 372. Shield 380 is formed with elongate slot 381 and extends rearwardly from front surface 371 of block 370 above opening 374. An arm 382, an extension of shield 380, extends forwardly through opening 374 at an inner side thereof and forwardly beyond opening 374 away from front surface 371.

Slide 360 supports upper and lower pins 390 and 400. Upper and lower pins 390 and 400 together form a detent structure of slide 360 and are outboard of opening 374, and are parallel relative to each other and to arm 382. Upper pin 390 is elongate and straight and includes a butt end 391, extends rearwardly from butt end 391 to pointed outer end 392, and includes extension 393 extending forwardly from butt end 391. In this example, upper pin 390 is square in cross section from pointed outer end 392 to and including butt end 391 to enable it to be received by a standard square hole of a standard post of a standard rack, and extension 393 is circular in cross section. Lower pin 400 is elongate and straight and includes a butt end 401, extends rearwardly from butt end 401 to pointed outer end 402, and includes extension 403 extending forwardly from butt end 401. In this example, lower pin 400 is square in cross section from pointed outer end 402 to and including butt end 401 to enable it to be received by a standard square hole of a standard post of a standard rack, and extension 403 is circular in cross section. Upper and lower pins 390 and 400 are identical in every respect, with the exception the length of upper pin 390 from butt end 391 to pointed outer end 392 is longer than the length of lower pin 400 from butt end 401 to pointed outer end 402. Upper pin 390 is identical to the previously-described upper pin 230, and lower pin 400 is identical to the previously-described lower pin 240.

Block 370 carries upper and lower pins 390 and 400 outboard of opening 374. Block 370 is formed with opposed, vertically-aligned upper and lower notches 410 and 411 formed on the outer side of opening 374. Upper notch 410 accepts butt end 391 of upper pin 390, and lower notch 411 accepts butt end 401 of lower pin 400. The square cross section shape of butt ends 391 and 401 and a corresponding shape of upper and lower notches 410 and 411 disable upper and lower pins 390 and 400 from rotating about their longitudinal axes relative to block 370 and which are parallel relative to each other and to arm 381. Upper pin 390 extends rearward horizontally from rear surface 372 of block 370 from butt end 391 in upper notch 410 to pointed outer end 392, and extension 393 extends forwardly in the opposite direction from front surface 371. Lower pin 400 extends rearward horizontally from rear surface 372 of block 371 from butt end 401 in lower notch 251 to pointed outer end 402, and extension 403 extends forwardly in the opposite direction from front surface 371. In addition to being parallel relative to one another, upper and lower pins 390 and 400 are axially-aligned vertically.

Extensions 393 and 403 key into corresponding upper and lower holes 421 and 422 of bracket 420 secured to front surface 371 of block 370 along the outer side of opening 374 by attachment pins 425 secured in corresponding holes 426 and 427 of block 370 and bracket 420, respectively, thereby securing upper and lower pins 390 and 400 in place. Bracket 420 is additionally secured to front surface 371 of block 371 by screw 430 that extends into countersunk hole 431 of bracket 420 and that threadably secures an appropriate threaded hole 432 in block 370. Screw 430 is tightened to secure bracket 420 to block 370 at the outer side of opening 374. Bracket 420 includes upper and lower, vertically-aligned, and forwardly-extending lugs 423 and 424.

Slide 360 is adjustable between a rail-locking position and a post-locking position by lock 440, which is configured to move between a rail-locking position defining a rail-locking position of slide 360 and a post-locking position defining a post-locking position of slide 360. Lock 440 is adjustable between a locked position and an unlocked position by switch 480 configured to move between a closed position defining the locked position of slide 360 and an open position defining the unlocked position of slide 360.

Lock 440 is a lever arm 441 including fixed end 442, free end 443, and inwardly-directed cam follower 444 and opposed outwardly-directed abutment 446 between fixed end 442 and free end 443. Fixed end 442 is bifurcated to accept torsion spring 450. Fixed end 442 is positioned between lugs 423 and 424, and is pivotally secured to lugs 423 and 424 by pin 451. Torsion spring 450 encircles pivot pin 451 between lugs 423 and 444, where it is captured and configured to act directly against bracket 420 and fixed end 442 to exert a constant bias against fixed end 442 to thereby constantly tension lever arm 441. Lever arm 441 extends rearwardly from fixed end 442 through opening 374 and rearwardly beyond rear surface 273 under shield 380 to follower 444 and abutment 446 and rearwardly beyond follower 444 and abutment 446 to free end 443. Pin 445 secured to follower 444 between fixed end 442 and free end 443 extends vertically upright through slot 381. Lever arm 441 pivots at fixed end 442 about pivot pin 451 in opening 374 between a rail-locking position in FIGS. 27 and 29 in the direction of arrow J and a post-locking position in FIG. 30 in the direction of arrow K. Pin 445 follows slot 381 as lever arm 441 pivots between its rail-locking position and its post-locking position. Follower 444 assumes a rail-locking position and abutment 446 assumes a post-releasing position when lever arm 441 is pivoted to the rail-locking position in the direction of arrow J. Follower 444 assumes a rail-releasing position and abutment 446 assumes a post-locking position when lever arm 441 is pivoted to the post-locking position in the direction of arrow K from the post-locking position of lever arm 441. The rail-locking position of lever arm 441 defines the rail-locking position of lock 440. The post-locking position of lever arm 441 defines the post-locking position of lock 440. At least one spring, torsion spring 450 in this example, constantly tensions lever arm 441 of lock 440, i.e. exerts a constant bias against lever arm 441 of lock 440, constantly biasing/urging lever arm 441 of lock 440 to the rail-locking position. In other words, lever arm 441, and thus lock 440, is constantly tensioned to its rail-locking position by torsion spring 450. Since lever arm 441 of lock 440 is constantly tensioned to its rail-locking position by torsion spring 450, follower 444 and abutment 446 are each constantly tensioned to the closed position of lock 440.

Block 370 additionally carries bracket 460, which is secured to rear surface 372 by screws or welding. Bracket 460 includes a horizontal bed 461 under opening 374 and elongate support 462 extending vertically upright from bed 461 to upper end 463 along the inner side of opening 374. A bearing 464, preferably of the cylinder-roller type supported by axle 465, is carried by bed 461 proximate to opening 374.

Switch 480 is configured to move from a closed position for securing lever arm 441 of lock 440 in the rail-locking position thereby disabling lever arm 441 of lock 440 from pivoting from its rail-locking position to its post-locking position, to an open position for releasing lever arm 441 of lock 440 from the rail-locking position thereby enabling lever arm 441 to pivot at fixed end 442 through opening 374 from its rail-locking position to its post-locking position and back to its rail-locking position. Switch 480 includes an elongate upper member 481 including inner end 482 and outer end 483, and lower member 485 including fixed end 486, free end 487, and notch 488 therebetween. Upper member 481 is secured directly atop lower member 485 with screws 490 and attachment pins 491. Upper member 481 extends over and across lower member 485 from inner end 482 proximal to fixed 486 to free end 487 of lower member 485 and beyond free end 487 to outer end 483. Notch 488 is an engagement element and is positioned to the rear of upper member 481.

Switch 480 is positioned lower member 485 down atop shield 380. Lower member 485 extends outwardly over shield 380 from fixed end 486 pivotally secured to upper end 463 of support 460 of block 370 by pivot screw 495, to free end 487 toward upper pin 390. Upper member 481 secured atop lower member 485 extends outwardly toward upper pin 390 concurrently with lower member 485 from inner end 482 proximate to fixed end 486 over lower member 485 to free end 487 and beyond free end 487 of lower member 485 to outer end 483 of upper member 481 located over upper pin 390 between outer end 392 of upper pin 390 and butt end 391 of upper pin 390.

Switch 480, the assembly of upper and lower members 481 and 485, pivots at fixed end 486 about pivot screw 495 between a closed position in the rearward direction of arrow L and an open position in the forward direction of arrow M. Switch 480 is configured to pivot between its closed and open positions when lever arm 441 is pivoted to its rail-locking position in FIGS. 27 and 29. Switch 480 is returned to its closed position in FIG. 29 from its open position in FIG. 30 by compression spring 500 captured between lower member 485 and rear surface 372 of block 370 urging/biasing switch 480 to assume its closed position in FIG. 29 after release from its open position in FIG. 30. Spring 500 constantly tensions switch 480, i.e. exerts a constant bias against switch 480, constantly urging/biasing it to its closed position. In other words, switch 480 is constantly tensioned to its closed position by spring 500.

Figure 29:
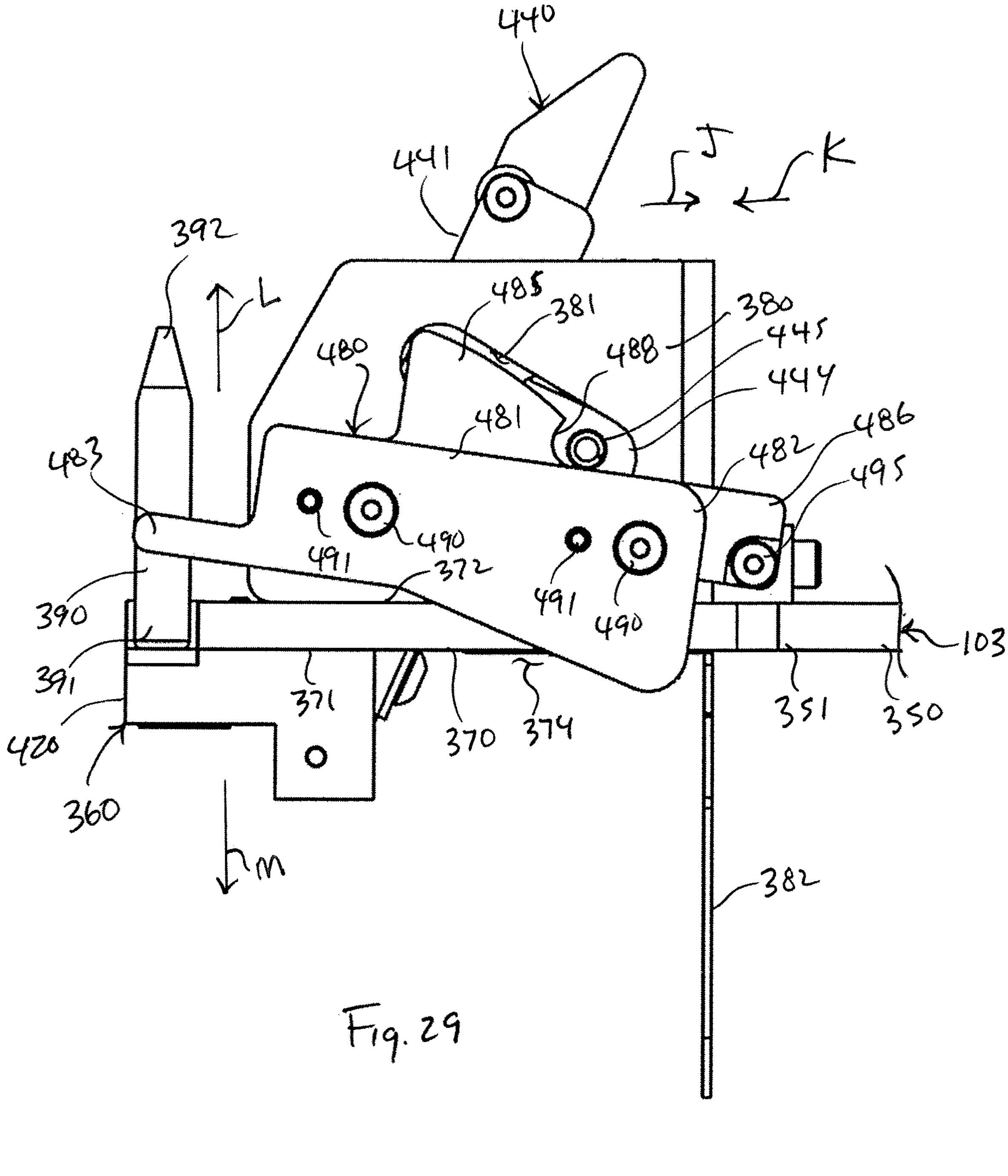
FIG. 29 is a top plan view corresponding to FIG. 27 illustrating the slide as it would appear in a rail-locking position.
Figure 30:
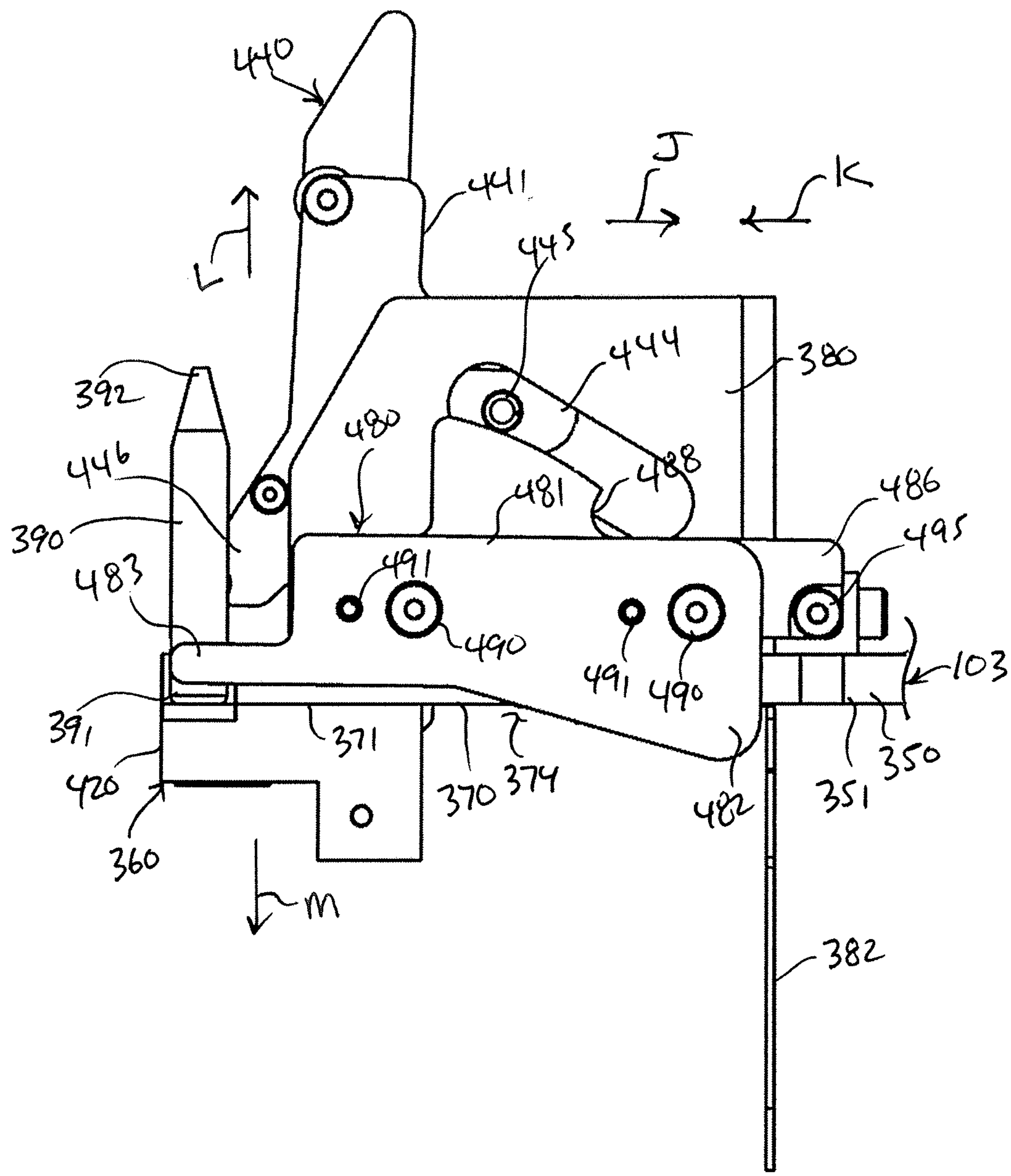
FIG. 30 is a view corresponding to FIG. 30 illustrating the slide as it would appear in a post-locking position.
Figure 31:
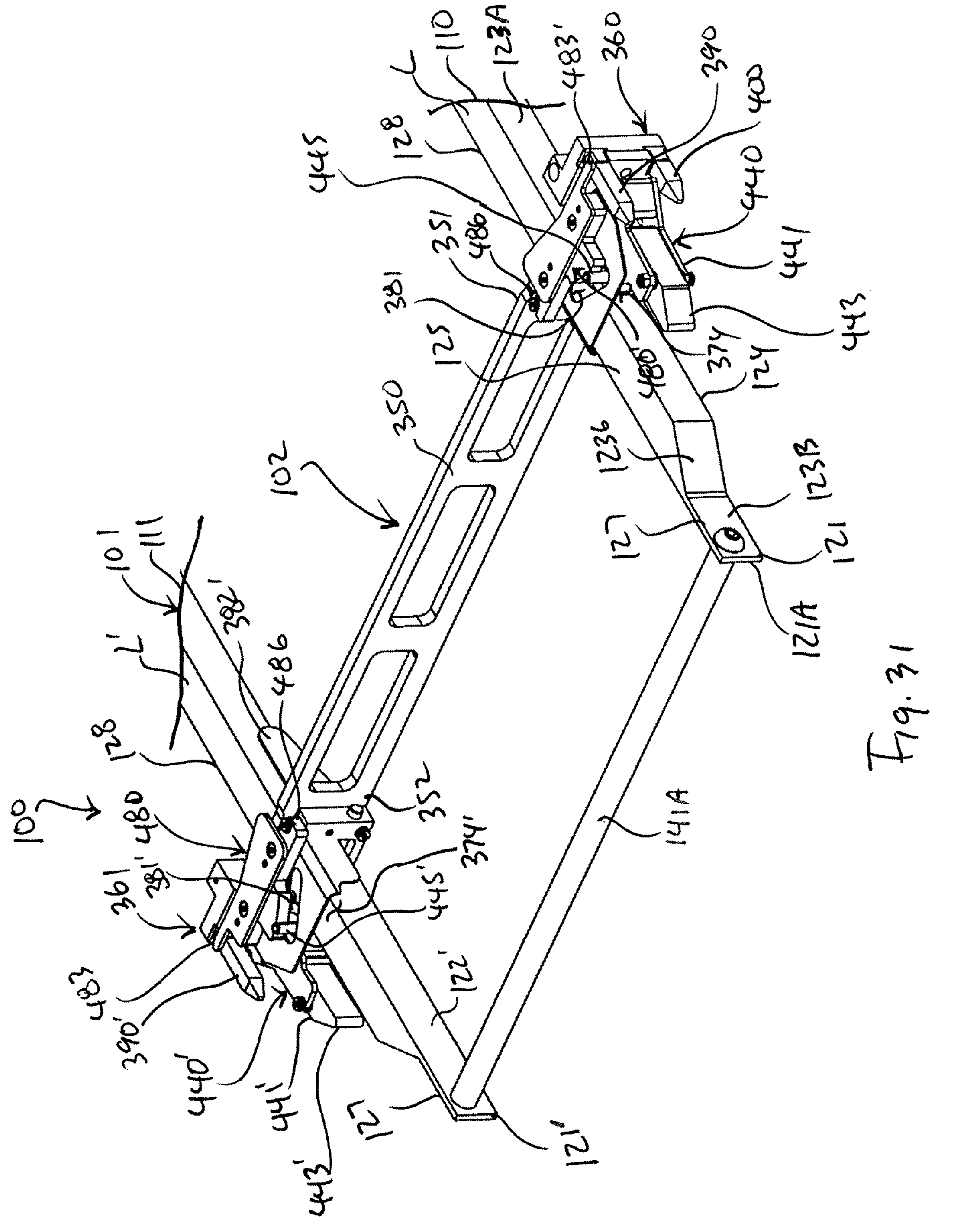
FIGS. 31 and 32 are enlarged, fragmentary, top perspective views of the embodiment of FIG. 1 illustrating the front support assembly mounted to the shelf.
Figure 32:
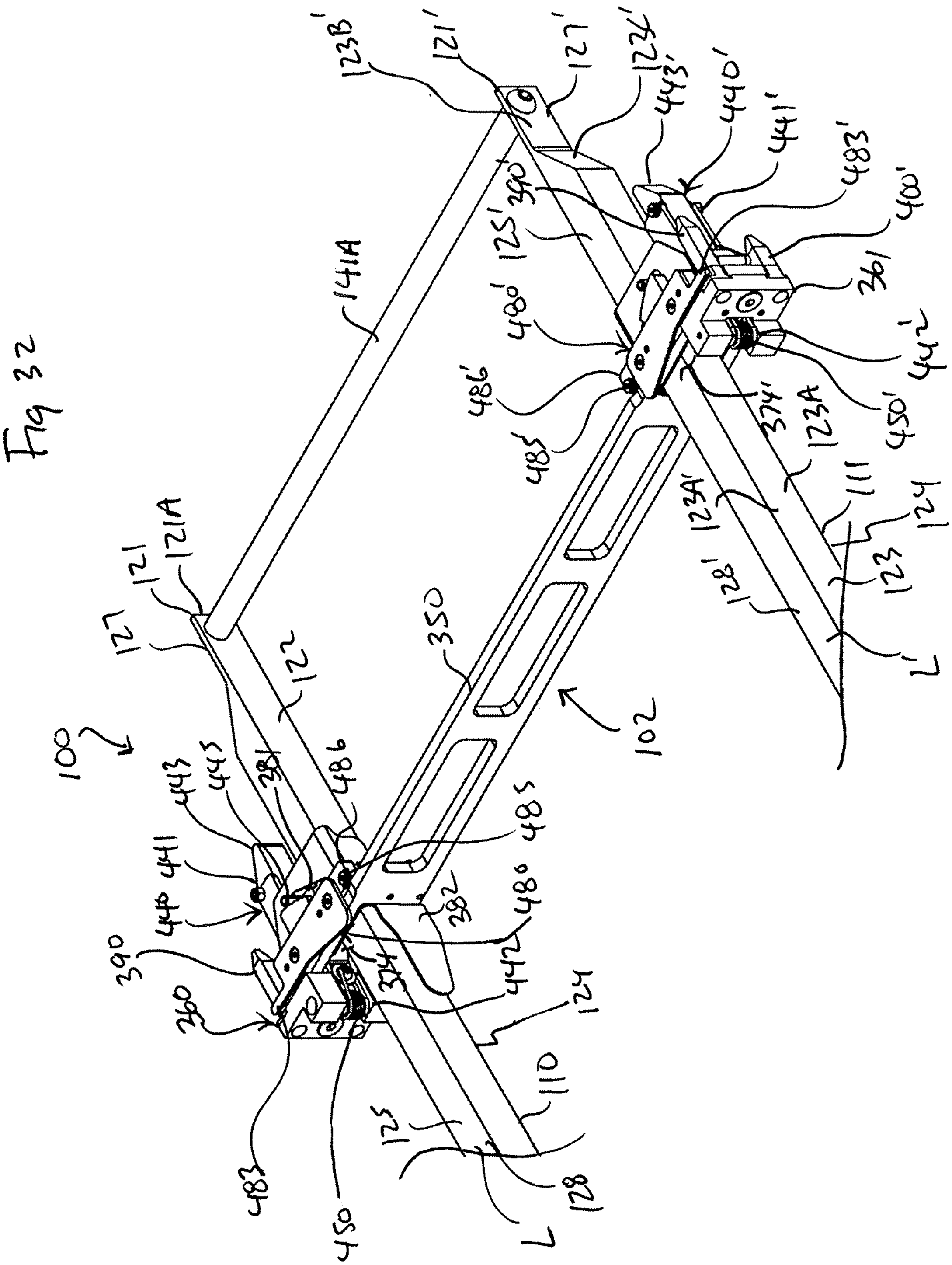
Figure 33:
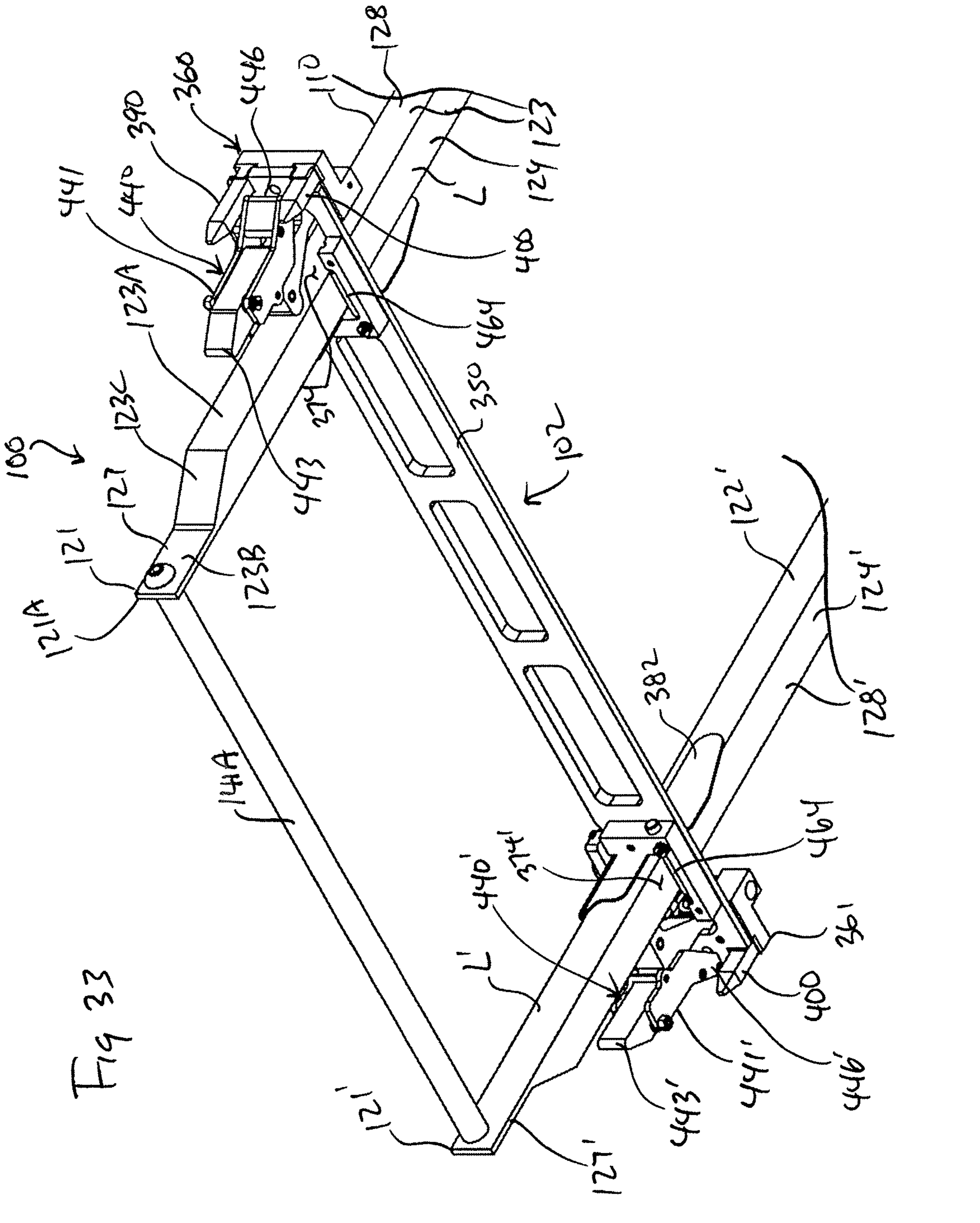
FIGS. 33 and 34 are enlarged, fragmentary, bottom perspective views corresponding to FIGS. 31 and 32, respectively.
Figure 34:
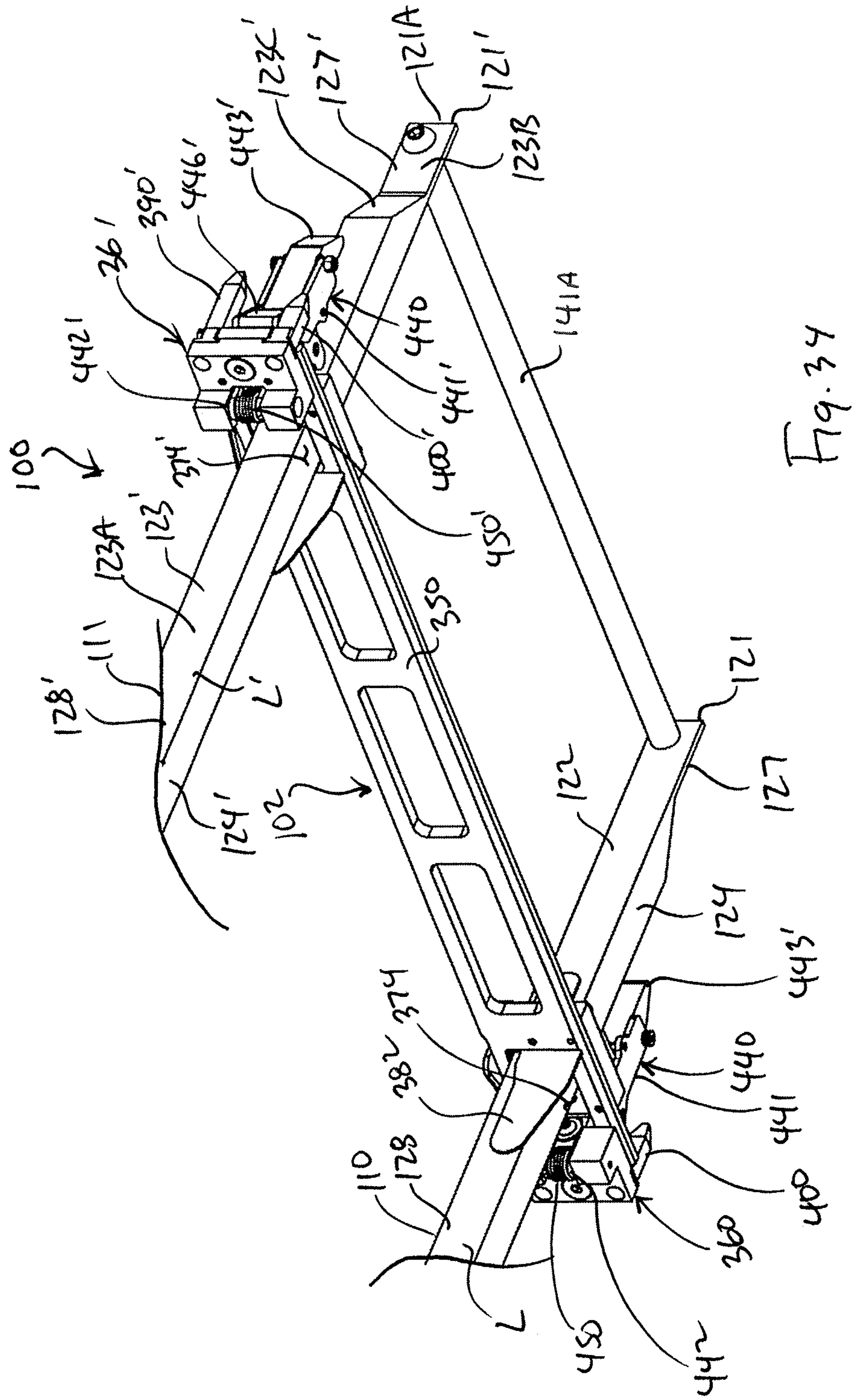
Figure 35:
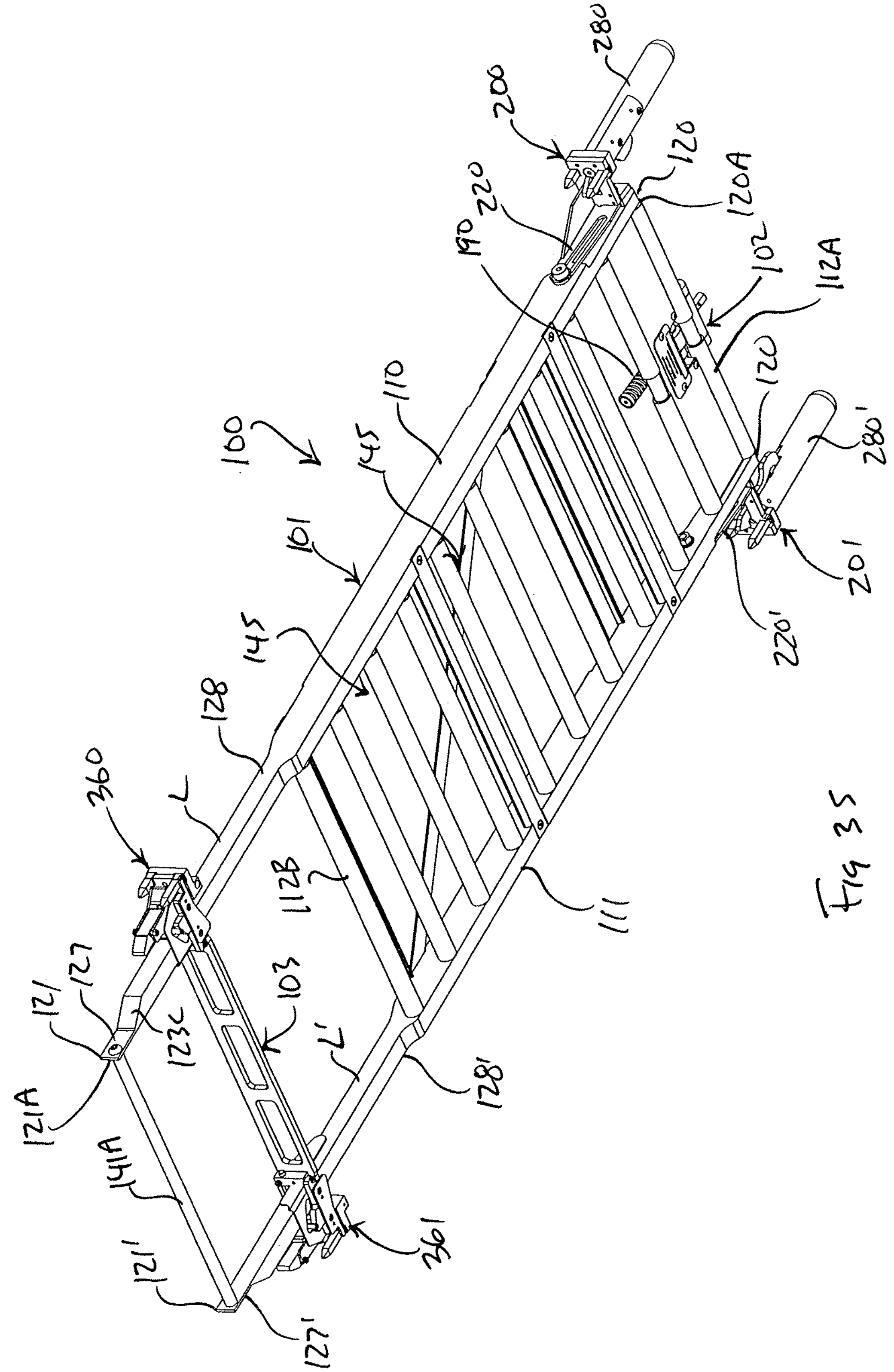
FIG. 35 is a bottom perspective of the embodiment of FIG. 1.
Figure 36:
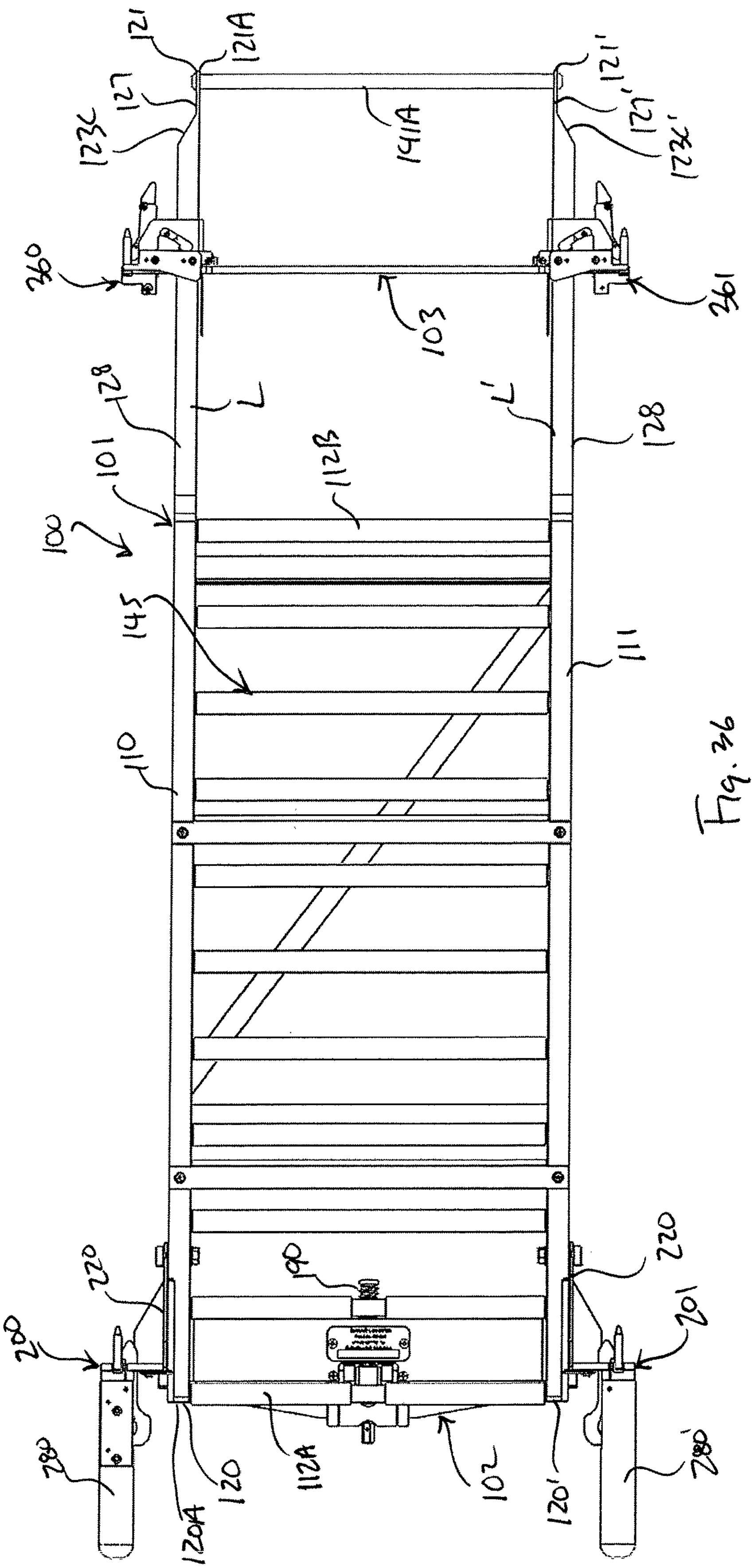
FIG. 36 is a top plan view of the embodiment of FIG. 1.
Figure 37:
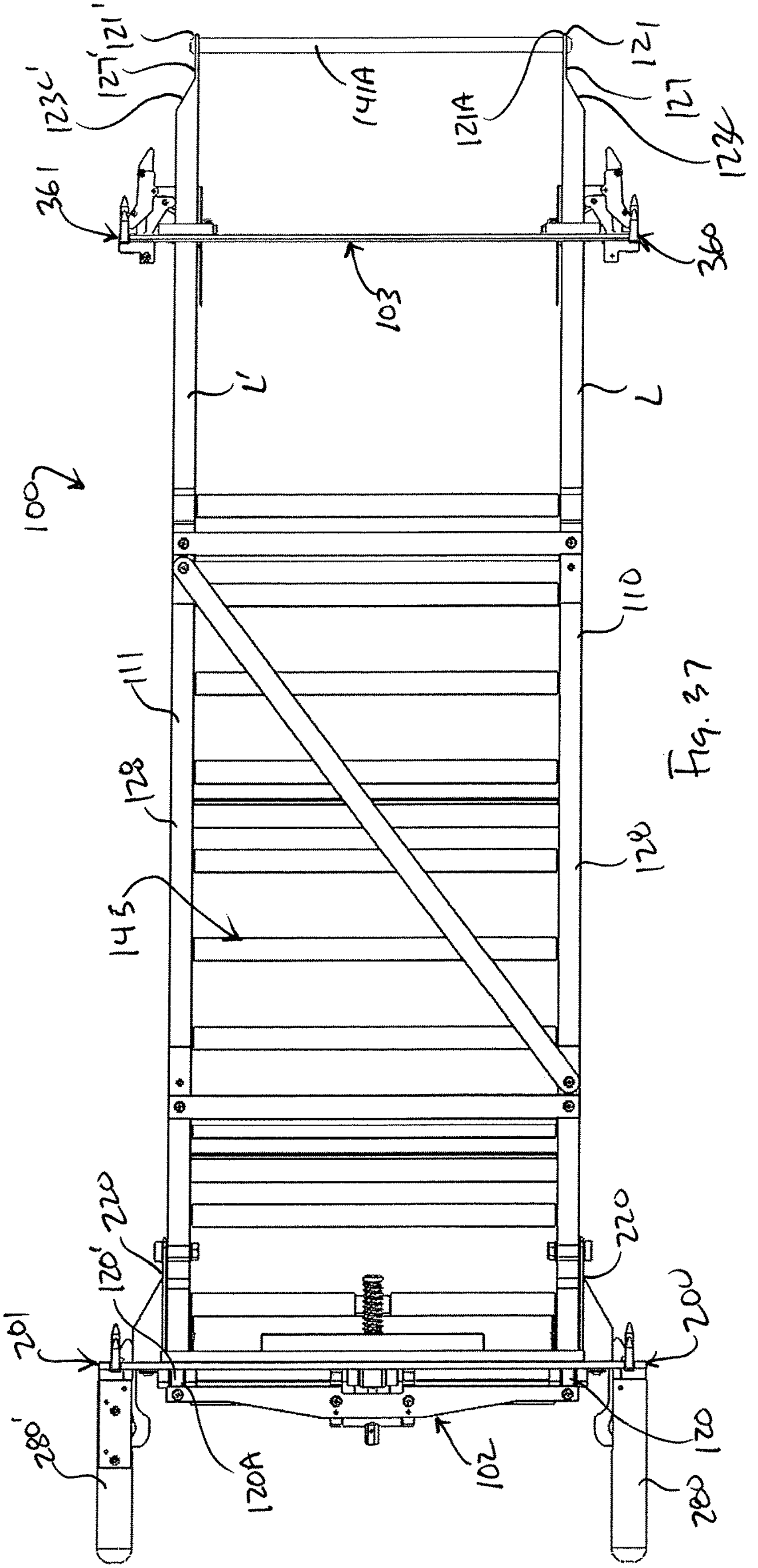
FIG. 37 is a bottom plan view of the embodiment of FIG. 1.
Figure 38:
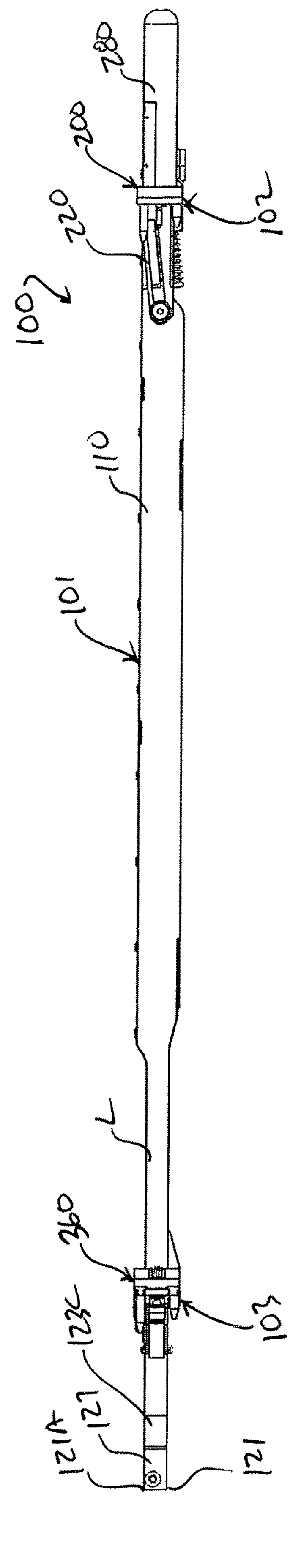
FIG. 38 is a left side elevation view of the embodiment of FIG. 1, the opposite right side elevation view being the same thereof.

When lever arm 441 of lock 440 is pivoted inwardly in the direction of arrow J to the rail-locking position and switch 480 is pivoted rearwardly in the direction of arrow L to its closed position, pin 445 extends upright from follower 444 and through and beyond slot 381 of shield 380 to notch 488 on the outer side of pin 445 in FIG. 29, whereby notch 448 and pin 445 interfere with one another thereby disabling lever arm 441 of lock 440 from pivoting from its rail-locking position to its post-locking position. When lever arm 441 of lock 440 is pivoted inwardly in the direction of arrow J to the rail-locking position and switch 480 is pivoted forwardly in the direction of arrow M to its open position, notch 488 is displaced forwardly in the direction of arrow M out of the way of or otherwise free from interfering with pin 445, enabling lever arm 441 to pivot at its fixed end 442 outwardly in the direction of arrow K from its rail-locking position in FIG. 29 to its post-locking position in FIG. 30 without interference between pin 445 and notch 488.

In the assembly of rear support assembly 103 on shelf 101 in FIGS. 31-34, slide 360 is mounted reciprocally to length L of rail 110 between outermost roller 112B and distal extremity 121 and the attached outermost brace 141A, slide 361 is mounted reciprocally to length L' of rail 111 between outermost roller 112B and distal extremity 121', slides 360 and 361 are axially spaced-apart between the respective lengths L and L', and brace 350 extends between inner surfaces 122 and 122' of the respective rails 110 and 111 from slide 360 mounted on length L of rail 110 to slide 361 mounted to length L' of rail 111. Outermost roller 112B and outermost brace 141A entrap or otherwise captively retain rear support assembly 103 therebetween on the respective lengths L and L' of rails 110 and 111, disabling rear support assembly 103 from translating rearwardly beyond outermost brace 141A and forwardly beyond outermost roller 112B. Slides 360 and 361 are mounted on lengths L and L' of the respective rails 110 and 111 identically. Accordingly, the ensuing discussion of the assembly of slide 360 and rail 110 applies in every respect to the assembly of slide 361 and rail 111.

In the assembly of slide 360 on rail 110 with regard in relevant part to FIGS. 31-34, slide 360 is mounted on support section 128 of length L of support section 128 of rail 110 between outermost roller 112B and distal extremity 121. Support section 128 of length L extends rearwardly through opening 374 of slide 360, with just enough space therebetween to enable rail support section 128 of rail 110 to reciprocate therethrough, from front surface 371 of block 370 and rearwardly beyond rear surface 371 of block 370 and shield 380 to distal extremity 121. Arm 382 extends forwardly from front surface 371 along inner surface 122 of rail 110. Shield 380 extends rearwardly from rear surface 372 over upper surface 125 of rail 110. Lower surface 124 of rail 110 rests directly atop bearing 464, and extends upright therefrom through opening to upper surface 125. Bearing 464 in direct contact with the overlying lower surface 124 of rail 110 and supports and carries the load of rail 110 proximate to opening 374, wherein relative longitudinal reciprocal movement of rail 110 through opening 374 of slide 360 in opposite directions imparts rotation to bearing 464 along its longitudinal axis with little rolling resistance. Switch 480 extends outwardly over shield 380 from fixed end 486 pivotally secured to upper end 463 of support 460 of block 370 inboard of inner surface 122 to outer end 483 over upper pin 390 aligned vertically with the underlying lower pin 400. Lever arm 441 is between outer surface 123 and upper and lower pins 390 and 400 and extends rearwardly toward distal extremity 121 of rail 110 from its fixed end 442 to the front of front surface 371 of block 370 through opening 374 and rearwardly beyond rear surface 372 under shield 380 along outer surface 123 to follower 444 and abutment 446 and rearwardly beyond follower 444 and abutment 446 to free end 443. Torsion spring 450 tensions lever arm 441 to its rail-locking position thereby keeping follower 444 in constant contact against outer surface 123 of rail 110 between distal extremity 121 of rail 110 and outermost roller 112B. Slide 360 is mounted on rail 111 identically to how slide 360 is mounted on rail 110.

§ IV. THE ASSEMBLY OF THE SHELF ASSEMBLY AND AN EQUIPMENT RACK

The described installation of front and rear support assemblies 102 and 103 on shelf 101 forms shelf assembly 100 illustrated in FIGS. 35-39. FIGS. 35-39 illustrate shelf assembly 100, namely, the assembly of shelf 101, front support assembly 102, and rear support assembly 103, whereby front support assembly 102 is mounted to support sections 128 and 128' of the respective rails 110 and 111 proximate to the respective proximal extremities 120 and 120' of rails 110 and 111 defining the proximal extremity 120A of shelf 101, and rear support assembly 103 is mounted to lengths L and L' of the respective rails 110 and 111 proximate to the respective distal extremities 121 and 121' defining the distal extremity 121A of shelf 101.

Figure 39:
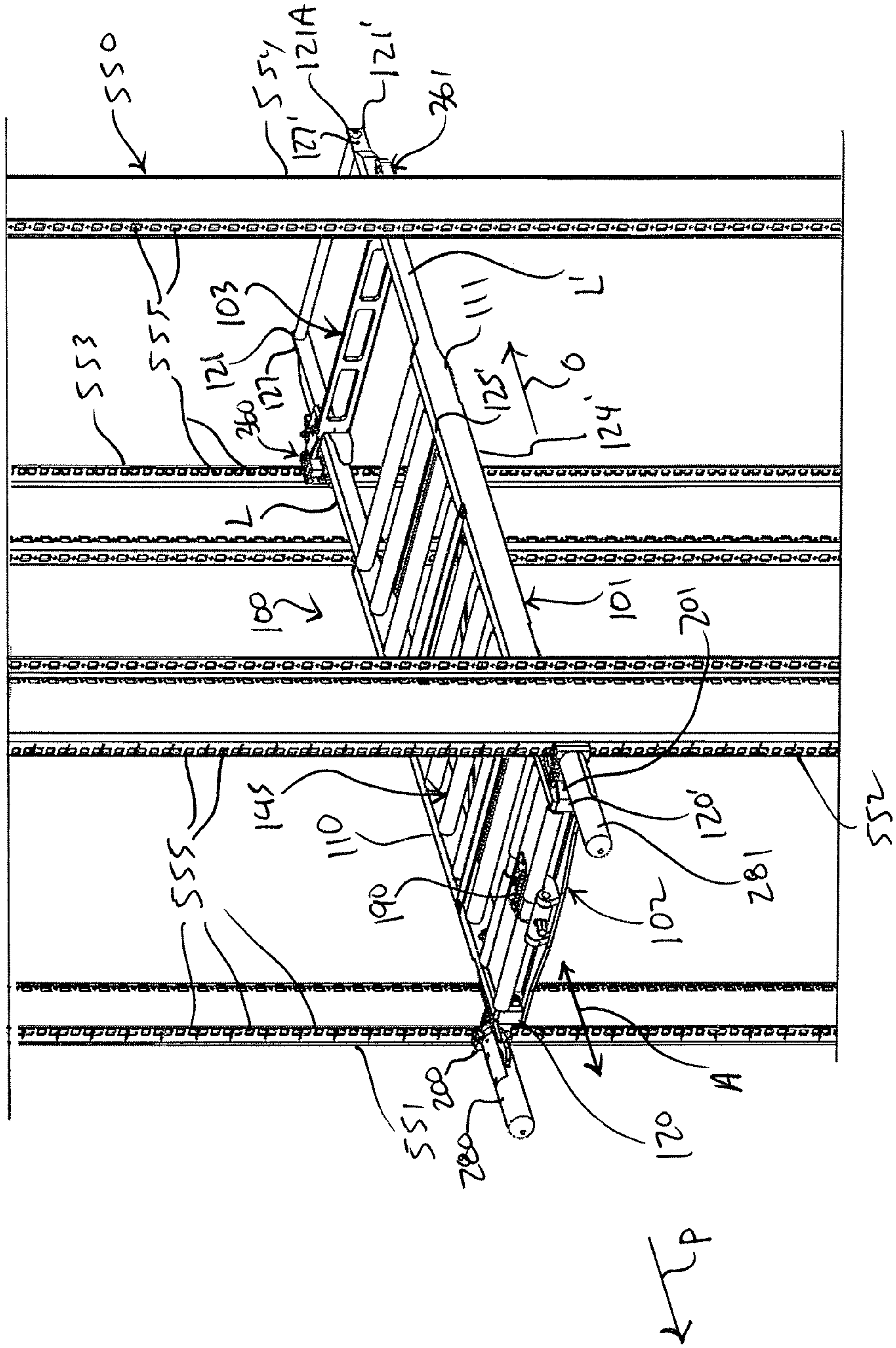
FIG. 39 is a perspective view of the shelf assembly of FIG. 1 show as it would appear attached to posts of an equipment rack.

Shelf assembly 100 is useful for being temporarily installed onto an equipment rack 550 in FIG. 39 at a chosen elevation. Equipment rack 550 is a standard, well-known, and readily-available four-post clearance-hole rack including upright and axially spaced-apart front rack posts 551 and 552 and upright and axially spaced-apart rear rack posts 553 and 554 to the rear of front rack posts 551 and 552. Posts 551-554 are each fashioned with identical mounting holes 555 that define attachment sites for the siting and mounting of shelf assembly 100. Mounting holes 555 are clearance holes, unthreaded holes arranged vertically and which are sufficiently sized and square in shape to freely accept the upper and lower pins of the respective front and rear support assemblies 102 and 103. The vertical spacing between adjacent mounting holes 555 corresponds to the vertical spacing between the upper pins 230 and 390 and lower pins 240 and 400 of the respective front and rear support assemblies 102 and 103, thereby enabling adjacent pairs of mounting holes 555 in the posts 551-554 to accept the upper pins 230 and 390 and lower pins 240 and 400 of the respective front and rear support assemblies 102 and 103. The vertical spacing between upper and lower pins 230 and 240, and between upper and lower pins 390 and 400 can each correspond to adjacent holes 555, or holes 555 spaced-apart vertically by one or more holes 555. Shelf assembly 100 can be sited onto equipment rack 555 at any chose elevation. Although pins 230, 240, 390, and 400 and mounting holes 555 are correspondingly square in shape, other corresponding shapes can be used, such as rectangular, triangular, oval, etc. Mounting holes 555 are clearance holes, unthreaded holes arranged vertically and which are sufficiently sized and square in shape to freely accept the upper and lower pins of the respective front and rear support assemblies 102 and 103

In FIG. 39, front rack posts 551 and 552 and rear rack posts 553 and 554 are supported and extend vertically upright, front support assembly 102 is horizontal relative to posts 551-554 and extends between and is secured detachably to front rack posts 551 and 552, handles 280 and 280' extend forwardly from the respective front rack posts 551 and 552, rear support assembly 103 is horizontal relative to posts 551-554 and extends between and is secured detachably to rear rack posts 553 and 554, and shelf 101 is supported horizontally relative to rack posts 551-554 by front support assembly 102 and rear support assembly 103 between front rack posts 551 and 552 and rear rack posts 553 and 554. In the installation of shelf assembly 100 to equipment rack 550, slides 360 and 361 of rear support assembly 103 are concurrently secured detachably to rear rack posts 553 and 554, respectively, fixtures 200 and 201 of front support assembly 102 are concurrently secured detachably to front rack posts 551 and 552, respectively, and shelf 101 is supported by front support assembly 102 at the proximal extremity 120A of shelf 101 and by rear support assembly 103 at the distal extremity 121A of shelf 101. Rail 110 is coupled between slide 360 and rear support assembly 103 on one side of shelf 101, and extends along the insides of front rack post 551 and rear rack post 553. Rail 111 is coupled between slide 361 of rear support assembly 103 on the opposite side of shelf 101, and extends along the insides of front rack post 552 and rear rack post 554.

Rail 110 is mounted to fixture 200 for movement between a lowered position corresponding to at least a horizontal position of rail 110 between fixture 200 and slide 360 and a raised position corresponding to an inclined position of rail 110 between fixture 200 and slide 360. Rotation of the drive member of shelf assembly 100, threaded shank 190, in opposite directions imparts corresponding relative movement of rail 110 between its lowered position corresponding to at least a horizontal position of rail 110 between fixture 200 and slide 360 and its raised position corresponding to an inclined position of rail 110 between fixture 200 and slide 360. Likewise, rail 111 is mounted to fixture 201 for movement between a lowered position corresponding to at least a horizontal position of rail 111 between fixture 201 and slide 361 and a raised position corresponding to an inclined position of rail 111 between fixture 201 and slide 361. Rotation of the drive member of shelf assembly 100, threaded shank 190, in opposite directions imparts corresponding relative movement of rail 111 between its lowered position corresponding to at least a horizontal position of rail 111 between fixture 201 and slide 361 and its raised position corresponding to an inclined position of rail 111 between fixture 201 and slide 361. Rails 110 and 111 are axially-spaced apart, and equipment can be placed atop the parallel, spaced-part rollers extending between and concurrently rotated to the respective rails 110 and 111 for supporting the equipment while it is being conventionally secured to rack posts 551-554 of equipment rack 550.

Rotation of the drive member of shelf assembly 100, threaded shank 190, in opposite directions imparts corresponding relative movement of front brace 150 and shelf 101 secured thereto in reciprocal directions indicated by double arrow A relative to rear brace 160 between the rearward position of shelf 101 corresponding to the lowered position of proximal extremity 120A of shelf 101, and the forward position of shelf 101 corresponding to the raised position of proximal extremity 120A shelf 101. Rails 110 and 111 are configured to reciprocate rearwardly and forwardly in the directions of double arrow A relative to fixtures 200 and 201 of front support assembly 102 attached to front rack posts 551 and 552, and slides 360 and 361 attached to rear rack posts 553 and 554. There is sufficient play between slides 360 and 361 and rails 110 and 111, respectively, to enable proximal extremity 120A of shelf 101 to raise and lower relative to fixtures 200 and 201 in response to movement of front brace 150 and shelf 101 secured thereto in reciprocal directions indicated by double arrow A relative to rear brace 160 between the rearward position of shelf 101 corresponding to the lowered position of proximal extremity 120A of shelf 101, and the forward position of shelf 101 corresponding to the raised position of proximal extremity 120A shelf 101. Shelf 101 is at least horizontal when shelf 101 is in its rearward position of shelf 101 corresponding to the lowered position of proximal extremity 120A of shelf 101, and is inclined downwardly from proximal extremity 120A of shelf 101 to distal extremity 121A when shelf 101 is in the, the wording "is in the" meaning "occupies," forward position of shelf 101 corresponding to the raised position of proximal extremity 120A shelf 101.

Figure 40:
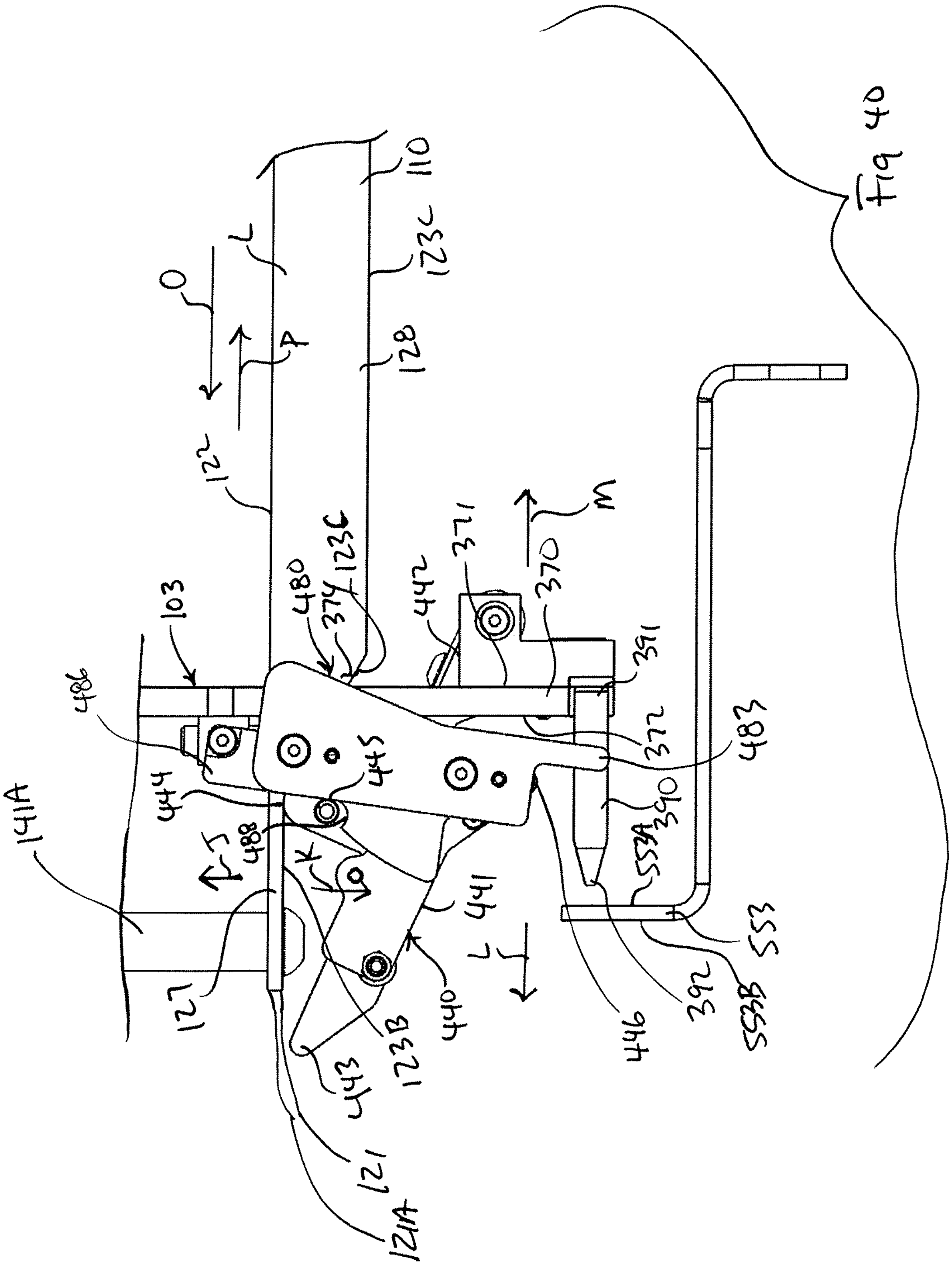
FIGS. 40-53 illustrate a sequence of events for installing the shelf assembly first illustrated in FIG. 1 to the posts of FIG. 42.
Figure 43:
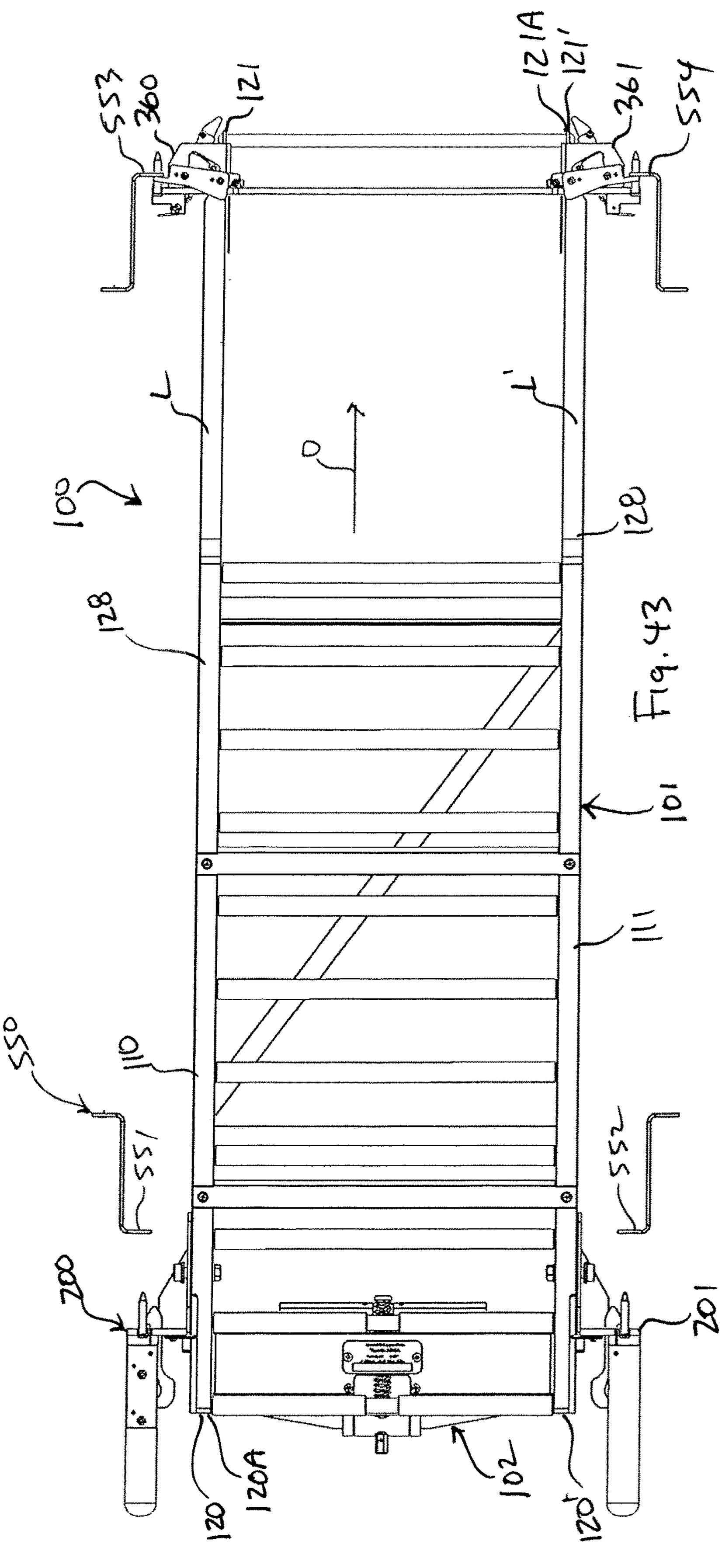

Installation of shelf assembly 100 on equipment rack 550 requires no separate fasteners or specialized tools. Slides 360 and 361 install onto equipment rack 550 automatically in response to one swoop or sweeping motion of shelf assembly 100, without having to be handled or adjusted by hand or with a separate tool. To install shelf assembly 100 on equipment rack 550, initially rear support assembly 103 is slid rearwardly in the direction of proximal extremities 121 and 121' of rails 110 and 111 at the distal extremity 121A of shelf 101 to stowage section 127 for identically locating slides 360 and 361 on the respective stowage sections 127 and 127' as shown in FIGS. 43. When slides 360 and 361 are on the respective stowage sections 127 and 127' thereby being in their stowage positions relative to the respective rails 110 and 111, rails 110 and 111 are in their stowage positions relative to the respective slides 360 and 362. FIG. 40 shows rear support assembly 103 slide rearwardly to locate slide 360 on stowage section 127. Slide 361 is identically and concurrently located on stowage section 127'. Shelf assembly 100 is taken up, conveniently by handles 280 and 280' by an ordinary workman standing to the front of front rack posts 551 and 552, and held horizontally with rails 110 and 111 extending upright from lower surfaces 124 and 124' of rails 110 and 111 to upper surfaces 125 and 125 of rails 110 and 111, respectively. Leading with distal extremity 121A and rear support assembly 103 mounted thereto, shelf 101 is inserted rearwardly in the direction of arrow O in FIG. 43 between front rack posts 551 and 552 and toward rear rack posts 553 and 554, for example first by rolling shelf assembly 100 slightly to one side or the other to enable slides 360 and 361 on either side of shelf assembly 100 to clear front rack posts 551 and 552, rolling shelf assembly 100 back to the horizontal following the advance of rear support assembly 103 rearwardly beyond front rack posts 551 and 552, and then advancing shelf assembly rearwardly in the direction of arrow O leading with distal extremity 121A and rear support assembly 103 mounted thereto to between rear rack posts 553 and 554 aligning slides 360 and 361 on either side of proximal extremity 121A of shelf 101 with chosen mounting sites of the respective rear rack posts 553 and 554 located at a desired elevation. Instead of rolling, shelf assembly 100 can be "walked" between front rails 551 and 551 by angling shelf assembly 100 to the left, advancing fixture 200 beyond front rack post 551, angling shelf assembly 100 to the right, advancing fixture 201 past front rack post 552, and then straightening shelf assembly 100 and advancing it rearwardly between front rack posts 551 and 552 to between rear rack posts 553 and 554. In the alternative, shelf assembly 100 can be "walked" between front rails 551 and 551 by angling shelf assembly 100 to the right, advancing fixture 201 beyond front rack post 552, angling shelf assembly 100 to the left, advancing fixture 200 past front rack post 551, and then straightening shelf assembly 100 and advancing it rearwardly between front rack posts 551 and 552 to between rear rack posts 553 and 554. Then, slides 360 and 361 of rear support assembly 103 automatically and concurrently releasably secure immovably to the respective rear rack posts 553 and 554 in response to one swoop or sweeping motion of shelf assembly rearwardly in the direction of arrow O. Thereafter, fixtures 200 and 201 of front support assembly 102 automatically and concurrently releasably secure immovably to the respective front rack posts 551 and 552 in response to a continued advancement of shelf assembly 100 in the direction of arrow O. The installation of rear support assembly 103 to rear rack posts 553 and 554 will be discussed first, followed by a discussion of the installation of front support assembly 102 to front rack posts 551 and 552.

The distance between slides 360 and 361 corresponds to the distance between the mounting sites on the respective rear rack posts 553 and 554 to enable slides 360 and 361 to concurrently register with and engage the mounting sites and to support shelf 101 therebetween. Slides 360 and 361 interact with the respective rails 110 and 111 identically and concurrently and install on the respective rear rack posts 553 and 554 identically and concurrently in the installation of rear support assembly 103 on rear rack posts 553 and 554 by advancing shelf assembly 100 rearwardly in the direction of arrow O in one swoop or sweeping motion. Accordingly, the operation of slide 360 and how it installs on rail 110 for installing rear support assembly 103 equipment rack 550 will now be discussed, with the understanding that the ensuing discussion applies in every respect to the concurrent operation of slide 361 and its installation on rear rack post 554.

As explained above, thickness T of rail 110 between inner surface 122 and outermost surface 123A from proximal extremity 120 to cam surface 123C is greater than thickness T1 of rail 110 between inner surface 122 and innermost surface 123B from cam surface 123C to distal extremity 121. Accordingly, the part of rail 110 defined by thickness T1 to the rear of cam surface 123C is the described stowage section 127 of rail 110 that extends rearwardly from cam surface 123C to distal extremity 121, and is thinned in comparison to the comparatively thicker support section 128 of rail 110 denoted at 128 that is forward of cam surface 123C and that extends forwardly from cam surface 123C to proximal extremity 120. Stowage section 127 and support section 128 of rail 110 are on either side of cam surface 123C, and is considerably shorter in length compared to that of lengths L of support section 128 of rail 110, and this is the same for rail 111.

FIG. 40 shows rear support assembly 103 without shield 380 to better illustrate the operation of slide 360, which is shown slid rearwardly in the direction of distal extremity 121 of rail 101 to stowage section 127 to the rear of cam surface 123C. With rail 110 being in the stowage position relative to slide 360 in FIG. 40 by slide 360 being on stowage section 127 in its stowage position relative to rail 110, at the urging of torsion spring 450 lever arm 441 is pivoted inwardly toward innermost surface 123B of outer surface 123 in the direction of arrow J to its rail-locking position, and at the urging of spring 500 in FIG. 28 switch 480 is pivoted rearwardly toward distal extremity 121 in the direction of arrow L to its closed position. With slide 360 mounted on stowage section 227, lever arm 441 of lock 440 tensioned inwardly by torsion spring 450 in the direction of arrow J to the rail-locking position and switch 480 tensioned rearwardly by spring 500 in the direction of arrow L to its closed position, follower 444 of lever arm 441 is tensioned in direct contact against innermost surface 123B immediately to the rear of cam surface 123C and aligned longitudinally and interferingly with respect to cam surface 123C and opening 374 through which rail 110 extends, abutment 446 is withdrawn inwardly toward stowage section 127 away from upper and lower pins 390 and 400 and away from front surface 372 of block 370, and pin 445 is received by notch 488 on the outer side of pin 445 in FIG. 40. Pin 445 is between notch 448 and innermost surface 123B of stowage section 127, whereby notch 448 interferes with pin 445 thereby locking lever arm 441 in its post-locking position by disabling lever arm 441 of lock 440 from pivoting outwardly from its rail-locking position to its post-locking position. In this configuration, lock 440 is automatically restrains rail 110 from reciprocating longitudinally relative to slide 360 by a direct interference of follower 444, positioned immediately to the rear of and longitudinally-aligned with cam surface 123C and opening 374 through which rail 110 extends, in contact directly against cam surface 123C. This automatically captively retains slide 360 on support section 127 by and between cam surface 123 and outermost brace 141A secured to distal extremity 121.

Figure 41:
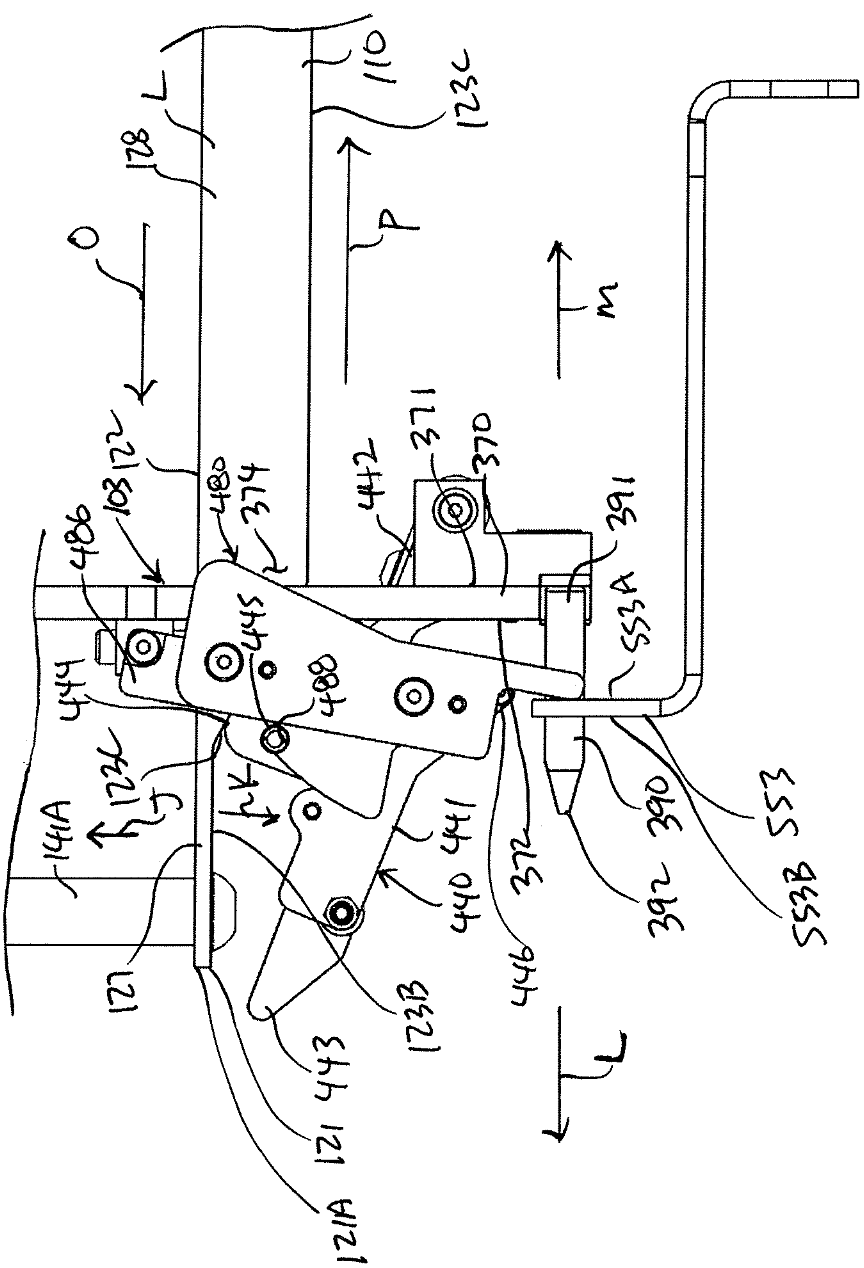
Figure 42:
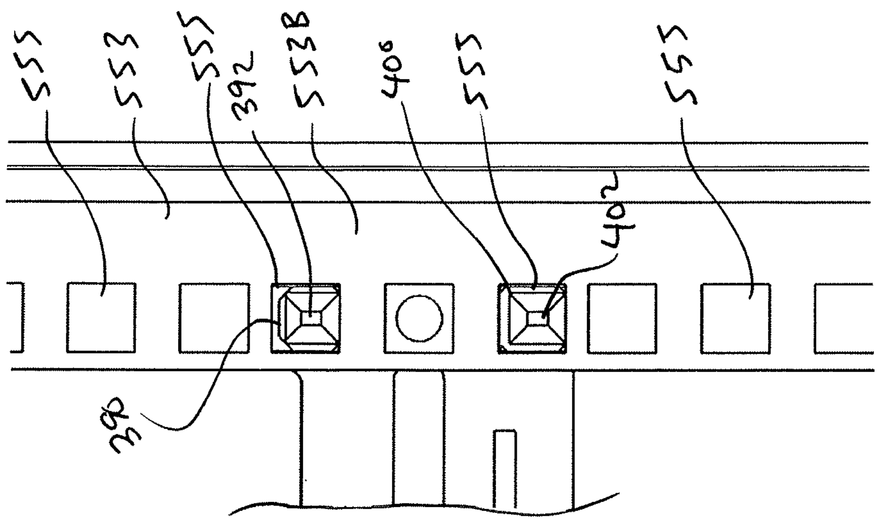

With rail 110 being in the stowage position relative to slide 360 by slide 360 be on stowage section 127, lock 440 tensioned to the rail-locking position, switch 480 tensioned to its closed position to thereby secure lock 440 in the rail-locking position, and upper and lower pins 390 and 400 that define the detent structure of slide 360 aligned longitudinally with a chosen pair of vertically-aligned holes 555, defining a complemental detent structure, of rear rack post 553, with reference in relevant part to FIGS. 41 and 42 upper and lower pins 390 and 400 are initially inserted pointed ends 392 and 402 first through the corresponding holes 555, shown in FIG. 42, from front surface 553A of rear rack post 553 to rear surface 553B of rear rack post 553 and rearwardly through holes 555 until in FIGS. 41 and 42 rear rack post 552 is between butt end 391 and pointed outer end 392 of upper pin 390 and rear surface 553A of rear rack post 553 is brought into direct contact against switch 480 outer end 483, which is an initial switch-engaging position of switch 480 against rear rack post 553, over upper pin 390 between butt end 391 and pointed outer end 392 of upper pin 390, all automatically in response to advancement of shelf assembly 100 and thus slide 360 on stowage section 127 of rail 110 in the direction of arrow O in FIGS. 41 and 43 between front rack posts 551 and 552 and rear rack posts 553 and 554. The interaction of slide 361 with rear rack post 554 is identical to and occurs concurrently with the described interaction of slide 360 with rear rack post 553, as shown in FIG. 43. At the initial switch-engaging position of switch 480 against rear rack post 553 in FIGS. 41 and 43, lever arm 441 is in its rail-locking position and switch 480 is in its closed position disabling lever arm 441 from moving pivotally from its rail-locking position to its post-locking position.

Figure 28:
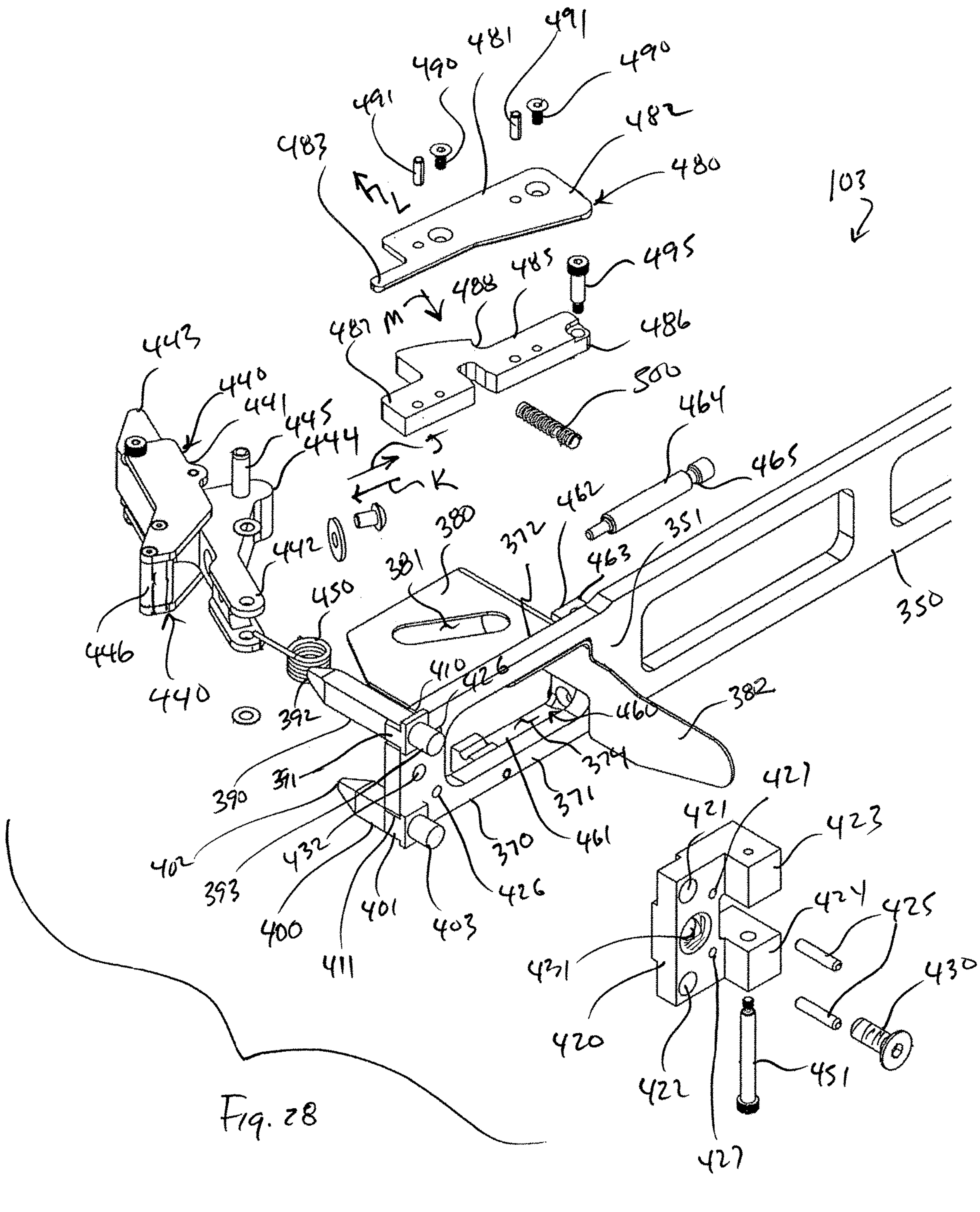
FIG. 28 is an exploded perspective view of the slide of FIG. 27.
Figure 44:
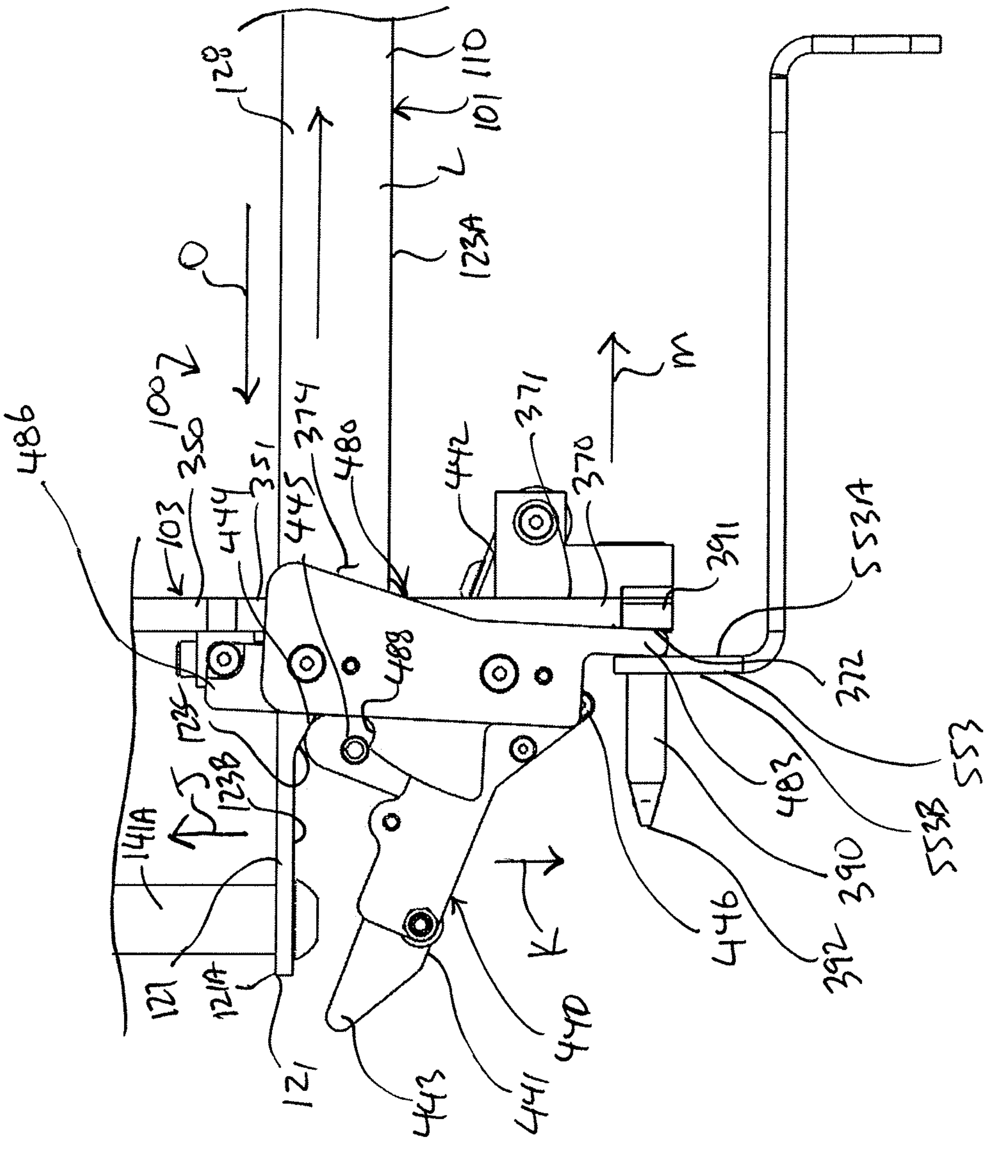
Figure 45:
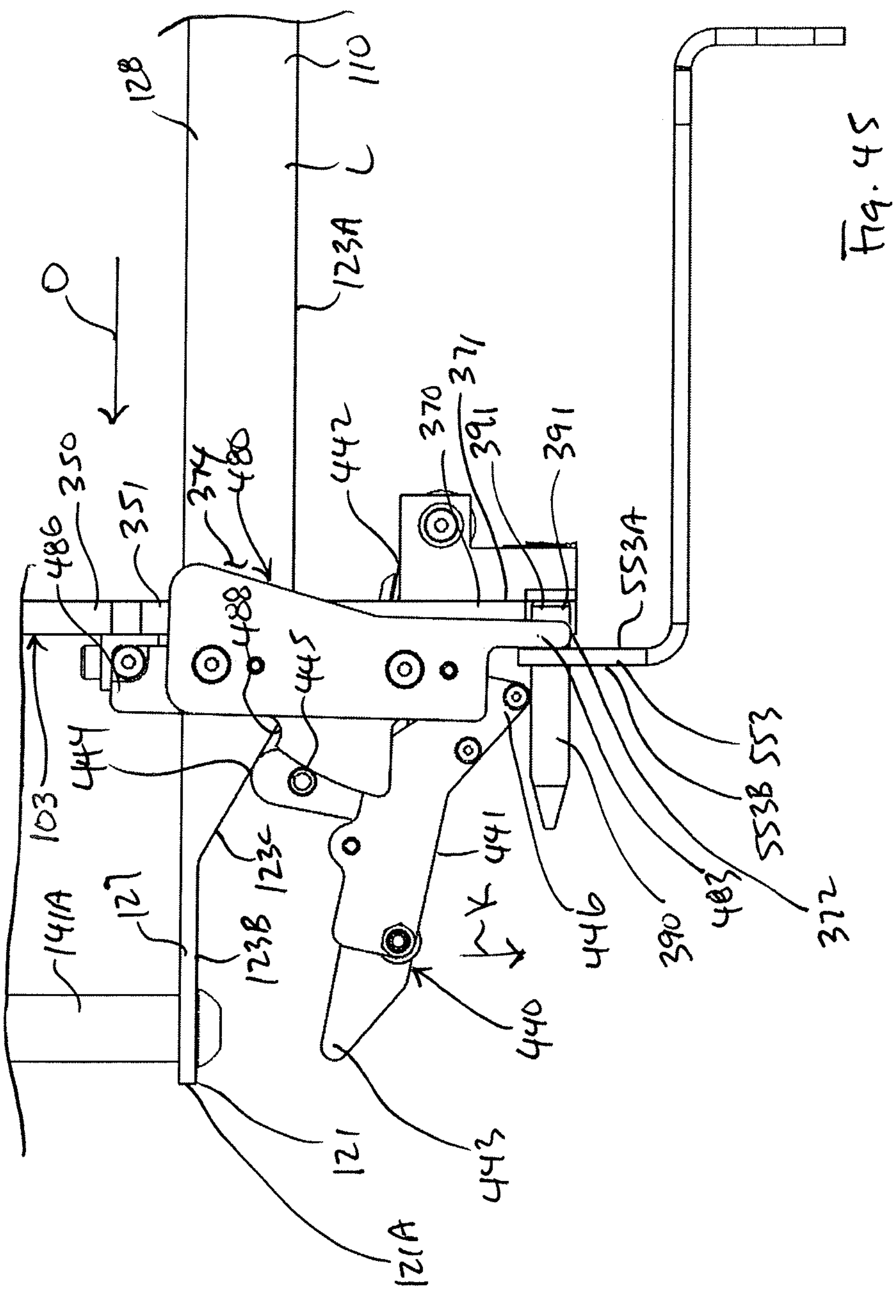
Figure 46:
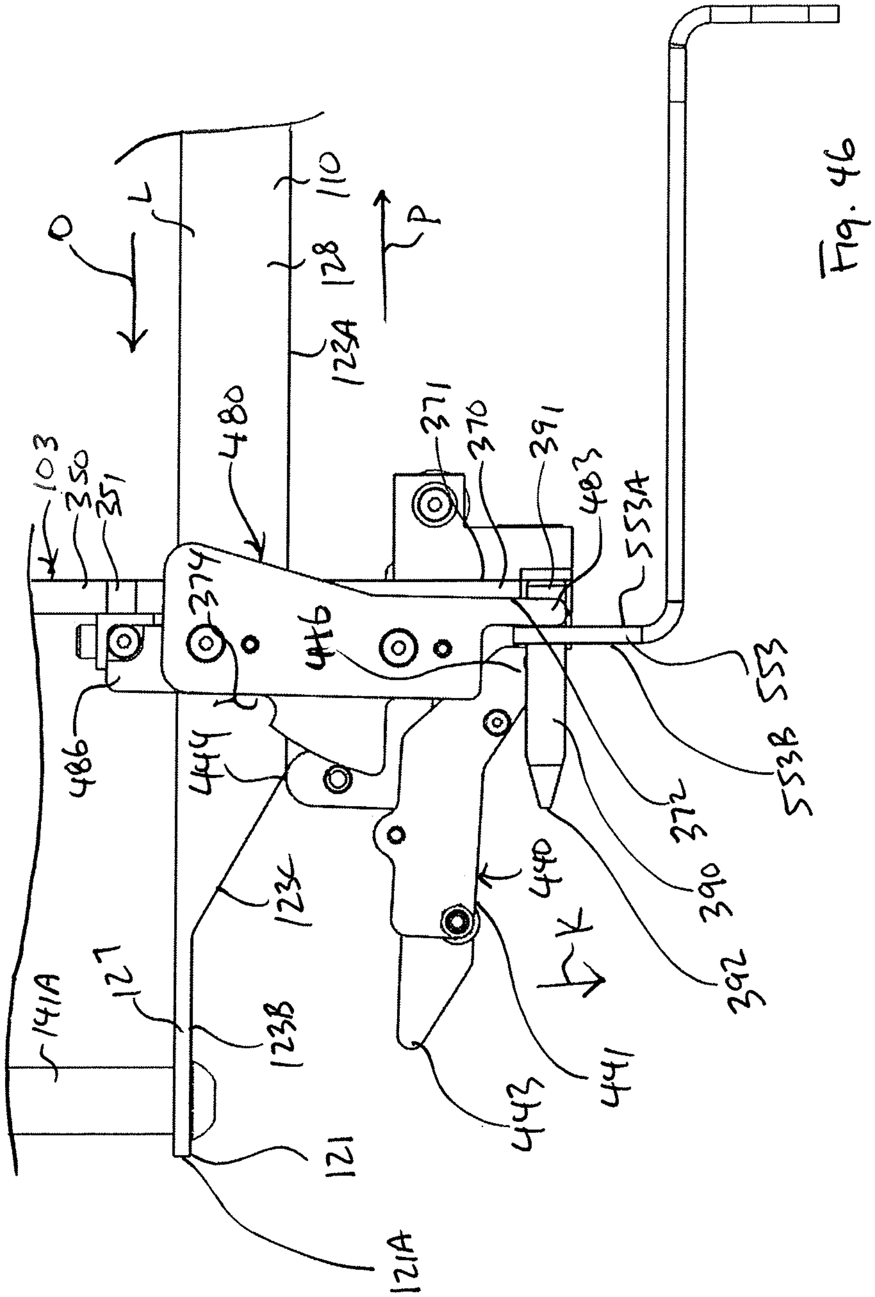

In response to continued advancement of shelf assembly 100 and thus slide 360 rearwardly in the direction of arrow O in FIGS. 41 and 43 between front rack posts 551 and 552 and rear rack posts 553 and 554 in FIG. 43, slide 360 is advanced rearwardly in the direction of arrow O in FIG. 44 toward rear rack post 553 and outer end 483 of switch 480 is urged against front surface 553A of rear rack post 553 in FIG. 44 with a force sufficient to defeat spring 500 in FIG. 28 in response to automatically pivot switch 480 about its fixed end 486 forwardly in the direction of arrow M from its closed position in FIGS. 41 and 43 to its open position in FIG. 45, which concurrently displaces notch 488 forwardly in the direction of arrow M to the front and out of the way of pin 445 freeing notch 488 from interfering with pin 445 thereby enabling lever arm 441 to pivot at its fixed end 442 outwardly in the direction of arrow K from its rail-locking position in FIG. 41 to its post-locking position in FIG. 46 without interference between pin 445 and notch 488. At the same time, rearwardly advancing slide 360 is brought into an installed or contact position relative to and against rear rack post 553 in FIG. 45. In this installed or contact position of slide 360, rear surface 372 of slide 360 is brought into direct contact against front surface 553A of rear rack post 553, which inherently and automatically disables slide 360 from moving rearwardly beyond rear post 553 blocking slide 360. FIG. 44 shows switch 480 pivotally displaced in the direction of arrow M out of its closed position in FIG. 41 to an intermediate position between its closed position in FIG. 41 and its open position in FIG. 46 initially displacing notch 488 forwardly in the direction of arrow M relative to pin 445 thereby initially withdrawing notch 488 from pin 445 just before rear surface 372 of slide 350 contacts rear surface 553A of rear rack post 553. FIG. 45 shows slide 360 advanced to its installed or contact position against rear rack post 553, and switch 488 in its open position freeing pin 445 from notch 488 thereby enabling lever arm 441 to pivot about its fixed end 442 outwardly in the direction of arrow K out of its rail-locking position in FIG. 41 to its post-locking position in FIG. 46 in response to advancement of rail 110 rearwardly relative to slide 360 in the direction of arrow O.

With lever arm 441 of lock 440 free from being locked in its rail-locking position in FIG. 44 and slide 360 in its installed position in contact with rear surface 553A of rear rack post 553 and thereby disabled from moving rearwardly in the direction of arrow O beyond rear rack post 553, rail 110 is automatically enabled to slide rearwardly in the direction of arrow O through opening 374 of and relative to slide 360. Lever arm 441 pivots outwardly in the direction of arrow K about its fixed end 442 in FIG. 44 without interference from pin 445 and notch 488 when cam surface 123C is advanced rearwardly in the direction of arrow O directly against the rearwardly-confronting follower 444 in response to a continued advancement of rail 110 longitudinally rearward through opening 374 in the direction of arrow O relative to slide 360. As cam surface 123C is driven rearwardly in the direction of arrow O against follower 444, cam surface 123C is urged directly against follower 444 with a force sufficient to defeat torsion spring 450 causing lever arm 441 to pivot in response about its fixed end 442 in the direction of arrow K from the rail-locking position to the post-locking position enabling rail 110 to move longitudinally in the direction of arrow O relative to slide 360 that is disabled from advancing rearwardly in the direction of arrow O rearwardly of rear rack post 553 as a result of it being in its installed position. The tension applied to lever arm 441 by torsion spring 450 keeps follower 444 in constant contact against cam surface 123C 450 as lever arm 441 displaces pivotally from the rail-locking position to the post-locking position in response to cam surface 123C being driven rearwardly in the direction of arrow O against follower 44, and follows cam surface 123C in FIGS. 44-46 from innermost surface 123B in FIG. 44 to outermost surface 123A in FIG. 46 to automatically pivot lever arm 441 of lock 440 at its fixed end 442 outwardly in the direction of arrow K in FIGS. 44-46 from the rail-locking position in FIG. 44 to the post-locking position in FIG. 46, all automatically in response to continued advancement of rail 110 longitudinally relative to slide 360 rearwardly through opening 374 from the stowage position of rail 110 relative to slide 360 to a rearward, support or advanced position of rail 110 relative to slide in FIG. 46. Again, FIG. 45 shows switch 488 in its open position freeing pin 445 from notch 488 and switch 480 enabling lever arm 441 to pivot about its fixed end 442 outwardly in the direction of arrow K out of its rail-locking position in FIG. 41 its post-locking position in FIG. 46 in response to advancement of rail 110 rearwardly in the direction of arrow O relative to slide 360.

Lever arm 441 automatically displaces pivotally from the rail-locking position to the post-locking position in response to cam surface 123C advancing rearwardly in the direction of arrow O against follower 444 relative to slide 360 set to its installed position on rear rack post 553 from the stowage position of rail 110 corresponding to the stowage position of slide 360 on stowage section 127 to a rearward advanced position of rail 110 relative to slide 360 in FIG. 46 corresponding to a support position of slide on support section 128 just to the front of cam surface 123C which corresponds to a support position of rail 110 relative to slide 360 at this stage of assembly. At the constant urging of spring 450 in FIG. 28, lever arm 441 is constantly tensioned to keep follower 444 in constant direct contact against cam surface 123C as lever arm 441 pivots from is rail-locking position to its post-locking position, in which follower 444 interacts with the rearwardly-advancing cam surface 123C pivoting lever arm 441 outwardly in the direction of arrow K and follows cam surface 123C from outermost surface 123B at thickness T1 of support section 127 to outermost surface 123A at the comparatively thicker thickness T of support section 128 of length L of rail 110 to the front of the now rearwardly-positioned cam surface 123C and out of the way of support section 128 through opening 374. Additionally at the same time, abutment 446 displaces outwardly in the direction of arrow K with pivoting lever arm 441 to between upper and lower pins 390 and 400 in FIGS. 47 and 48 to immediately behind and juxtaposed to rear surface 553B of rear rack post 553 longitudinally opposing rear surface 372 of block 371 to thereby capture or otherwise entrap rear rack post 523 between abutment 446 immediately to the rear of rear surface 553B of rear rack post 553 between upper and lower pins 390 and 400, and the longitudinally-opposing rear surface 372 of block 370 immediately to the front of the opposing rear surface 372 of block 370 in contact directly against front surface 523A of rear rack post 553. The reception of vertically-aligned upper and lower pins 390 and 400 through the corresponding holes 555 of rear rack post 553 and the entrapment of rear rack post 553 between longitudinally opposed abutment 446 and rear surface 372 of block 370 on either side of rear rack post 553 automatically secure and immobilize slide 360 to rear rack post 553 and disable upper and lower pins 390 and 400 from withdrawing, and disengaging, from the corresponding holes 555 to releasably secure slide 360 to rear rack post 553.

With lever arm 441 in its post-locking position in FIG. 46 with follower 444 tensioned in direct contact against outermost surface 123A of support section 128 of rail 110 at the urging of torsion spring 450, length L of support section 128 of rail 110 is enabled to be reciprocated through opening 374 without interference from follower 444 rearwardly in the direction of arrow O and forwardly in the direction of arrow P relative to side 360 releasably secured to rear rack post 553 along length L of support section 128 between cam surface 123C and outermost roller 112B. As long as slide 360 is on length L of support section 128 between cam surface 123C and outermost roller 112B, length L of rail 110 between cam surface 123C and outermost rail 112B is enabled to reciprocate through opening 374 of slide 360 secured immovably to rear post 553 rearwardly in the direction of arrow O and forwardly in the direction of arrow P without interference from follower 444. The constant direct contact of follower 444 against outermost surface 123A of support section 128 of length L of rail 110 at the urging of torsion spring 450 disables lever arm 441 from moving from its post-locking position to its rail locking position. This locks lever arm 441, and thus lock 440, in the post-locking position thereby releasably securing slide 360 immovably to rear rack post 553 in the post-locking position of slide 360. The tensioned lever arm 441 keeps follower 444 in direct and constant sliding contact against outermost surface 123A of length L of rail 128 between cam surface 123B and outermost roller 112B, and outermost surface 123A of length L of support section 128 of rail 110 between cam surface 123C and outermost rail roller 112B slides directly against follower 444 as length L of support section 128 of rail 110 between cam surface 123C and outermost roller 112B reciprocates longitudinally relative to slide 360 rearwardly and forwardly in the respective directions of arrows O and P.

Accordingly, with rail 110 being in the stowage position relative to slide 360 by slide 360 being on stowage section 127, lock 440 tensioned to the rail-locking position, switch 480 tensioned to its closed position to thereby secure lock 440 in the rail-locking position in FIG. 40, and upper and lower pins 390 and 400 that define the detent structure of slide 360 aligned longitudinally with a chosen pair of vertically-aligned holes 555 of rear rack post 553 that define the complemental detent structure of rear rack post 553, upper and lower pins 390 and 400 engage corresponding holes 555 of rear rack post 553 in FIG. 42, rear surface 553A of rear rack post 553 is brought into direct contact against switch 480 outer end 483, slide 360 advances rearwardly in the direction of arrow O in FIG. 44 to its installed position against rear rack post 553 in FIG. 45 and switch 480 concurrently pivots from its closed position in FIGS. 41 and 43 to its open position in FIG. 45 unlocking lever arm 441 of lock 440 from its rail-locking position, rail 110 advances rearwardly in the direction of arrow O relative to slide 360 while at the same time the rearwardly advancing cam surface 123C acts directly against follower 44 pivoting lever arm 441 of lock 440 from its rail-locking position to its post-locking position to releasable secure slide 360 to rear rack post 553 immovably concurrently enabling length L of support section 128 of rail 110 between cam surface 123C and outermost roller 112B to reciprocate longitudinally with respect to slide 360, all automatically in response to one swoop or sweeping motion of shelf assembly 100 rearwardly in the direction of arrow O. To detach slide 360 from rear rack post 553, this operation need only be reversed. In reverse, rail 110 is advanced longitudinally forwardly in the direction of arrow P relative to slide 360, follower 444 encounters and then follows the forwardly advancing cam surface 123C from outermost surface 123A of support section 128 to innermost surface 123C of stowage section to thereby automatically pivot the constantly-tensioned lever arm 441 of lock 444 from its post-locking position to its rail-locking position to automatically release slide 360 from rear rack post 553, slide 360 withdraws from rear rack post 553 forwardly in the direction of arrow P from its installed position while at the same time constantly-tensioned switch 480 automatically moves from its open position to its closed position automatically securing lever-arm in its rail-locking position on support section 127 and upper and lower pins 390 and 400 withdraw forwardly from the respective holes 555 of rear rack post 533, all automatically in response to one swoop or sweeping motion of shelf assembly 100 forwardly in the direction of arrow P. Installation of slide 361 onto rear rack post 554 happens concurrently with the installation of slide 360 onto rear rack post 553, and detachment of slide 361 from rear rack post 554 happens concurrently with the detachment of slide 360 from rear rack post 553.

Figure 49:
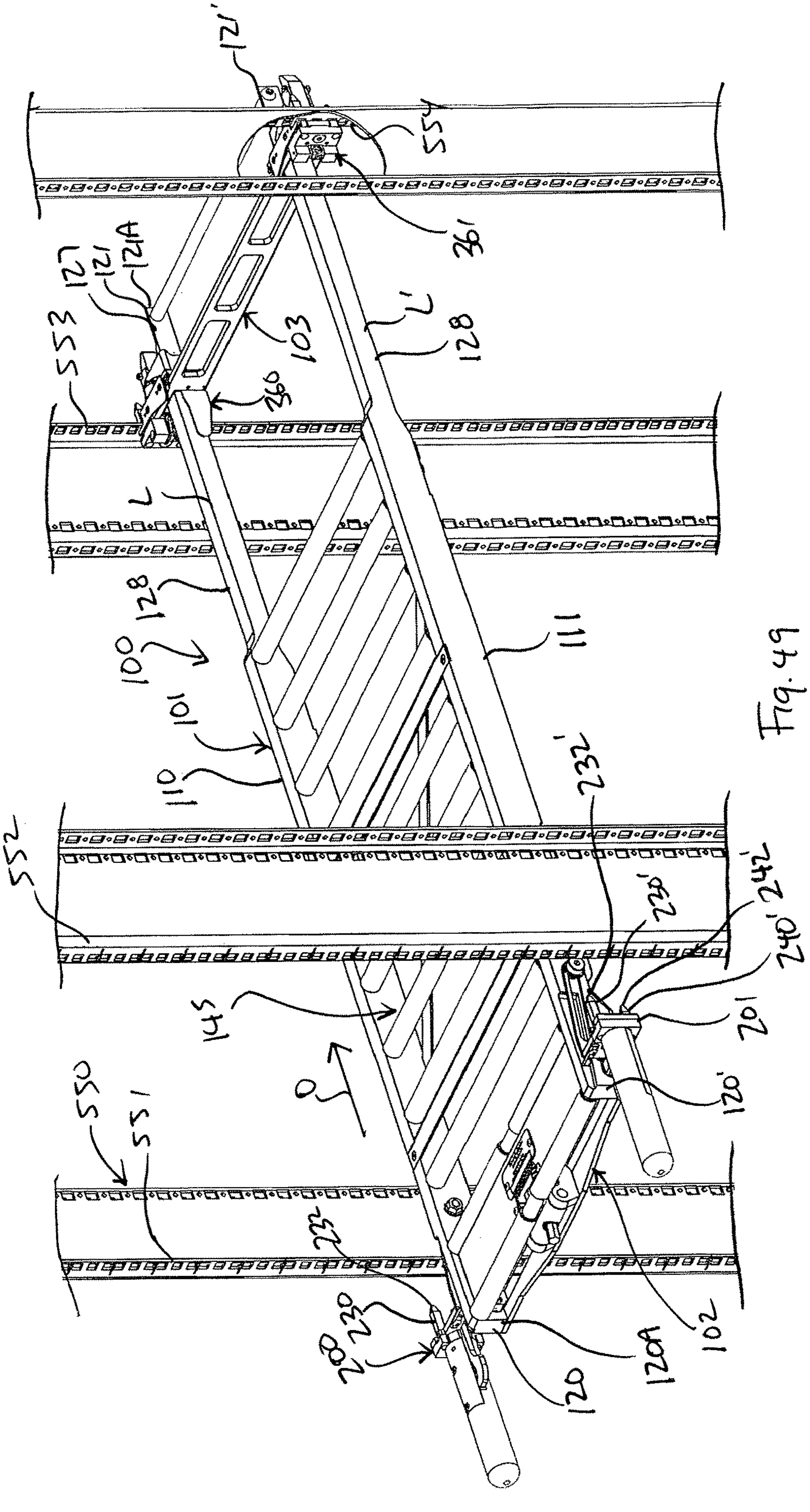
Figure 50:
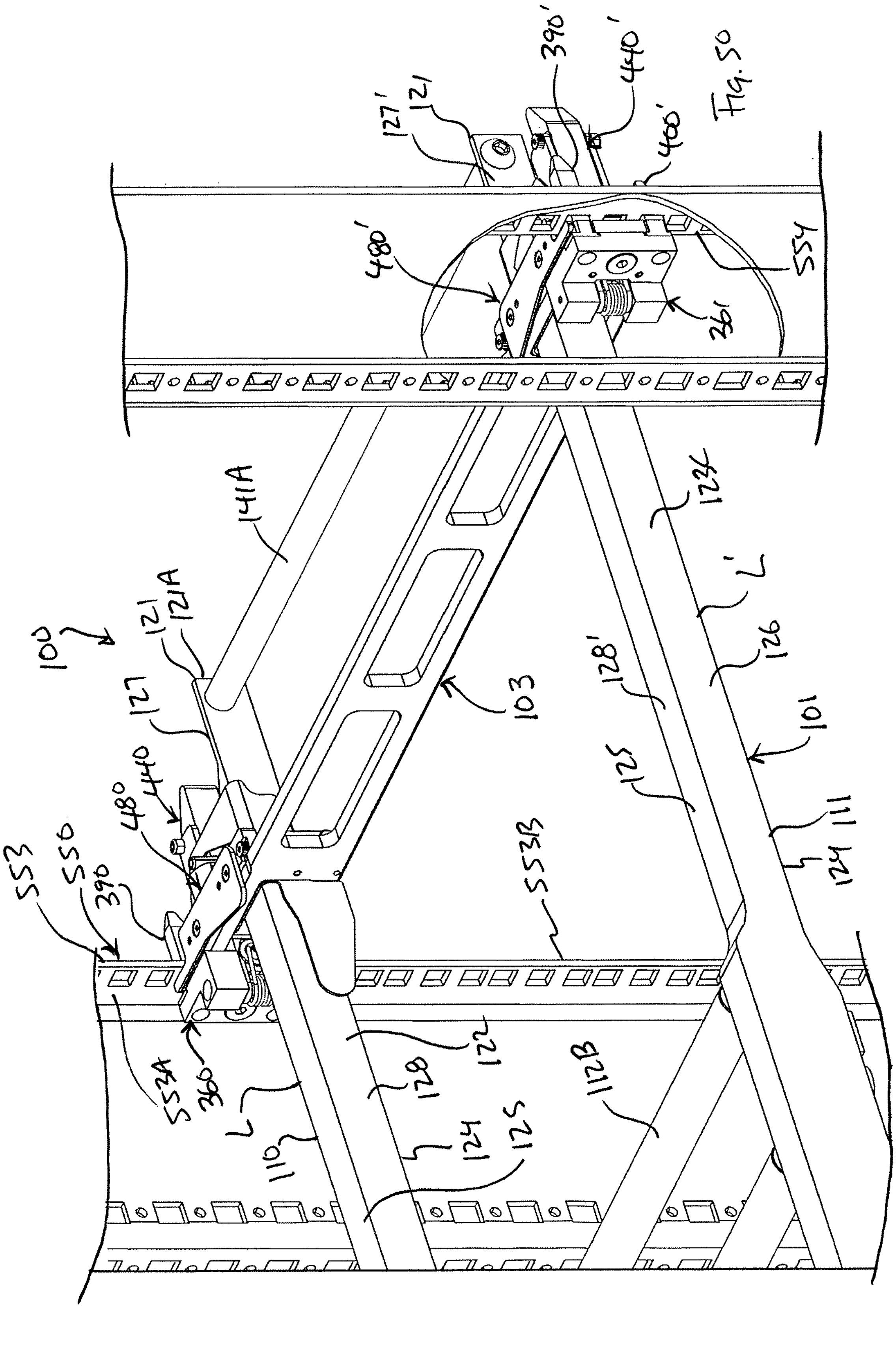

In FIG. 49 slides 360 and 361 are on lengths L and L' of support sections 128 and 128' of the respective rails 110 and 111 in their post-locking positions identically releasably secured immovably to rear rack posts 553 and 554, respectively, in preparation for installing front support assembly 102 to front rack posts 551 and 552. When slides 360 and 361 are on the respective support sections 128 and 128' thereby being in their support positions relative to the respective rails 110 and 111, rails 110 and 111 are in their support positions relative to the respective slides 360 and 361. Lengths L and L' of the respective support sections 128 and 128' of rails 110 and 111 are enabled to reciprocate slidably through the respective slides 360 and 361 in this configuration. In FIG. 49, rails 110 and 111 of shelf 101 are sufficiently long to extend forwardly from rear support assembly 103, releasably secured immovably to rear post racks 553 and 554, proximate to their respective distal extremities 121 and 121' defining distal extremity 121A of shelf 101 to between front rack posts 551 and 552 and beyond from between front rack posts 551 and 552 to their respective proximal extremities 120 and 120' that carries front support assembly 101, including fixture 200 on the outer side of proximal extremity 120 of rail 110 forward of and opposing front rack post 551, and fixture 201 on the outer side of proximal extremity 120' of rail 111 forward of and opposing front rack post 552. To automatically detach rear support assembly 103 from rear rack posts 553 and 554, the described operations of slides 360 and 361 that occur automatically for installing slides 360 and 361 onto rear rack posts 553 and 554 reverse automatically simply by pulling shelf assembly 100 forwardly in the opposite direction to arrow O indicated by arrow P in FIG. 39.

Slides 360 and 361 each configured to identically self-adjust automatically, without the use of hands or separate tools, and independently from one another, in response to being installed onto the respective rear rack posts 553 and 554, and are configured to identically self-adjust automatically, without the use of hands or separate tools, and independently from one another, in response to being withdrawn from the respective rear rack posts 553 and 554.

The distance between fixtures 200 and 201 corresponds to the distance between the mounting sites on the respective front rack posts 553 and 554 to enable fixtures 200 and 201 to concurrently register with and engage the mounting sites and to support shelf 101 therebetween. To complete the installation of shelf assembly 100 to equipment rack 550 as shown in FIGS. 39 and 53-59, front support assembly 101 is releasably secured to equipment rack 550 by releasably securing fixtures 200 and 201 to the respective front rack posts 551 and 551. Fixtures 200 and 201 install on the respective front rack posts 551 and 552 identically and concurrently in the installation of front support assembly 102 on front rack posts 551 and 552. Accordingly, the operation of fixture 200 and how it installs on rail 110 for installing front support assembly 102 on equipment rack 550 will now be discussed, with the understanding that the ensuing discussion applies in every respect to the concurrent operation of fixture 201 and its installation on front rack post 552.

Figure 51:
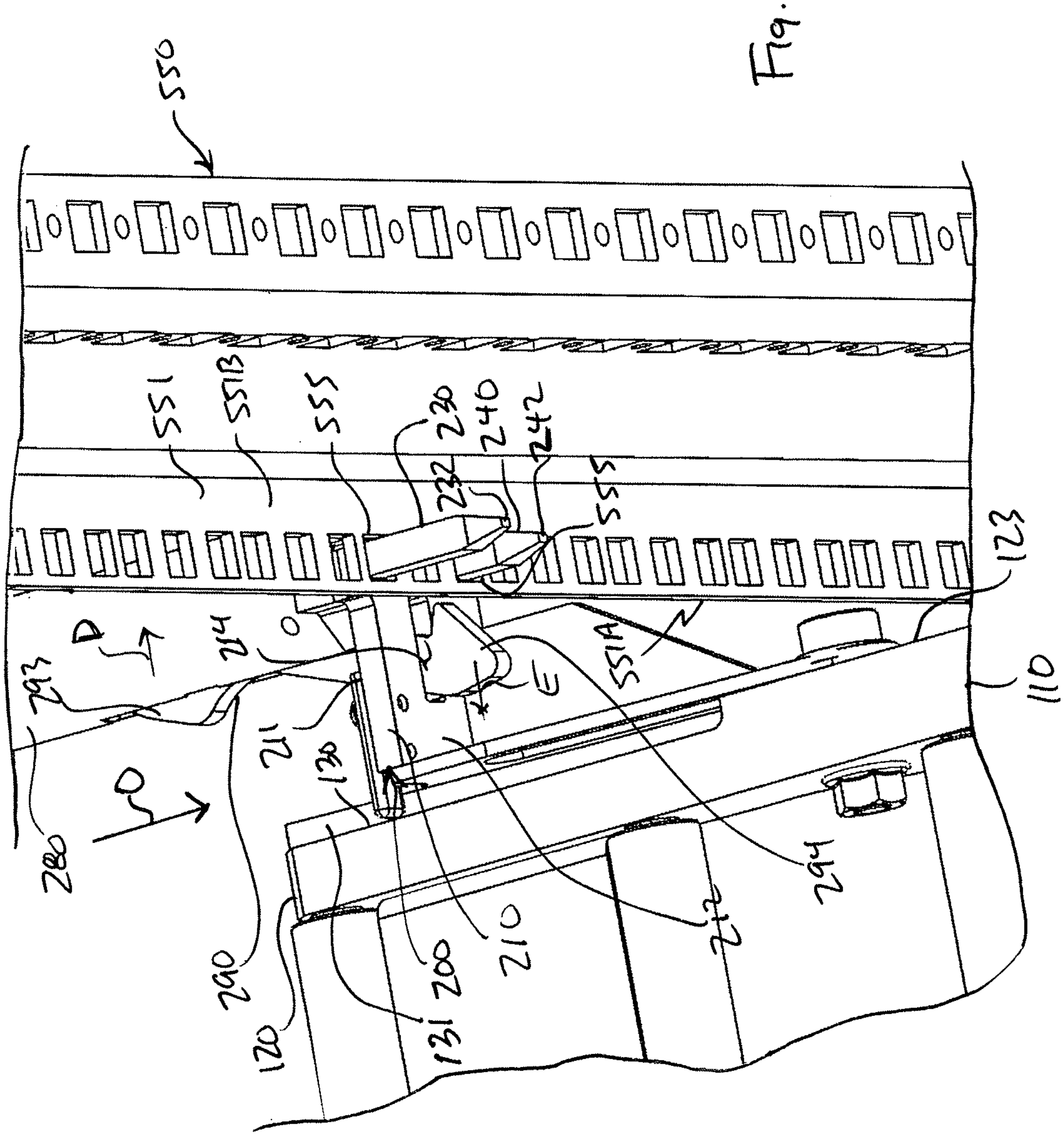

Referring to FIG. 51, handle 280 is taken up by hand and positioned to align upper and lower pins 230 and 240 that define the detent structure of fixture 200 longitudinally with a chosen pair of vertically-aligned holes 555, defining a complemental detent structure, of front rack post 551. Preferably, the chosen holes 555 of front rack post 551 are at the same elevation as holes 555 of rear rack post 553 engaged to pins 390 and 400. At the same time, handle 293 of lever arm 290 is pressed outwardly by hand to defeat spring 298 in FIGS. 12 and 13 to pivot from its closed position in FIGS. 13 and 14 to its open position in FIG. 51, which pivots handle 293 outwardly in the direction of arrow D away from proximal extremity 120 into slot 291 and latch 294 inwardly in the direction of arrow E toward proximal extremity 120 and away from front rack post 551, which enables latch 294 to clear front rack post 551 between proximal extremity 120 and front rack post 551.

Figure 47:
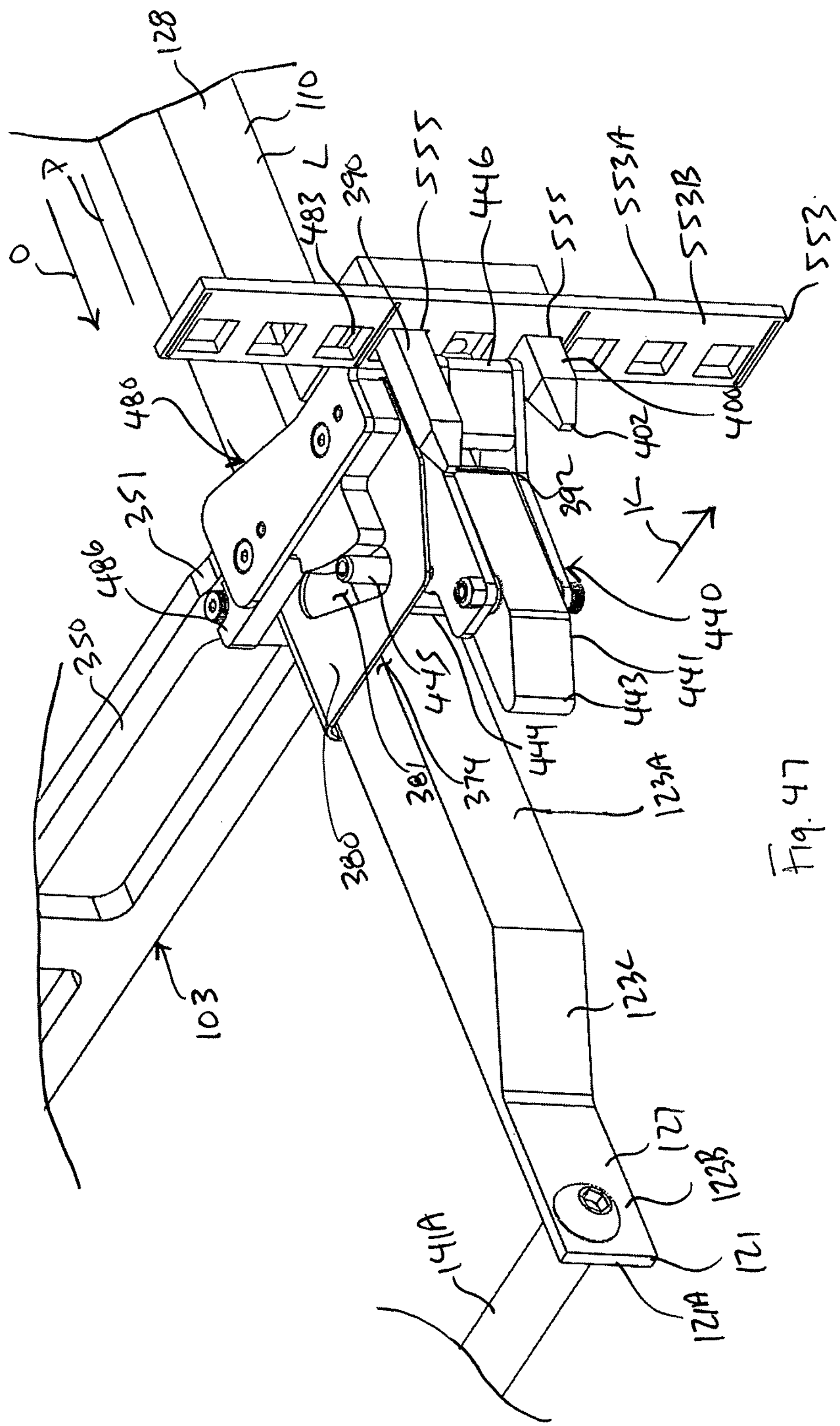
Figure 48:
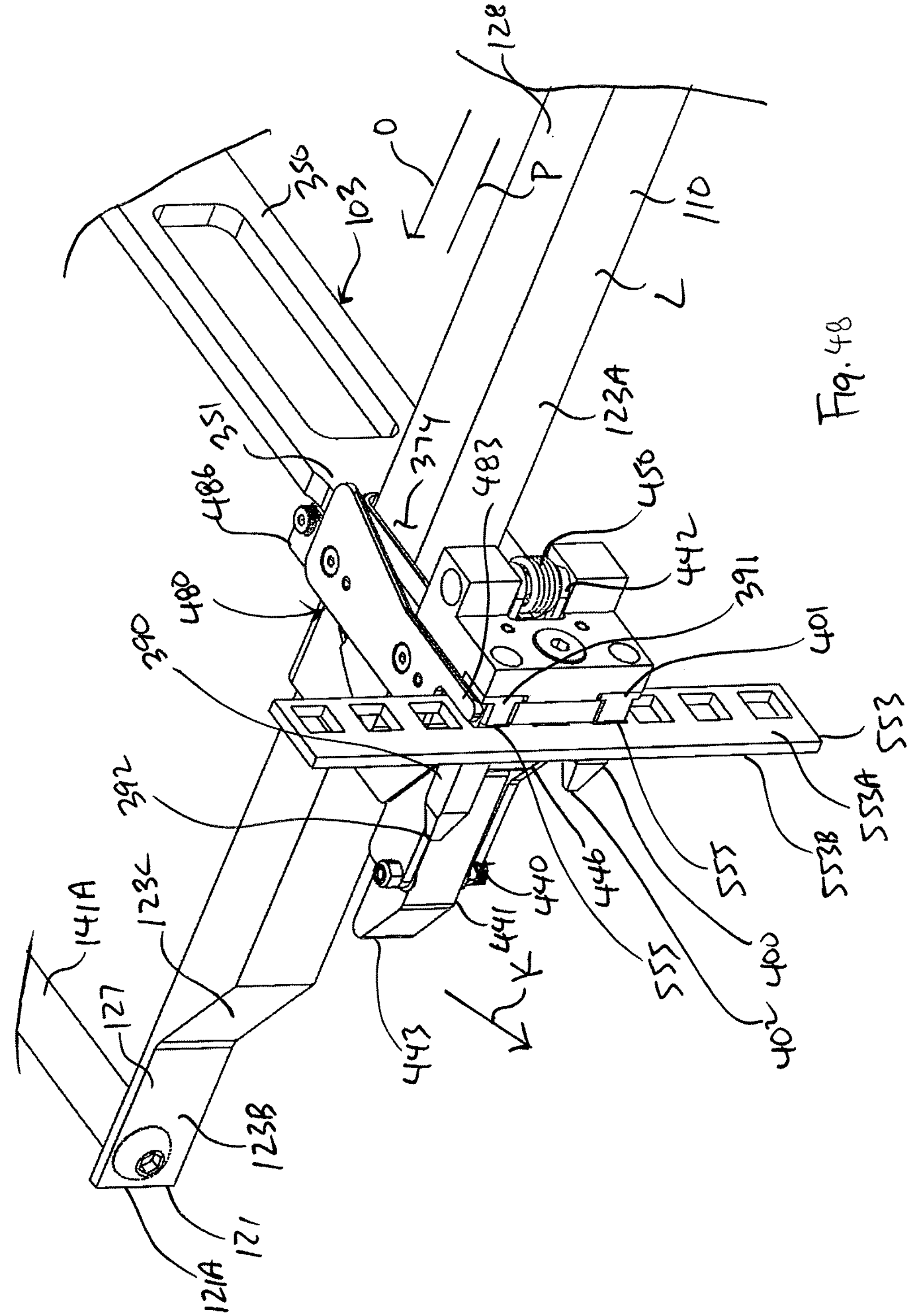

In FIG. 51, shelf 101 is advanced rearwardly in the direction of arrow O, which advances rear support assembly 103 it carries in the same direction in addition to rail 110 longitudinally in the same direction through slide 360 in FIGS. 47 and 48 to bring fixture 200 toward front rack post 551 to insert upper and lower pins 230 and 240 pointed ends 232 and 242 first through the corresponding holes 555 from front surface 551A of front rack post 551 to rear surface 551B of front rack post 551 until rear surface 212 of block 210 on the outer side of hole 214 is brought into direct contact against front surface 551A of front rack post 551, which disables fixture 200 from moving rearwardly beyond front rack post 551. The open position of lever arm 290 enables latch 294 to pass between proximal end 120 of rail 110 and front rack post 551 at the same time fixture 200 is advanced forwardly in the direction of arrow O to insert upper and lower pins 230 and 240 into and through the respect holes 555 and bring outer surface 212 of block 210 on the outer side of hole 214 in direct contact against front surface 551A of front rack post. Handle 280 extends forwardly from block 210 to the front of front rack post 551.

Figure 52:
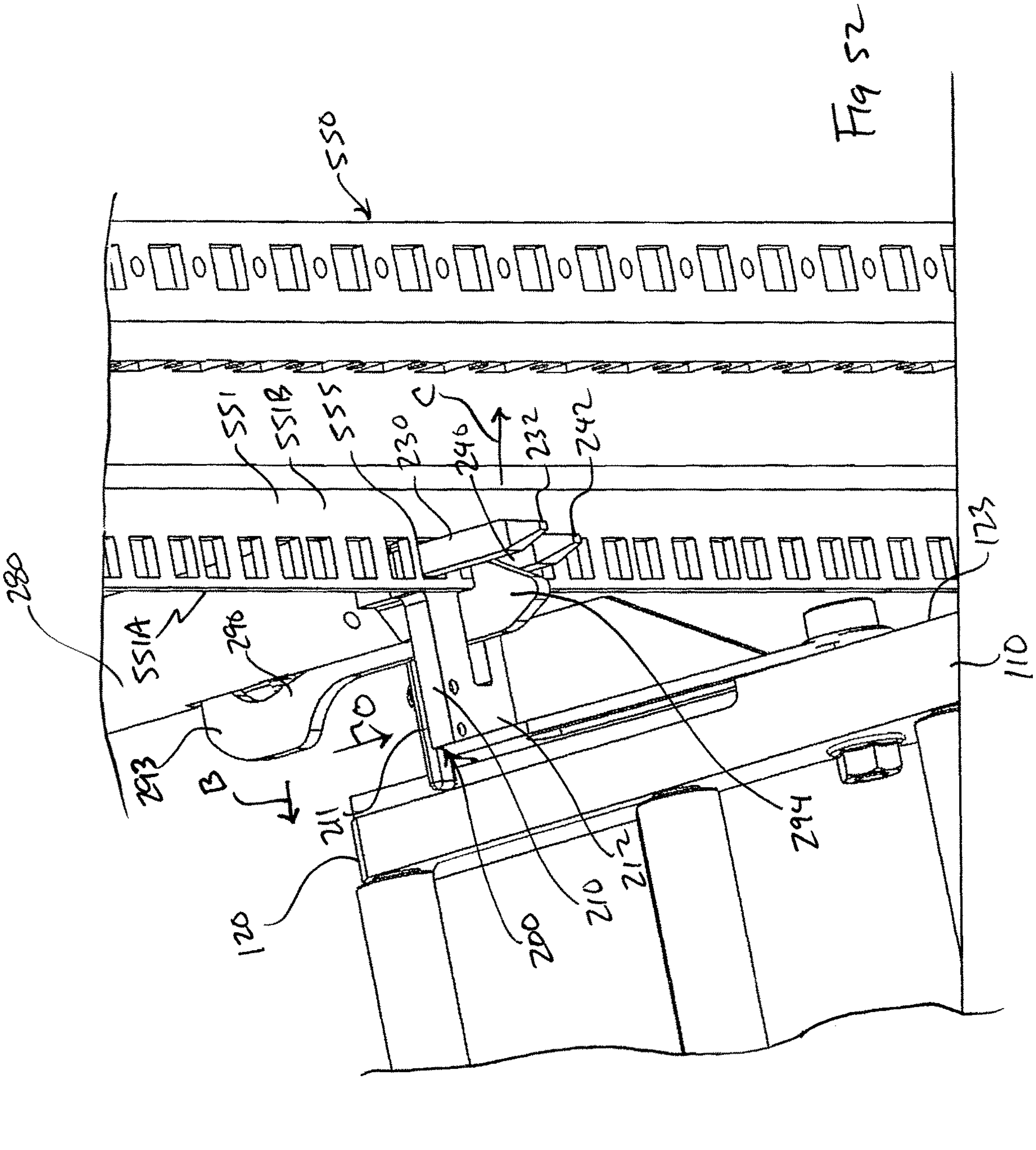
Figure 53:
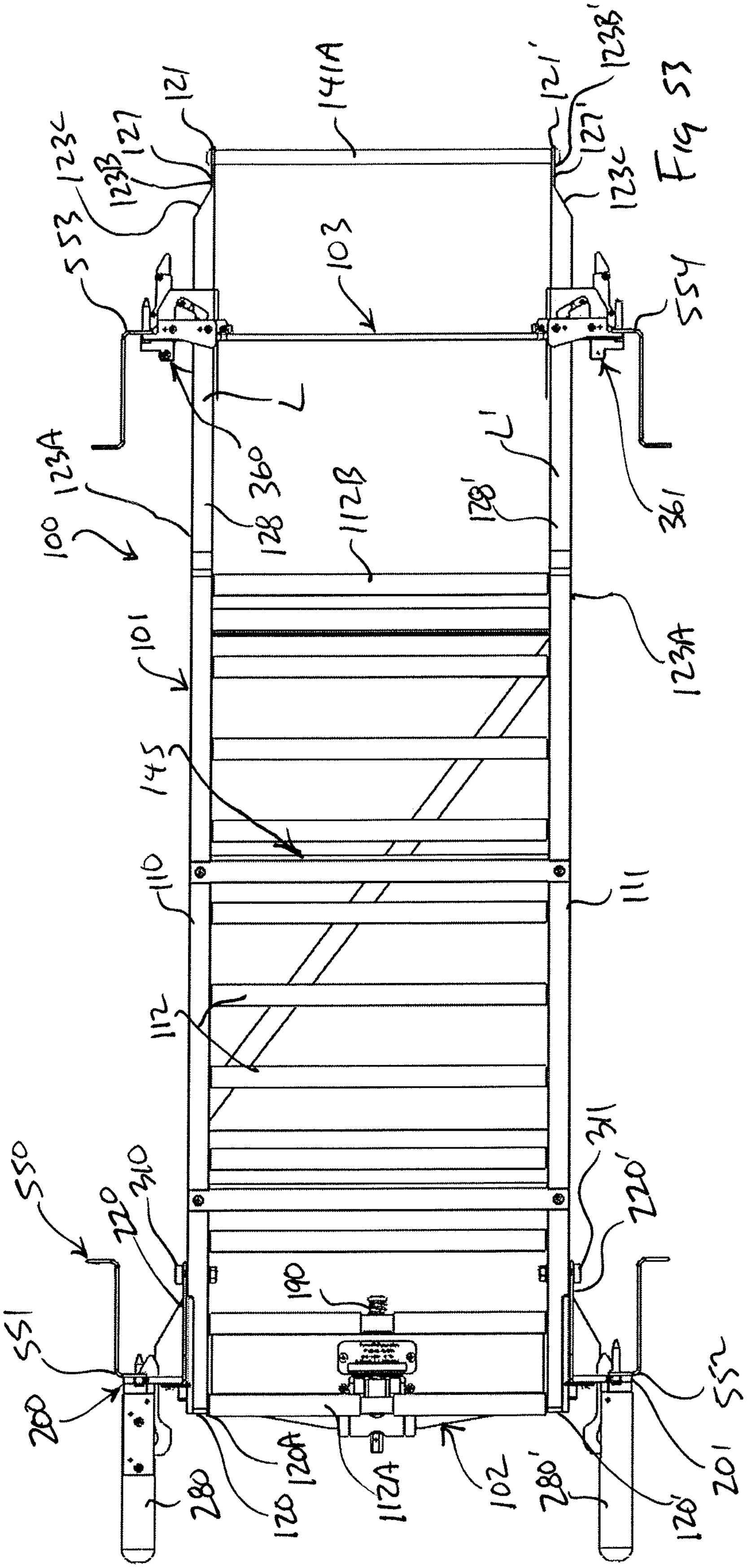
Figure 54:
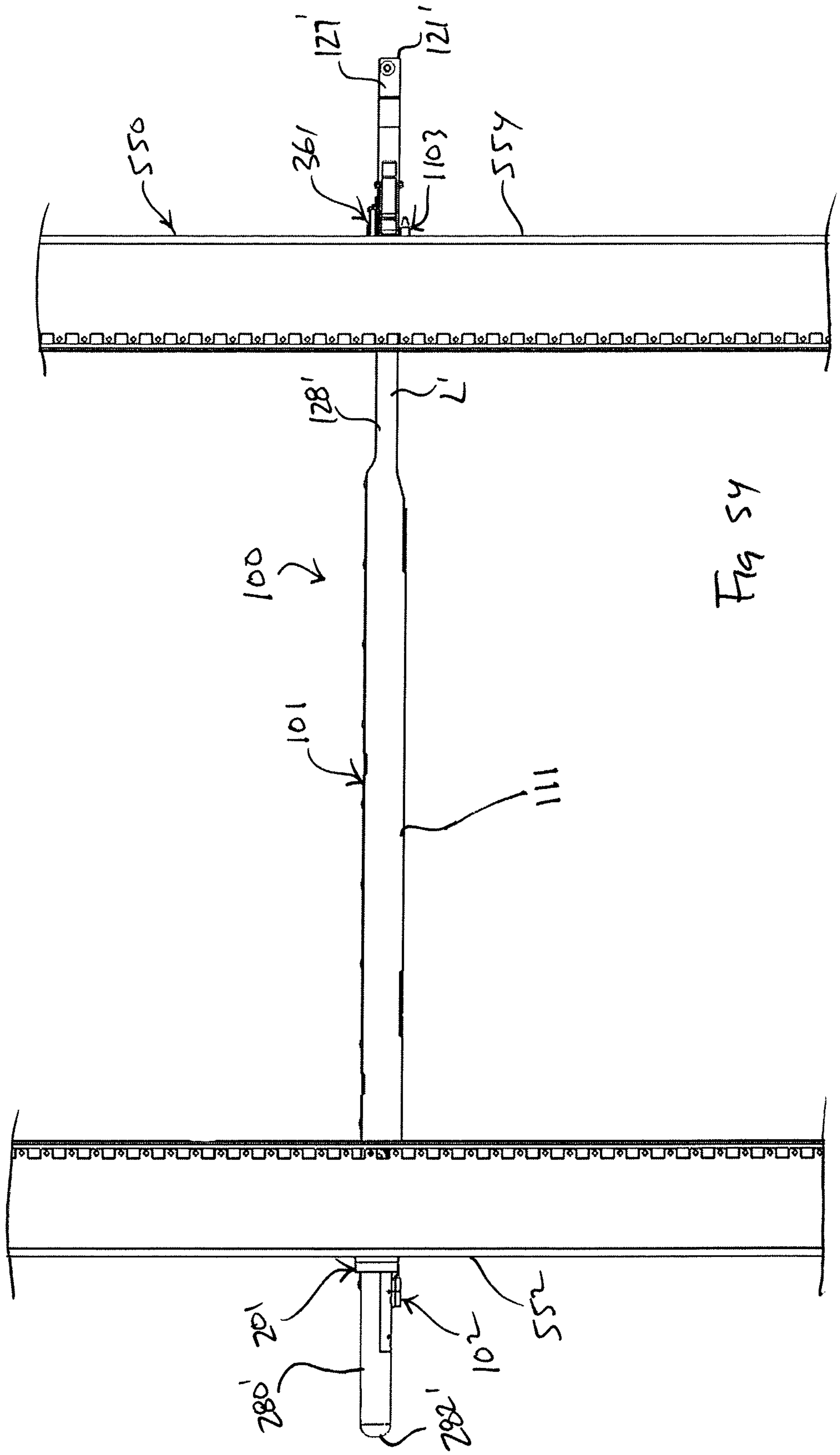
FIG. 54 is a right side elevation view of the embodiment of FIG. 39.
Figure 55:
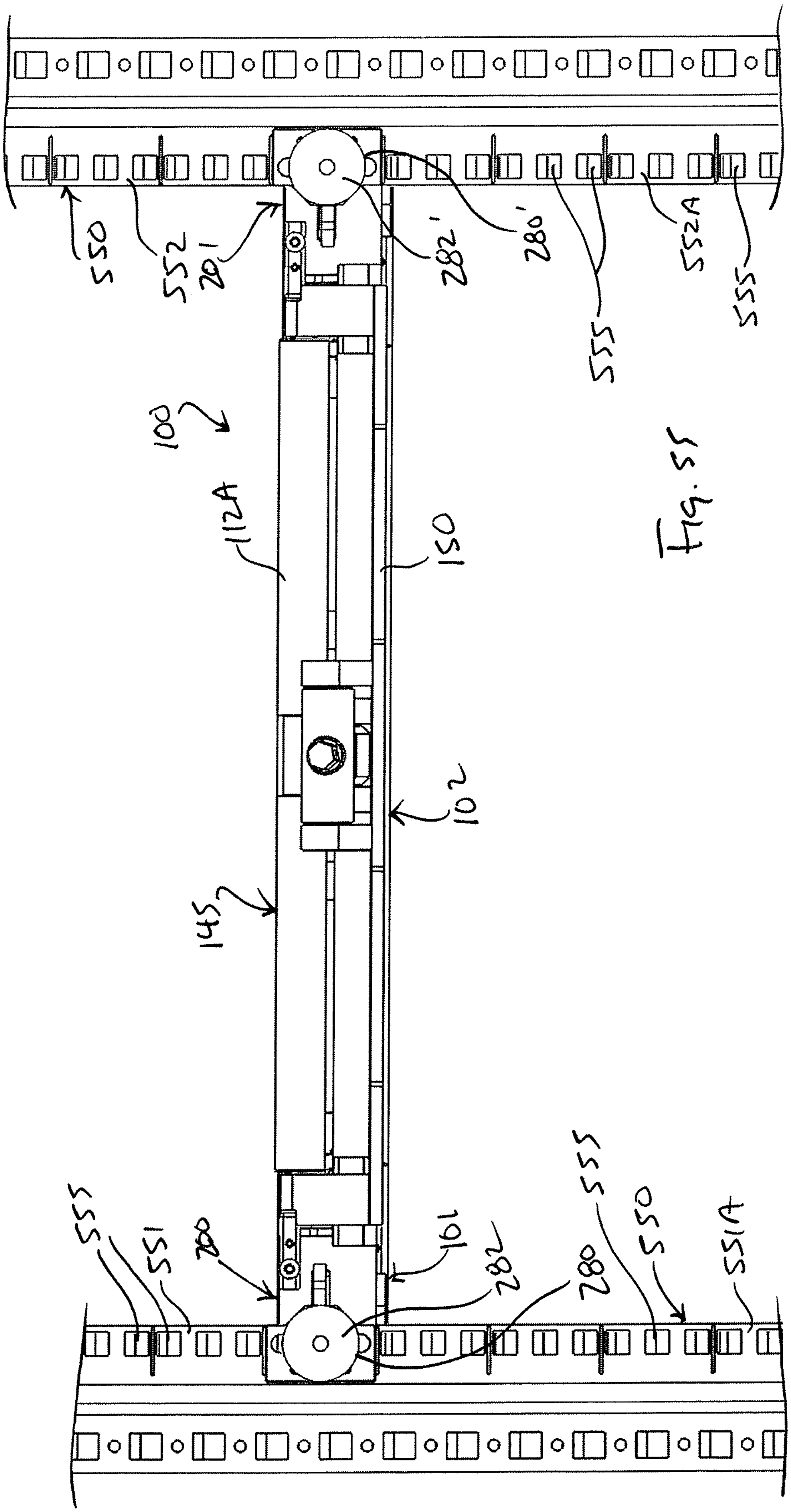
FIG. 55 is a front elevation view of the embodiment of FIG. 39.
Figure 56:
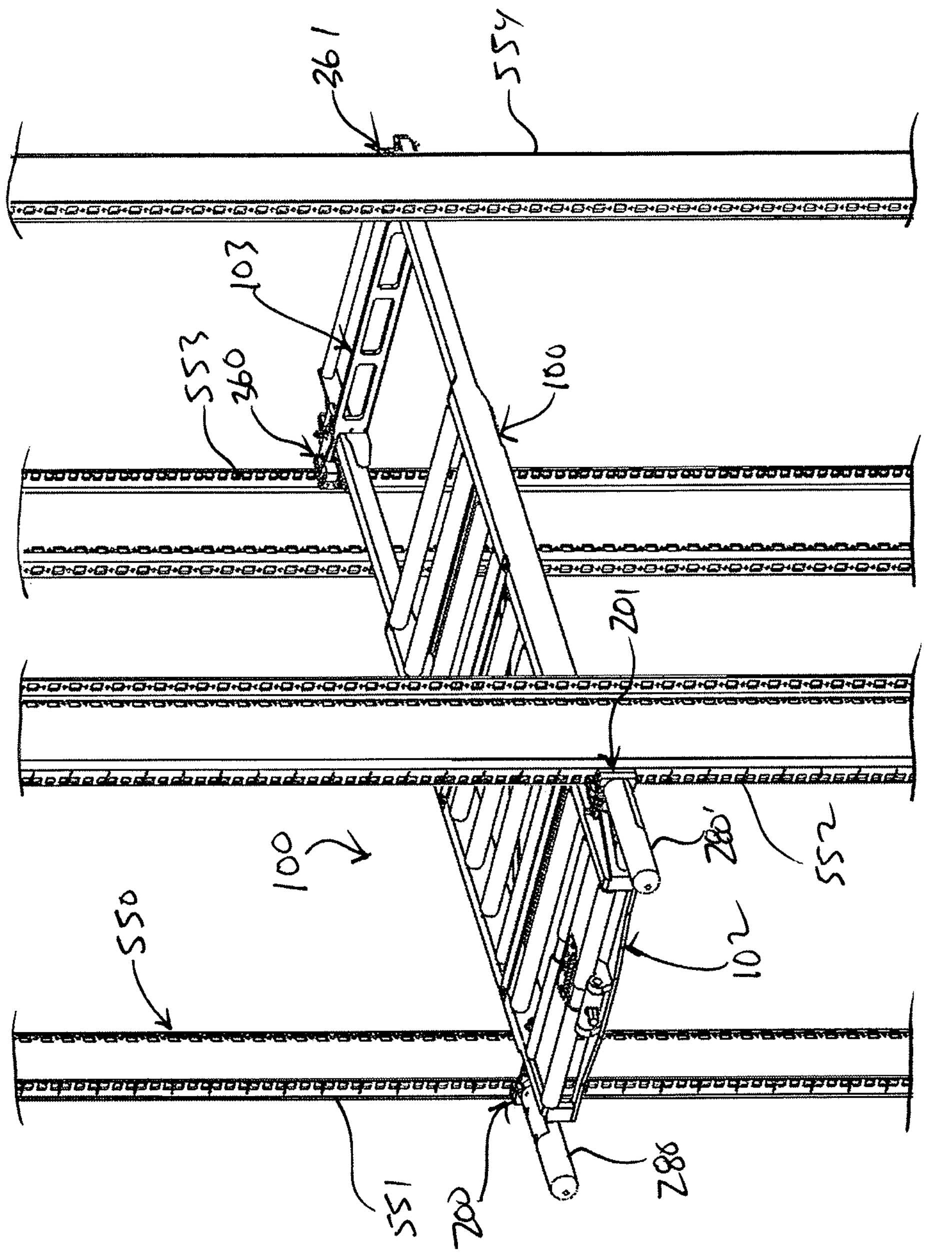
FIG. 56 is a view similar to FIG. 39 illustrating the shelf adjusted to the raised position corresponding to the raising position of the drive member.
Figure 57:
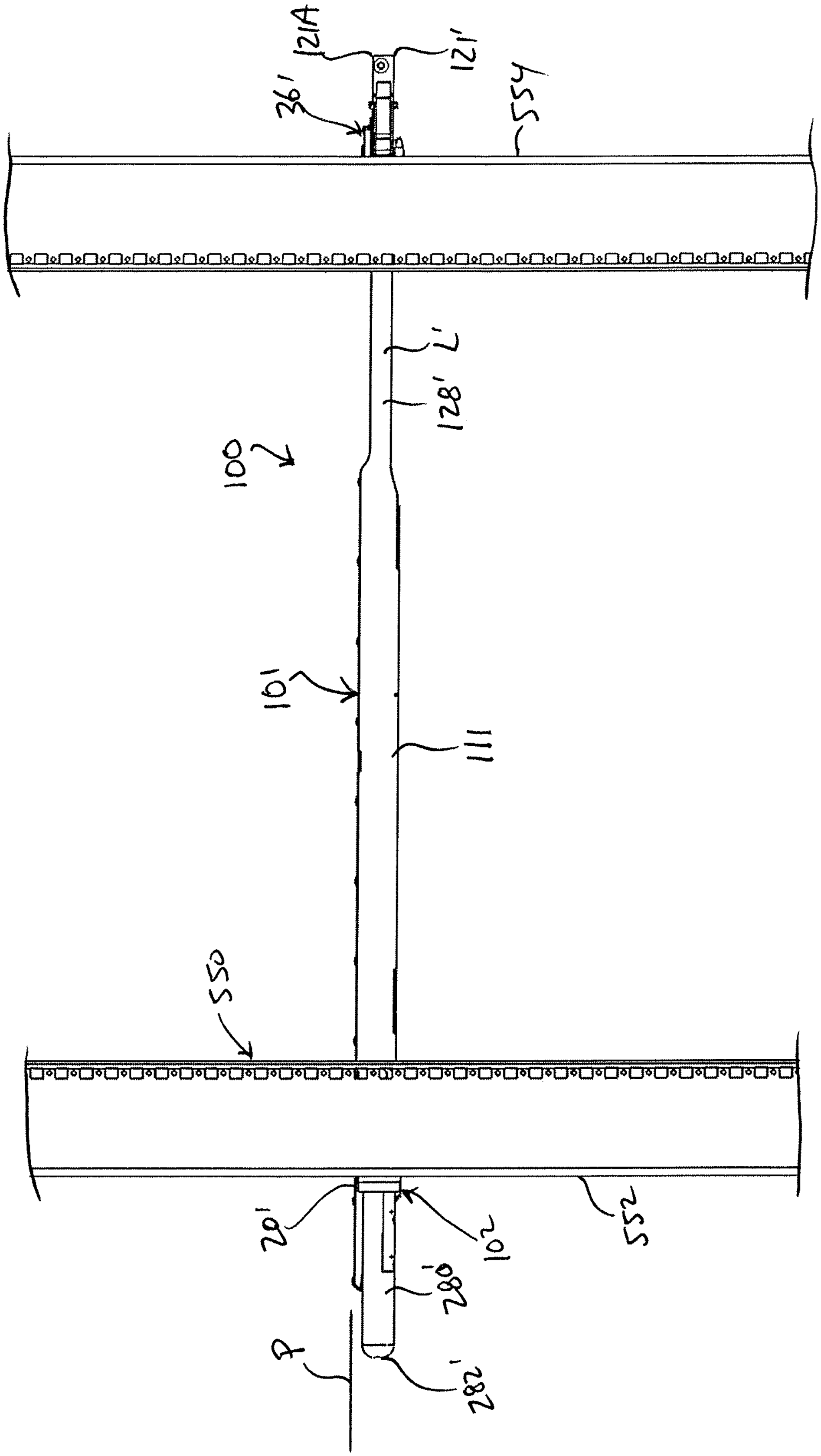
FIG. 57 is a right side elevation view of the embodiment of FIG. 56.
Figure 58:
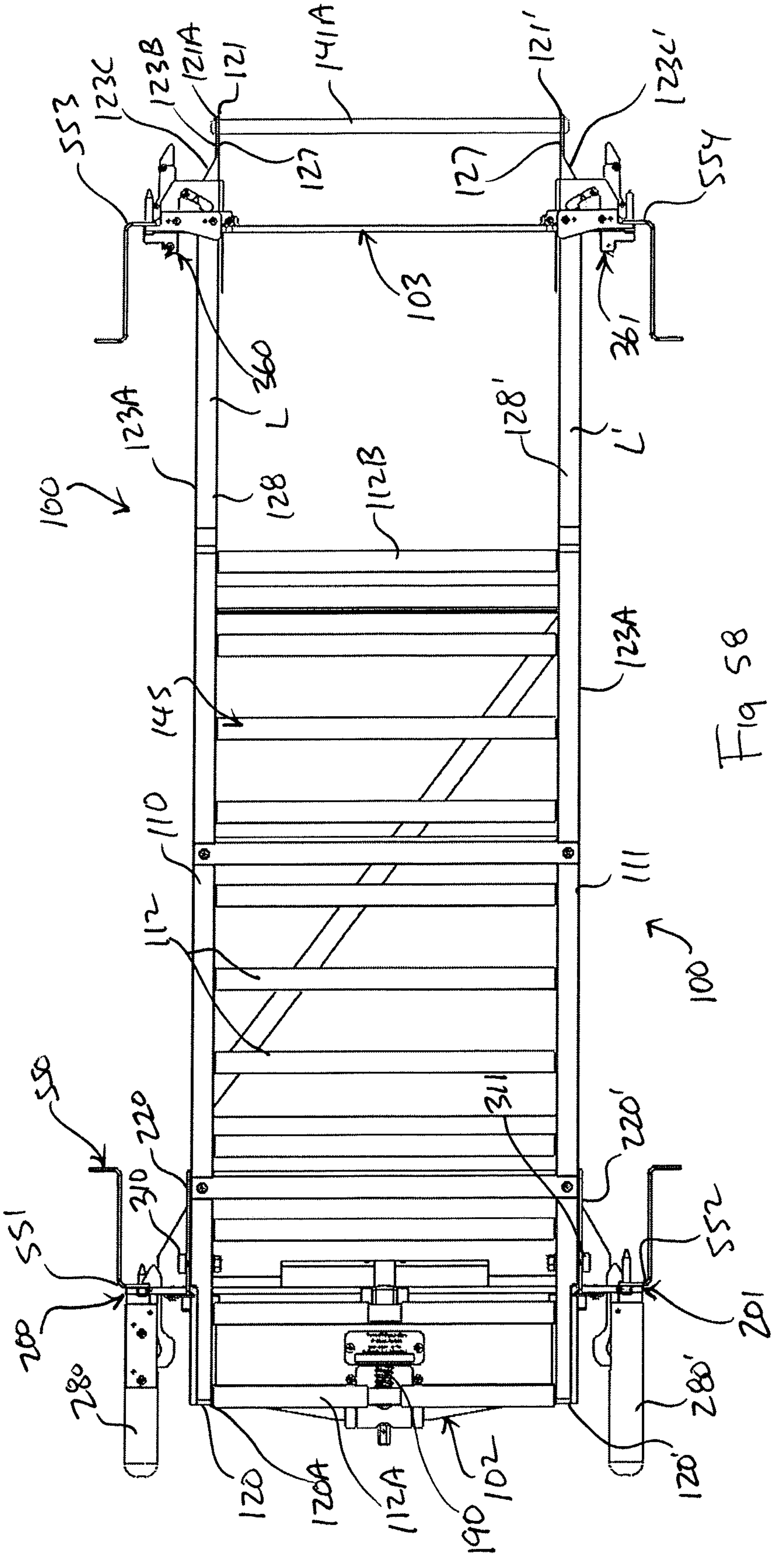
FIG. 58 is a top plan view of the embodiment of FIG. 56.
Figure 59:
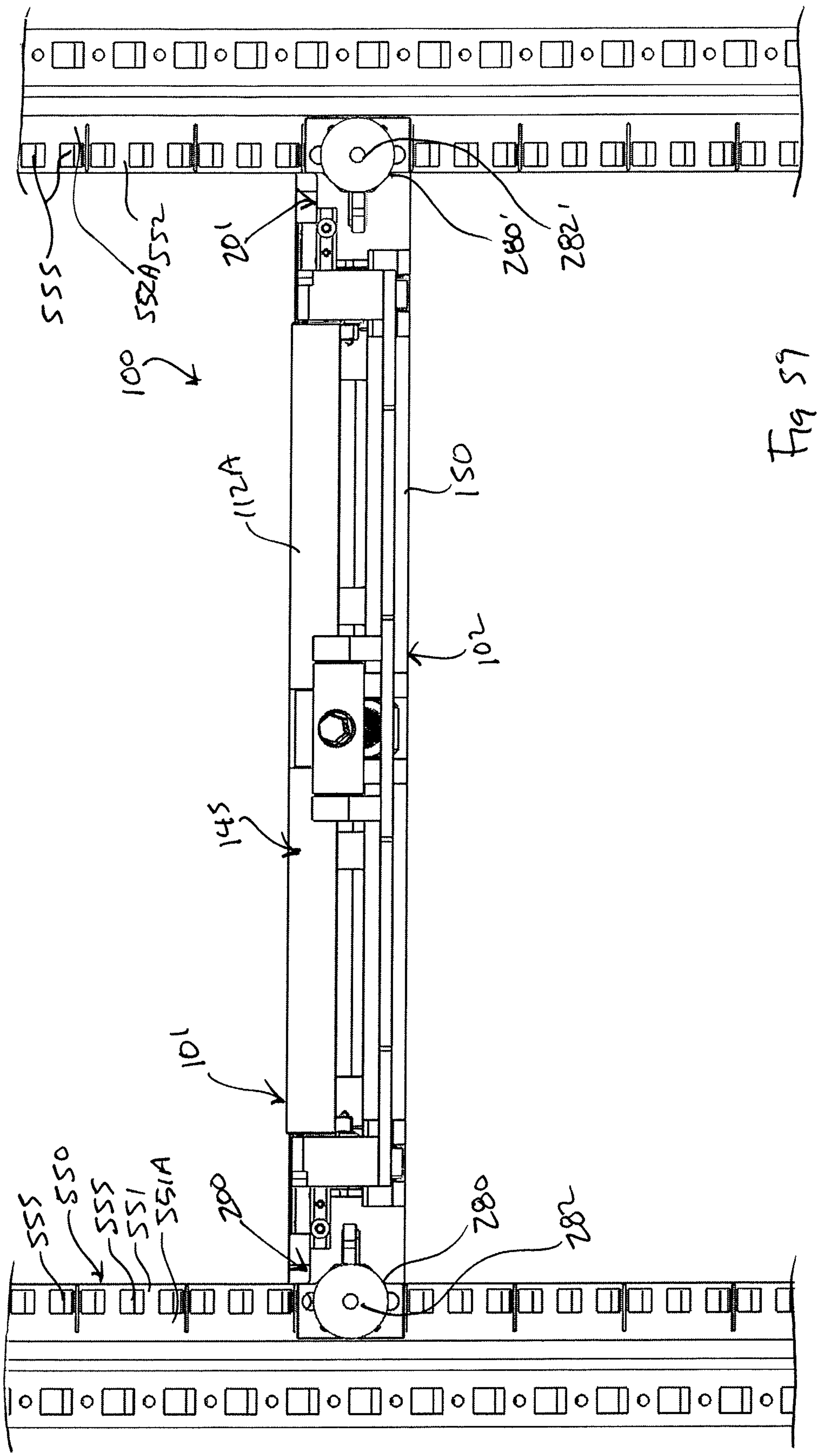
FIG. 59 is a front elevation view of the embodiment of FIG. 56.

At this point, handle 293 is released, enabling spring 298 in FIGS. 12 and 13 to return lever arm 290 to is closed position in FIG. 52. When lever arm 290 returns to its closed position in FIGS. 52 and 53 from its open position in FIG. 51, handle 293 pivots inwardly in the direction of arrow B toward proximal extremity 120 away from slot 291 and latch 294 pivots outwardly in the direction of arrow C away from proximal extremity 120 and toward and against front rack post 551 hooking over rear surface 551B of front rack post 551 between upper and lower pins 230 and 240 in FIG. 52 longitudinally opposing rear surface 212 of block 210 to thereby capture or otherwise entrap front rack post 551 between latch 294 hooked over surface 551B of front rack post 551 between upper and lower pins 230 and 240, and the longitudinally-opposing rear surface 212 of block 210 immediately to the front of opposing front surface 551A of front rack post 551. The reception of vertically-aligned upper and lower pins 230 and 240 through the corresponding holes 555 of front rack post 551 and the entrapment of front rack post 551 between longitudinally opposed latch 294 and rear surface 212 of block 210 on either side of front rack post 511 automatically lock and immobilize fixture 200 to front rack post 551 and disable upper and lower pins 230 and 240 from withdrawing, and disengaging, from the corresponding holes 555 to releasably secure and immobilize fixture 200 to front rack post 551. Installation of fixture 201 onto front rack post 552 happens concurrently with the installation of fixture 200 onto rear front rack post 551, thereby completing the installation of shelf assembly 100 on rack 550 in FIGS. 39 and 53-59.

To detach front support assembly 102 from front rack posts 551 and 552, the described operations of installing fixtures 200 and 201 onto front rack posts 551 and 552 need only be reversed.

According to the above description, lever arms 290 and 290' are actuated by hand, first into their open positions to enable the respect latch ends 294 and 294' to translate past the respective front rack posts 551 and 552, after which levers 290 and 290' are released, enabling the tension levers 290 and 290' to snap from their open positions to their closed positions to hook latch ends 294 and 294' onto the respective front rack posts 551 and 552. If desired latch ends 294 and 294' can be pushed rearwardly against the respective front rack posts 551 and 552 with a force sufficient to displace the tensioned lever arms 290 from their closed positions to their open positions to enable latch ends 294 and 294' to slide against and beyond the respective front rack posts 551 and 552. Upon becoming free of front rack posts 551 and 552, tensioned lever arms 290 and 290' will automatically snap from their open positions to their closed positions to automatically hook the respective latch ends 294 and 294' to the respective front rack posts 551 and 552.

Referring in relevant part to FIGS. 39 and 53-59, front rack posts 551 and 552 and rear rack posts 553 and 554 are supported and extend vertically upright, front support assembly 102 is horizontal relative to posts 551-554 and extends between and is secured detachably and immovably to front rack posts 551 and 552, rear support assembly 103 is horizontal relative to posts 551-554 and extends between and is secured detachably and immovably to rear rack posts 553 and 554, and shelf 101 is supported horizontally relative to rack posts 551-554 by front support assembly 102 and rear support assembly 103 between front rack posts 551 and 552 and rear rack posts 553 and 554. In the installation of shelf assembly 100 to equipment rack 550, slides 360 and 361 of rear support assembly 103 are concurrently secured detachably and immovably to rear rack posts 553 and 554, respectively, fixtures 200 and 201 of front support assembly 102 are concurrently secured detachably and immovably to front rack posts 551 and 552, respectively, and shelf 101 is supported by front support assembly 102 at the proximal extremity 120A of shelf 101 and by rear support assembly 103 at the distal extremity 121A of shelf 101. Rail 110 is coupled between slide 360 of rear support assembly 103 and fixture 200 of front support assembly 102 on one side of shelf 101, and extends along the insides of front rack post 551 and rear rack post 553 between fixture 200 and slide 360. Rail 111 is coupled between slide 361 of rear support assembly 103 and fixture 201 of front support assembly 102 on the opposite side of shelf 101, and extends along the insides of front rack post 552 and rear rack post 554 between fixture 201 and slide 361. Rails 110 and 111 are axially-spaced apart, and equipment can be placed atop the parallel, spaced-part rollers extending between and concurrently rotated to the respective rails 110 and 111 for supporting the equipment while it is being conventionally secured to rack posts 551-554 of equipment rack 550. Rotation of the drive member of shelf assembly 100, threaded shank 190, in opposite directions imparts corresponding relative movement of front brace 150 and shelf 101 secured thereto in reciprocal directions indicated by double arrow A relative to rear brace 160 between the rearward position of shelf 101 corresponding to the lowered position of proximal extremity 120A of shelf 101 in FIGS. 39 and 53-55 in turn corresponding to the at least horizontal position of shelf 101 between front support assembly 102 and rear support assembly 103, and the forward position of shelf 101 corresponding to the raised position of proximal extremity 120A shelf 101 in FIGS. 56-59 in turn corresponding to the inclined position of shelf 101 between front support assembly 102 and rear support assembly 103. Furthermore, rotation of the drive member of shelf assembly 100, threaded shank 190, in opposite directions imparts corresponding relative movement of front brace 150 and shelf 101 secured thereto in reciprocal directions indicated by double arrow A relative to rear brace 160 between the rearward position of shelf 101 corresponding to the lowered positions of proximal extremities 120 and 120' of rails 110 and 111, respectively, in FIGS. 39 and 53-55 in turn corresponding to at least horizontal position of rails 110 and 111 between front support assembly 102 and rear support assembly 103, and the forward position of shelf 101 corresponding to the raised positions of proximal extremities 120 and 120' of rails 110 and 111, respectively, in FIGS. 56-59 in turn corresponding to inclined position of rails 110 and 111 between front support assembly 102 and rear support assembly 103.

Rails 110 and 111 are configured to reciprocate rearwardly and forwardly in the directions of double arrow A relative to fixtures 200 and 201 of front support assembly 102 attached to front rack posts 551 and 552, and slides 360 and 361 attached to rear rack posts 553 and 554. Again, there is sufficient play between slides 360 and 361 and rails 110 and 111, respectively, to enable proximal extremities 120 and 120' of rails 110 and 111 at proximal extremity 120A of shelf 101 to raise and lower relative to fixtures 200 and 201 in response to movement of front brace 150 and shelf 101 secured thereto in reciprocal directions indicated by double arrow A relative to rear brace 160 between the rearward position of shelf 101 corresponding to the lowered position of proximal extremity 120A of shelf 101 in FIGS. 39 and 53-55, and the forward position of shelf 101 corresponding to the raised position of proximal extremity 120A shelf 101 in FIGS. 56-59. Shelf 101, including each of its rails 110 and 111, supports for supporting loads, are at least horizontal when shelf 101 is in its rearward position of shelf 101 corresponding to the lowered position of proximal extremity 120A of shelf 101 for supporting equipment thereon, and are inclined downwardly from proximal extremity 120A of shelf 101 to distal extremity 121A when shelf 101 is in the forward position of shelf 101 corresponding to the raised position of proximal extremity 120A shelf 101 to allow easy access to the top or bottom of rack mounted equipment.

§ V. CONCLUSION

Those having regard for the art will readily appreciate that improved rail assemblies, and an improved shelf assembly 100 are disclosed, which are each configured to be installed horizontally at a chosen elevation to a standard equipment rack as for a support, and each being inexpensive, easy to install onto the rack without the use of separate tools and without having to modify it or the equipment rack and without the need for separate bolts or other mechanical fasteners, thereby being “boltless” or otherwise “fastener-less” according to this disclosure. The described shelf assembly 100 includes shelf 101, and front and rear support assemblies 102 and 103 mounted at either end of shelf 101 for supporting objects. Shelf assembly 100 can be installed on equipment rack 550, and equipment can slide into the rack along conveyor 145, which support it. Shelf 101 can move between its at least lowered and raised/tilted configurations as needed to assist with loading equipment onto rack 550. Shelf 101 and front support assembly 102 can be configured to enable shelf 101, including each of its rails 110 and 111, to be lowered slightly beyond the lowered to assisting a user with installing and withdrawing shelf assembly 100 relative to a rack depending on space constraints. When in place, the equipment can be secured to equipment rack 550 and shelf assembly 100 removed or left in in place to fully support the equipment. Rail 110 is connected between fixture 200 of front support assembly 102 and slide 360 of rear support assembly 103, which together form a rail assembly on one side of shelf 101, and rail 111 is connected between fixture 201 of front support assembly 102 and slide 361 of rear support assembly 103, which together form a rail assembly on the opposed side of shelf 101. Rails 110 and 111 are identical, fixtures 200 and 201 are identical, and slides 360 and 361 are identical. In shelf assembly 100, fixtures 200 and 201 are interconnected by rear brace 160 of front support assembly 102, and slides 360 and 361 are interconnected by brace 350 of rear support assembly 103. Again, the combination of rail 110 and its attached fixture 200 and/or slide 360, and the combination of rail 111 and its attached fixture 201 and/or slide 361 form exemplary rail assembly embodiments, each of which can be used with shelves of varying configurations. In this embodiment, the described rail assemblies support conveyor 145, which are the disclosed rollers 112. Although shelf 101 incorporates two exemplary rail assemblies, it can include less or more of the described rail assemblies depending on particular rack configurations and mounting requirements. Various embodiments of the invention, rail assemblies and shelf assemblies, are summarized below.

According to the principle of the invention, one rail assembly includes rail 110 mounted to slide 360 including a first detent structure, which consists of upper and lower pins 390 and 400. Rail 110 is configured to reciprocate longitudinally relative to slide 360, and slide 360 is adjustable from the rail-locking position to the post-locking position. When rail 110 occupies the stowage position relative to slide 360, slide 360 is configured to restrain rail 110 from reciprocating longitudinally relative to slide 360 when slide 360 occupies the rail-locking position, and to enable rail 110 to reciprocate longitudinally relative to slide 360 when slide 360 occupies the post-locking position. When rail 110 occupies the stowage position and slide 360 occupies the rail-locking position, the first detent structure is configured to engage a first complemental detent structure, corresponding holes 555, of a first rack post, rear rack post 553 in this embodiment, and slide 360 is configured engage rear rack post 553 and move from the rack-locking position to the post-locking position for entrapping rear rack post 553 and disabling the first detent structure from disengaging from the first complemental detent structure for thereby automatically immobilizing slide 360 to rear rack post 553, all automatically in response to advancement of slide 360 to against rear rack post 553 and subsequent advancement of rail 110 longitudinally relative to slide 360 from the stowage position to an advanced position. Fixture 200 is mounted to rail 110. Fixture 200 includes a second detent structure, upper and lower pins 230 and 240, and is adjustable from an open position to a closed position. When the first detent structure is engaged to the first complemental detent structure of the rear rack post and slide 360 occupies the post-locking position, the second detent structure is configured to engage a second complemental detent structure, corresponding holes 555, of a second rack post, front rack post 551 in this embodiment, in response to advancement of rail 110 relative to slide 360 to at least the advanced position, and fixture 200 is configured to move from the open position to the closed position when rail 110 is in at least the advanced position relative to the slide 360 and the second detent structure is engaged to the second complemental detent structure for entrapping front rack post 551 and disabling the second detent structure from disengaging from the second complemental detent structure for thereby automatically immobilizing fixture 200 to front rack post 551. Rail 110 is mounted to fixture 200 for movement between a lowered position corresponding to at least a horizontal position of rail 110 between fixture 200 and slide 360 and a raised position corresponding to an inclined position of rail 110 between fixture 200 and slide 360. A drive member is operatively coupled between the rail 110 and the fixture 200, whereby rotation of the drive member imparts corresponding movement of the rail 110 between the lowered position and the raised position. Rail 110 is configured to reciprocate longitudinally relative to slide 360 and fixture 200 in response to movement of rail 110 between the lowered position and the raised position. The other rail assembly, the combination of rail 111, fixture 201, and slide 361, is identical to the rail assembly of rail 110, fixture 200, and slide 360.

According to another embodiment of the invention, a shelf assembly 100 includes rail assemblies on either side of shelf 101 for supporting objects. The rail assemblies are axially spaced from one another. One rail assembly includes rail 110 mounted to slide 360 including a first detent structure, disclosed herein as upper and lower pins 390 and 400. Rail 110 is configured to reciprocate longitudinally relative to slide 360, and slide 360 is adjustable from a rail-locking position to a post-locking position. When rail 110 occupies a stowage position relative to slide 360, slide 360 is configured to restrain rail 110 from reciprocating longitudinally relative to slide 360 when slide 360 occupies the rail-locking position, and to enable rail 110 to reciprocate longitudinally relative to slide 360 when slide 360 occupies the post-locking position. When rail 110 occupies the stowage position relative to slide 360 and slide 360 occupies the rail-locking position, the first detent structure is configured to engage a first complemental detent structure, corresponding holes 555, of a first rack post and slide 360 is configured engage rear rack post 553 and move from the rack-locking position to the post-locking position for entrapping rear rack post 553 and disabling the first detent structure from disengaging from the first complemental detent structure for thereby automatically immobilizing slide 360 to rear rack post 553, all automatically in response to advancement of slide 360 to against rear rack post 553 and subsequent advancement of rail 110 longitudinally relative to slide 360 from the stowage position to an advanced position. Fixture 200 is mounted to rail 110. Fixture 200 includes a second detent structure, disclosed as upper and lower pins 230 and 240, and is adjustable from an open position to a closed position. When the first detent structure is engaged to the first complemental detent structure of rear rack post 553 and slide 360 occupies the post-locking position, the second detent structure is configured to engage a second complemental detent structure, corresponding holes 555, of a second rack post, front rack posts 551 in this embodiment, in response to advancement of rail 110 relative to slide 360 to at least the advanced position, and fixture 200 is configured to move from the open position to the closed position when rail 110 is in at least the advanced position relative to slide 360 and the second detent structure is engaged to the second complemental detent structure for entrapping front rack post 551 and disabling the second detent structure from disengaging from the second complemental detent structure for thereby automatically immobilizing fixture 200 to front rack post 551. Rail 110 is mounted to fixture 200 for movement between a lowered position corresponding to at least a horizontal position of rail 110 between fixture 200 and slide 360 and a raised position corresponding to an inclined position of rail 110 between fixture 200 and slide 360. A drive member, the described threaded shank 190, is operatively coupled between rail 110 and fixture 200, whereby rotation of the drive member imparts corresponding movement of rail 110 between the lowered position and the raised position. Rail 110 is configured to reciprocate longitudinally relative to slide 360 and fixture 200 in response to movement of rail 110 between the lowered position and the raised position. The other rail assembly, the combination of rail 111, fixture 201, and slide 361, is identical to the rail assembly of rail 110, fixture 200, and slide 360. Shelf 101 includes a conveyor 145 supported by the rail assemblies.

According to yet another embodiment of the invention, a rail assembly includes rail 110 mounted to slide 360 including a first detent structure, the described upper and lower pins 390 and 400, lock 440 configured to move from a rail-locking position to a post-locking position, and switch 480 configured to move from a closed position for securing the lock 440 in the rail-locking position to an open position for releasing the lock 440 from the rail-locking position, and rail 110 is configured to reciprocate longitudinally relative to slide 360. When rail 110 occupies a stowage position relative to slide 360, lock 440 is configured to restrain rail

110 from reciprocating longitudinally relative to slide 360 when lock 440 occupies the rail-locking position and switch 480 occupies the closed position for securing lock 440 in the rail-locking position for thereby disabling lock 440 from moving from the rail-locking position to the post-locking position, and to enable rail 110 to reciprocate longitudinally relative to slide 360 when lock 440 occupies the rail-locking position and switch 480 occupies the open position for releasing lock 440 from the rail-locking position for enabling lock 440 to move from the rail-locking position to the post-locking position. When rail 110 occupies the stowage position relative to slide 360, lock 440 occupies the rail-locking position, and switch 480 occupies the closed position securing lock 440 in the rail-locking position, the first detent structure is configured to engage a first complemental detent structure, corresponding holes 555, of a first rack post, rear rack post 553 in this example, and switch 480 is configured to engage rear rack post 553 and move from the closed position to the open position, all automatically in response to advancement of slide 360 to an installed position to against rear rack post 553, and lock 440 is configured to interact with rail 110 to move from the rail-locking position to the post-locking position for cooperating with slide 360 for entrapping rear rack post 553 for disabling the first detent structure from disengaging from the first complemental detent structure for automatically immobilizing slide 360 to rear rack post 553, all automatically in response to advancement of rail 110 longitudinally from the stowage position to an advanced position relative to slide 360. Lock 440 is tensioned to the rail-locking position by at least one spring 450, and switch 480 is tensioned to the closed position by at least one spring 500. An engagement element of lock 440, pin 445, is configured to interfere with a complemental engagement element of switch 480, notch 488, for securing lock 440 in the rail-locking position, when lock 440 occupies rail-locking position and switch 480 occupies the closed position. The engagement element of lock 440 is configured to withdraw from the complemental engagement element of switch 480 for releasing lock 440 from the rail-locking position, when lock 440 occupies the rail-locking position and switch 480 occupies the open position. A fixture 200 is mounted to rail 110 and includes a second detent structure, the described upper and lower pins 230 and 240. Latch 294 is mounted to fixture 200. When the first detent is engaged to the first complemental detent of rear rack post 553, the second detent structure is configured to engage a second complemental detent structure, corresponding holes 555, of a second rack post, front rack post 551 in this embodiment, in response to advancement of rail 110 relative to slide 360 to at least the advanced position. Latch 294 is configured to move from an open position to a closed position when rail 110 is in at least the advanced position relative to slide 360 and the second detent structure is engaged to the second complemental detent structure for cooperating with fixture 200 for entrapping front rack post 551 and disabling the second detent structure from disengaging from the second complemental detent structure for thereby automatically immobilizing fixture 200 to front rack post 551. Latch 294 is tensioned to the closed position of latch 294 by at least one spring 298. Rail 110 is mounted to fixture 200 for movement between a lowered position corresponding to at least a horizontal position of rail 110 between fixture 200 and slide 360 and a raised position corresponding to an inclined position of rail 110 between fixture 200 and slide 360. A drive member, the described threaded shank 190, is operatively coupled between rail 110 and fixture 200, whereby rotation of the drive member imparts corresponding movement of rail 110 between the lowered position and the raised position. Rail 110 is configured to reciprocate longitudinally relative to slide 360 and fixture 200 in response to movement of rail 110 between the lowered position and the raised position. The other rail assembly, the combination of rail 111, fixture 201, and slide 361, is identical to the rail assembly of rail 110, fixture 200, and slide 360.

According to still another embodiment, shelf assembly includes rail assemblies on either side of shelf 101 for supporting objects. Rail assemblies are axially spaced from one another. One rail assembly includes rail 110 mounted to slide 360 including a first detent structure, the described upper and lower pins 390 and 400, lock 440 configured to move from a rail-locking position to a post-locking position, and switch 480 configured to move from a closed position for securing lock 440 in the rail-locking position to an open position for releasing lock 440 from the rail-locking position, and rail 110 is configured to reciprocate longitudinally relative to slide 360. When rail 110 occupies a stowage position relative to slide 360, lock 440 is configured to restrain rail 110 from reciprocating longitudinally relative to slide 360 when lock 440 occupies the rail-locking position and switch 480 occupies the closed position for securing lock 440 in the rail-locking position for thereby disabling lock 440 from moving from the rail-locking position to the post-locking position, and to enable rail 110 to reciprocate longitudinally relative to slide 360 when lock 440 occupies the rail-locking position and switch 480 occupies the open position for releasing lock 440 from the rail-locking position for thereby enabling lock 440 to move from the rail-locking position to the post-locking position. When rail 110 occupies the stowage position relative to slide 360, lock 440 occupies the rail-locking position, and switch 480 occupies the closed position securing lock 440 in the rail-locking position, the first detent structure is configured to engage a first complemental detent structure, corresponding holes 555, of a second rack post, rear rack post 553 in this embodiment, and switch 480 is configured to engage rear rack post 553 and move from the closed position to the open position, all automatically in response to advancement of slide 360 to an installed position to against rear rack post 553, and lock 440 is configured to interact when rail 110 to move from the rail-locking position to the post-locking position for cooperating with slide 360 for entrapping rear rack post 553 and disabling the first detent structure from disengaging from the first complemental detent structure for thereby automatically immobilizing slide 360 to rear rack post 553, all automatically in response to advancement of rail 110 longitudinally relative to slide 360 from the stowage position to an advanced position. Lock 440 is tensioned to the rail-locking position by at least one spring 450, and switch 480 is tensioned to the closed position by at least one spring 500. An engagement element, pin 445, of lock 440 is configured to interfere with a complemental engagement element, notch 488, of switch 480 for securing lock 440 in the rail-locking position, when lock 440 occupies the rail-locking position and switch 480 occupies the closed position. The engagement element of lock 440 is configured to withdraw from the complemental engagement element of switch 480 for releasing lock 440 from the rail-locking position, when lock 440 occupies the rail-locking position and switch 480 occupies the open position. A fixture 200 is mounted to rail 110 and includes a second detent structure. Latch 294 is mounted to fixture 200. When the first detent engaged to the first complemental detent of rear rack post 553, the second detent structure is configured to engage a second complemental detent structure, corresponding holes 555, of a second rack post, front rack post 551 in this embodiment, in response to advancement of rail 110 relative to slide 360 to at least the advanced position. Latch 294 is configured to move from an open position to a closed position when rail 110 is in at least the advanced position relative to slide 360 and the second detent structure is engaged to the second complemental detent structure for cooperating with fixture 200 for entrapping front rack post 551 and disabling the second detent structure from disengaging from the second complemental detent structure for thereby automatically immobilizing fixture 200 to front rack post 551. Latch 294 is tensioned to the closed position of latch 294 by at least one spring 298. Rail 110 is mounted to fixture 200 for movement between a lowered position corresponding to at least a horizontal position of rail 110 between fixture 200 and slide 360 and a raised position corresponding to an inclined position of rail 110 between fixture 200 and slide 360. A drive member, the described threaded shank 190, is operatively coupled between shelf 101 and fixture 200, whereby rotation of the drive member imparts corresponding movement of rail 110 between the lowered position and the raised position. Rail 110 is configured to reciprocate longitudinally relative to slide 360 and fixture 200, respectively, in response to movement of rail 110 between the lowered position and the raised position. Shelf includes a conveyor 145 supported by rail 110 assemblies. The other rail assembly, the combination of rail 111, fixture 201, and slide 361, is identical to the rail assembly of rail 110, fixture 200, and slide 360.

According to the principle of the invention, a rail 110 assembly includes a rail 110 mounted to a slide 360 including a first detent structure, upper and lower pins 390 and 400, lock 440, including follower 444 and abutment 446, configured to move from a rail-locking position to a post-locking position, and switch 480 configured to move from a closed position for securing lock 440 in the rail-locking position to an open position for releasing lock 440 from the rail-locking position, and rail 110 includes cam surface 123C and is configured to reciprocate longitudinally relative to slide 360. When rail 110 occupies a stowage position relative to slide 360, lock 440 is configured to restrain rail 110 from reciprocating longitudinally relative to slide 360 by an interference between follower 444 and cam surface 123C when lock 440 occupies the rail-locking position and switch 480 occupies the closed position for securing lock 440 in the rail-locking position for thereby disabling lock 440 from moving from the rail-locking position to the post-locking position, and to enable rail 110 to reciprocate longitudinally relative to slide 360 without interference from between follower 444 and cam surface 123C when lock 440 occupies the rail-locking position and switch 480 occupies the open position for releasing lock 440 from the rail-locking position for thereby enabling lock 440 to move from the rail-locking position to the post-locking position. When rail 110 occupies the stowage position relative to slide 360, lock 440 occupies the rail-locking position, and switch 480 occupies the closed position securing lock 440 in the rail-locking position, the first detent structure is configured to engage a first complemental detent structure, corresponding holes 555, of a first rack post, rear rack post 553 in this embodiment, and switch 480 is configured to engage rear rack post 553 and move from the closed position to the open position, all automatically in response to advancement of slide 360 to an installed position to against rear rack post 553, and follower 444 is configured to follow cam surface 123C to move lock 440 from the rail-locking position to the post-locking position for positioning abutment 446 for cooperating with slide 360 for entrapping rear rack post 553 and disabling the first detent structure from disengaging from the first complemental detent structure for thereby automatically immobilizing slide 360 to rear rack post 553, all automatically in response to advancement of rail 110 longitudinally relative to slide 360 from the stowage position to an advanced position. Lock 440 is tensioned to the rail-locking position by at least one spring 450, and switch 480 is tensioned to the closed position by at least one spring 500. An engagement element, pin 445, of lock 440 is configured to interfere with a complemental engagement element, notch 488, of switch 480 for securing lock 440 in the rail-locking position, when lock 440 occupies the rail-locking position and switch 480 occupies the closed position. The engagement element of lock 440 is configured to withdraw from the complemental engagement element of switch 480 for releasing lock 440 from the rail-locking position, when lock 440 occupies the rail-locking position and switch 480 occupies the open position. Fixture 200 is mounted to rail 110 and includes a second detent structure, upper and lower pins 230 and 240. Latch 294 is mounted to fixture 200. When the first detent engaged to the first complemental detent of rear rack post 553, the second detent structure is configured to engage a second complemental detent structure, corresponding holes 555, of a second rack post, front rack post 551 in this embodiment, in response to advancement of rail 110 relative to slide 360 to at least the advanced position. Latch 294 is configured to move from an open position to a closed position when rail 110 is in at least the advanced position relative to slide 360 and the second detent structure is engaged to the second complemental detent structure for cooperating fixture 200 for entrapping front rack post 551 and disabling the second detent structure from disengaging from the second complemental detent structure for thereby automatically immobilizing fixture 200 to front rack post 551. Latch 294 is tensioned to the closed position of latch 294 by at least one spring 298. Rail 110 is mounted to fixture 200 for movement between a lowered position corresponding to at least a horizontal position of rail 110 between fixture 200 and slide 360 and a raised position corresponding to an inclined position of rail 110 between fixture 200 and slide 360. A drive member, the described threaded shank 190, is operatively coupled between rail 110 and fixture 200, whereby rotation of the drive member imparts corresponding movement of rail 110 between the lowered position and the raised position. Rail 110 is configured to reciprocate longitudinally relative to slide 360 and fixture 200 in response to movement of rail 110 between the lowered position and the raised position. The other rail assembly, the combination of rail 111, fixture 201, and slide 361, is identical to the rail assembly of rail 110, fixture 200, and slide 360.

According to yet still another embodiment, shelf assembly 100 includes rail assemblies on either side of shelf 101 for supporting objects. Rail assemblies are axially spaced from one another and each includes a rail 110 mounted to a slide 360 including a first detent structure, a lock, including a follower 444 and an abutment 446, configured to move from a rail-locking position to a post-locking position, and a switch 480 configured to move from a closed position for securing lock 440 in the rail-locking position to an open position for releasing lock 440 from the rail-locking position, and rail 110 is configured to reciprocate longitudinally relative to slide 360. When rail 110 occupies a stowage position relative to slide 360, lock 440 is configured to restrain rail 110 from reciprocating longitudinally relative to slide 360 by an interference between follower 444 and cam surface 123C when lock 440 occupies the rail-locking position and switch 480 occupies the closed position for securing lock 440 in the rail-locking position for thereby disabling lock 440 from moving from the rail-locking position to the post-locking position, and to enable rail 110 to reciprocate longitudinally relative to slide 360 without interference from between follower 444 and cam surface 123C when lock 440 occupies the rail-locking position and switch 480 occupies the open position for releasing lock 440 from the rail-locking position for thereby enabling lock 440 to move from the rail-locking position to the post-locking position. When rail 110 occupies the stowage position relative to slide 360, lock 440 occupies the rail-locking position, and switch 480 occupies the closed position securing lock 440 in the rail-locking position, the first detent structure is configured to engage a first complemental detent structure, corresponding holes 555, of a first rack post, rear rack post 553 in this embodiment, and switch 480 is configured to engage rear rack post 553 and move from the closed position to the open position, all automatically in response to advancement of slide 360 to an installed position to against rear rack post 553, and follower 444 is configured to follow cam surface 123C to move lock 440 from the rail-locking position to the post-locking position for positioning abutment 446 for cooperating with slide 360 for entrapping rear rack post 553 and disabling the first detent structure from disengaging from the first complemental detent structure for thereby automatically immobilizing slide 360 to rear rack post 553, all automatically in response to advancement of rail 110 longitudinally relative to slide 360 from the stowage position to an advanced position. Lock 440 is tensioned to the rail-locking position by at least one spring 450, and switch 480 is tensioned to the closed position by at least one spring 500. An engagement element, pin 445, of lock 440 is configured to interfere with a complemental engagement element, notch 488, of switch 480 for securing lock 440 in the rail-locking position, when lock 440 occupies the rail-locking position and switch 480 occupies the closed position. The engagement element of lock 440 is configured to withdraw from the complemental engagement element of switch 480 for releasing lock 440 from the rail-locking position, when lock 440 occupies the rail-locking position and switch 480 occupies the open position. Fixture 200 is mounted to rail 110 and includes a second detent structure, upper and lower pins 230 and 240. Latch 294 is mounted to fixture 200. When the first detent engaged to the first complemental detent of rear rack post 553, the second detent structure is configured to engage a second complemental detent structure, corresponding holes 555, of a second rack post, front rack post 551 in this embodiment, in response to advancement of rail 110 relative to slide 360 to at least the advanced position. Latch 294 is configured to move from an open position to a closed position when rail 110 is in at least the advanced position relative to slide 360 and the second detent structure is engaged to the second complemental detent structure for cooperating with fixture 200 for entrapping front rack post 551 and disabling the second detent structure from disengaging from the second complemental detent structure for thereby automatically immobilizing fixture 200 to front rack post 551. Latch 294 is tensioned to the closed position of latch 294 by at least one spring 298 Rail 110 is mounted to fixture 200 for movement between a lowered position corresponding to at least a horizontal position of rail 110 between fixture 200 and slide 360 and a raised position corresponding to an inclined position of rail 110 between fixture 200 and slide 360. A drive member, the described threaded shank 190, is operatively coupled between rail 110 and fixture 200, whereby rotation of the drive member imparts corresponding movement of rail 110 between the lowered position and the raised position. Rail 110 is configured to reciprocate longitudinally relative to slide 360 and fixture 200 in response to movement of rail 110 between the lowered position and the raised position. The shelf includes a conveyor supported by rail 110 assemblies.

The present invention is described above with reference to illustrative embodiments. However, those skilled in the art will recognize that changes and modifications may be made in the described embodiments without departing from the nature and scope of the present invention. Various changes and modifications to the embodiments herein chosen for purposes of illustration will readily occur to those skilled in the art. To the extent that such modifications and variations do not depart from the spirit of the invention, they are intended to be included within the scope thereof.

Having fully described the invention in such clear and concise terms as to enable those skilled in the art to understand and practice the same, the invention claimed is:

1. A rail assembly, comprising:

a rail mounted to a fixture for movement between a lowered position and a raised position, the fixture including a detent structure and adjustable between an open position and a closed position; and the fixture movable from the open position to the closed position when the detent structure is engaged to a complemental detent structure of a rack post for entrapping the rack post disabling the detent structure from disengaging from the complemental detent structure.

2. The rail assembly according to claim 1, further comprising a drive member operatively coupled between the rail and the fixture, whereby adjustment of the drive member imparts corresponding movement of the rail between the lowered position and the raised position.

3. The rail assembly according to claim 1, wherein the rail is configured to reciprocate relative to the fixture in response to movement of the rail between the lowered position and the raised position.

4. The rail assembly according to claim 1, further comprising a handle carried by the fixture.

5. A shelf assembly, comprising:

rail assemblies on either side of a shelf for supporting objects, each said rail assembly comprising a rail mounted to a fixture for movement between a lowered position and a raised position, the fixture including a detent structure and adjustable between an open position and a closed position; and the fixture movable from the open position to the closed position when the detent structure is engaged to a complemental detent structure of a rack post for entrapping the rack post disabling the detent structure from disengaging from the complemental detent structure.

6. The rail assembly according to claim 5, further comprising a drive member operatively coupled between the rail and the fixture, whereby adjustment of the drive member imparts corresponding movement of the rail between the lowered position and the raised position.

7. The rail assembly according to claim 5, wherein the rail is configured to reciprocate relative to the fixture in response to movement of the rail between the lowered position and the raised position.

8. The rail assembly according to claim 5, further comprising a handle carried by the fixture.

9. A method, comprising:

mounting a rail to a fixture for movement between a lowered position and a raised position, the fixture including a detent structure and adjustable between an open position and a closed position;

operatively coupling a drive member between the rail and the fixture, whereby adjustment of the drive member imparts corresponding movement of the rail between the lowered position and the raised position;

engaging the detent structure to a complemental detent structure of a rack post while the fixture is in the open position; and adjusting the fixture from the open position to the closed position entrapping the rack post disabling the detent structure from disengaging from the complemental detent structure.

10. The method according to claim 9, further comprising adjusting the drive member.

11. A method, comprising:

providing rail assemblies on either side of a shelf for supporting objects, each said rail assembly comprising a rail mounted to a fixture for movement between a lowered position and a raised position, the fixture including a detent structure and adjustable between an open position and a closed position;

operatively coupling a drive member between the rail and the fixture of each said rail assembly, whereby adjustment of the drive member imparts corresponding movement of the rail of each said rail assembly between the lowered position and the raised position;

engaging the detent structures to complemental detent structures of first and second rack posts, respectively, while each said fixture is in the open position; and adjusting each said fixture from the open position to the closed position entrapping the first and second rack posts, respectively, disabling the detent structures from disengaging from the complemental detent structures of the first and second rack posts, respectively.

12. The method according to claim 11, further comprising adjusting the drive member.

* * * * *